(12) United States Patent
Yamazaki et al.

(10) Patent No.: US 9,899,420 B2
(45) Date of Patent: Feb. 20, 2018

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP); Seiko Inoue, Isehara (JP); Shinpei Matsuda, Atsugi (JP); Daisuke Matsubayashi, Atsugi (JP); Masahiko Hayakawa, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/290,251

(22) Filed: May 29, 2014

(65) Prior Publication Data

US 2014/0361290 A1    Dec. 11, 2014

(30) Foreign Application Priority Data

Jun. 5, 2013 (JP) .................................. 2013-119149

(51) Int. Cl.
  *H01L 27/12* (2006.01)
  *H01L 27/32* (2006.01)
(52) U.S. Cl.
  CPC ...... *H01L 27/1225* (2013.01); *H01L 27/1251* (2013.01); *H01L 27/3258* (2013.01); *H01L 27/3262* (2013.01)
(58) Field of Classification Search
  CPC ................ H01L 27/1214–27/1296; H01L 27/3244–27/3279; G02F 1/13624
  See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Machine translation of KR 10-0662986 B1.*
(Continued)

*Primary Examiner* — Bryan Junge
(74) *Attorney, Agent, or Firm* — Robinson Intellectual Property Law Office; Eric J. Robinson

(57) ABSTRACT

In a pixel including a selection transistor, a driver transistor, and a light-emitting element, as the driver transistor, a transistor is used in which a channel is formed in an oxide semiconductor film and its channel length is 0.5 μm or greater and 4.5 μm or less. The driver transistor includes a first gate electrode over an oxide semiconductor film and a second gate electrode below the oxide semiconductor film. The first gate electrode and the second gate electrode are electrically connected to each other and overlap with the oxide semiconductor film. Furthermore, in the selection transistor of a pixel, which does not need to have field-effect mobility as high as that of the driver transistor, a channel length is made longer than at least the channel length of the driver transistor.

39 Claims, 36 Drawing Sheets

(56) References Cited

U.S. PATENT DOCUMENTS

| | | |
|---|---|---|
| 6,294,274 B1 | 9/2001 | Kawazoe et al. |
| 6,504,215 B1 | 1/2003 | Yamanaka et al. |
| 6,563,174 B2 * | 5/2003 | Kawasaki et al. ............ 257/350 |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,910,490 B2 | 3/2011 | Akimoto et al. |
| 7,932,521 B2 | 4/2011 | Akimoto et al. |
| 8,237,166 B2 | 8/2012 | Kumomi et al. |
| 8,274,077 B2 | 9/2012 | Akimoto et al. |
| 8,274,079 B2 | 9/2012 | Yamazaki |
| 8,384,080 B2 | 2/2013 | Taniguchi et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,674,354 B2 | 3/2014 | Yamazaki |
| 8,692,252 B2 | 4/2014 | Takata et al. |
| 2001/0046027 A1 | 11/2001 | Tai et al. |
| 2002/0056838 A1 | 5/2002 | Ogawa |
| 2002/0076845 A1 | 6/2002 | Noritake et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199880 A1 | 9/2005 | Hoffman et al. |
| 2005/0199881 A1 | 9/2005 | Hoffman et al. |
| 2005/0199959 A1 | 9/2005 | Chiang et al. |
| 2005/0199960 A1 | 9/2005 | Hoffman et al. |
| 2005/0199961 A1 | 9/2005 | Hoffman et al. |
| 2005/0199967 A1 | 9/2005 | Hoffman et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0061526 A1 * | 3/2006 | Shirasaki ............ G09G 3/3233 345/77 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0163655 A1 | 7/2006 | Hoffman et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018163 A1 | 1/2007 | Chiang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152214 A1 | 7/2007 | Hoffman et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001184 A1 | 1/2008 | Genrikh et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2010/0044711 A1 | 2/2010 | Imai |
| 2010/0065844 A1 | 3/2010 | Tokunaga |
| 2010/0078634 A1 | 4/2010 | Hoffman et al. |
| 2010/0092800 A1 | 4/2010 | Itagaki et al. |
| 2010/0109002 A1 | 5/2010 | Itagaki et al. |
| 2010/0219411 A1 | 9/2010 | Hoffman et al. |
| 2010/0244022 A1 | 9/2010 | Takahashi et al. |
| 2011/0024755 A1 | 2/2011 | Korenari et al. |
| 2011/0049509 A1 * | 3/2011 | Takahashi et al. ............ 257/43 |
| 2011/0108846 A1 * | 5/2011 | Choi ................. H01L 27/12 257/72 |
| 2011/0109351 A1 * | 5/2011 | Yamazaki et al. ............ 327/109 |
| 2011/0175674 A1 | 7/2011 | Shimizu et al. |
| 2011/0193077 A1 * | 8/2011 | Yamazaki ......... H01L 21/02554 257/43 |
| 2011/0240987 A1 * | 10/2011 | Lee et al. ..................... 257/43 |
| 2011/0266542 A1 * | 11/2011 | Ryu ................. H01L 27/1225 257/57 |
| 2011/0284852 A1 | 11/2011 | Kim et al. |
| 2011/0299004 A1 | 12/2011 | Liu et al. |
| 2011/0299318 A1 | 12/2011 | Kaneko et al. |
| 2011/0310650 A1 | 12/2011 | Kaneko et al. |
| 2012/0007158 A1 | 1/2012 | Yoon et al. |
| 2012/0032173 A1 | 2/2012 | Sato et al. |
| 2012/0085999 A1 | 4/2012 | Song et al. |
| 2012/0146713 A1 | 6/2012 | Kim et al. |
| 2012/0153277 A1 | 6/2012 | Yaginuma et al. |
| 2012/0208318 A1 | 8/2012 | Hoffman et al. |
| 2012/0256184 A1 * | 10/2012 | Kaneko ............ H01L 29/78621 257/59 |

(56) References Cited

U.S. PATENT DOCUMENTS

| | | |
|---|---|---|
| 2013/0009145 A1 | 1/2013 | Jeon et al. |
| 2013/0037798 A1 | 2/2013 | Wong et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 | 5/2007 |
| KR | 10-0662986 | 12/2006 |
| KR | 100662986 B1 * | 12/2006 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clarks et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973 vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performane TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, Or, Al; B: Mg, Mn, Fe, Ni, Cu,Or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-0721004-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett (Physical Review Letters), Jul. 31, 2000, vol. 85, No. 5, pp. 1012-1015.

Taiwanese Office Action (Application No. 103117899) dated Aug. 2, 2017.

* cited by examiner

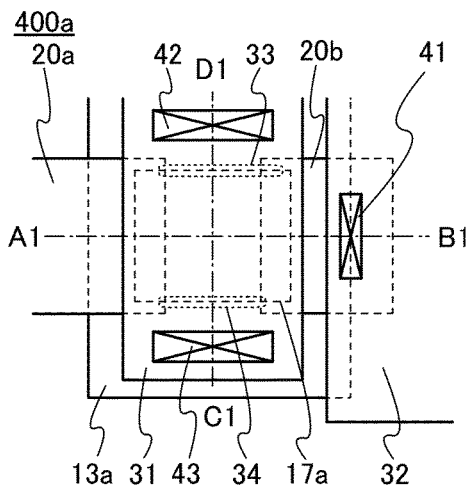
FIG. 2A1
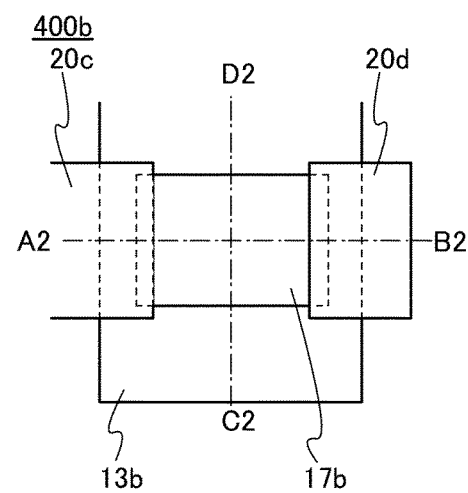
FIG. 2A2
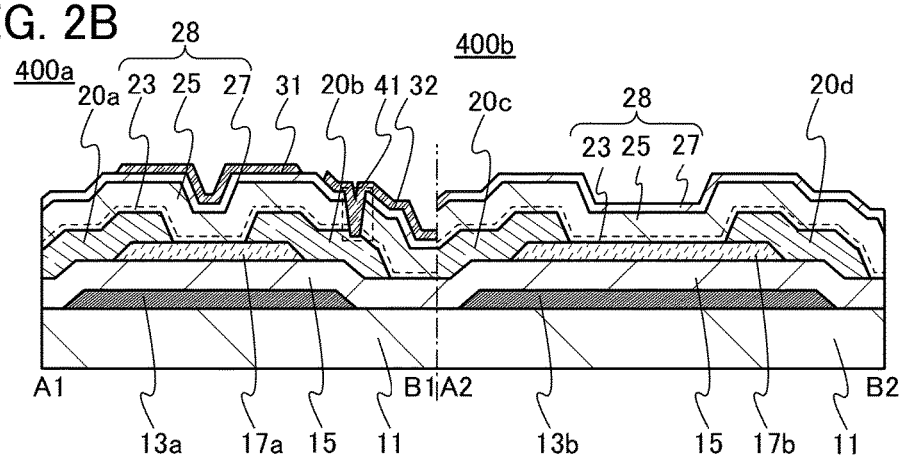
FIG. 2B
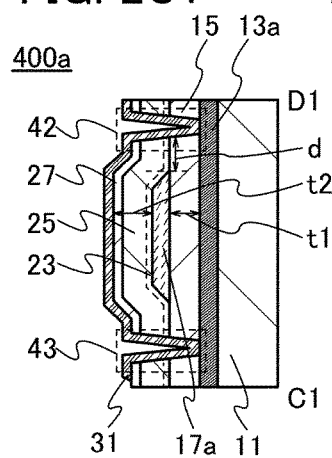
FIG. 2C1
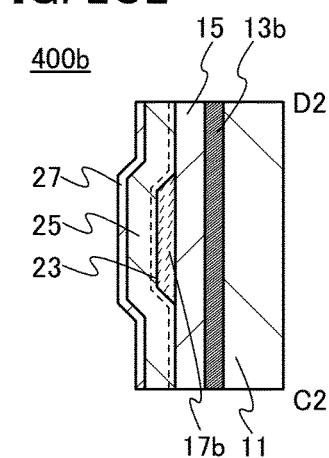
FIG. 2C2
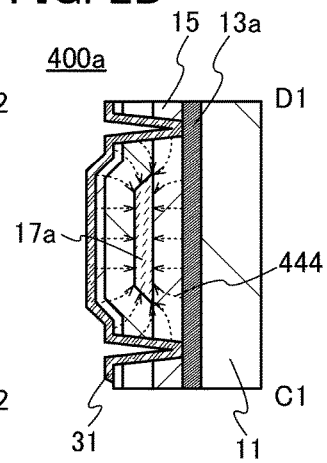
FIG. 2D

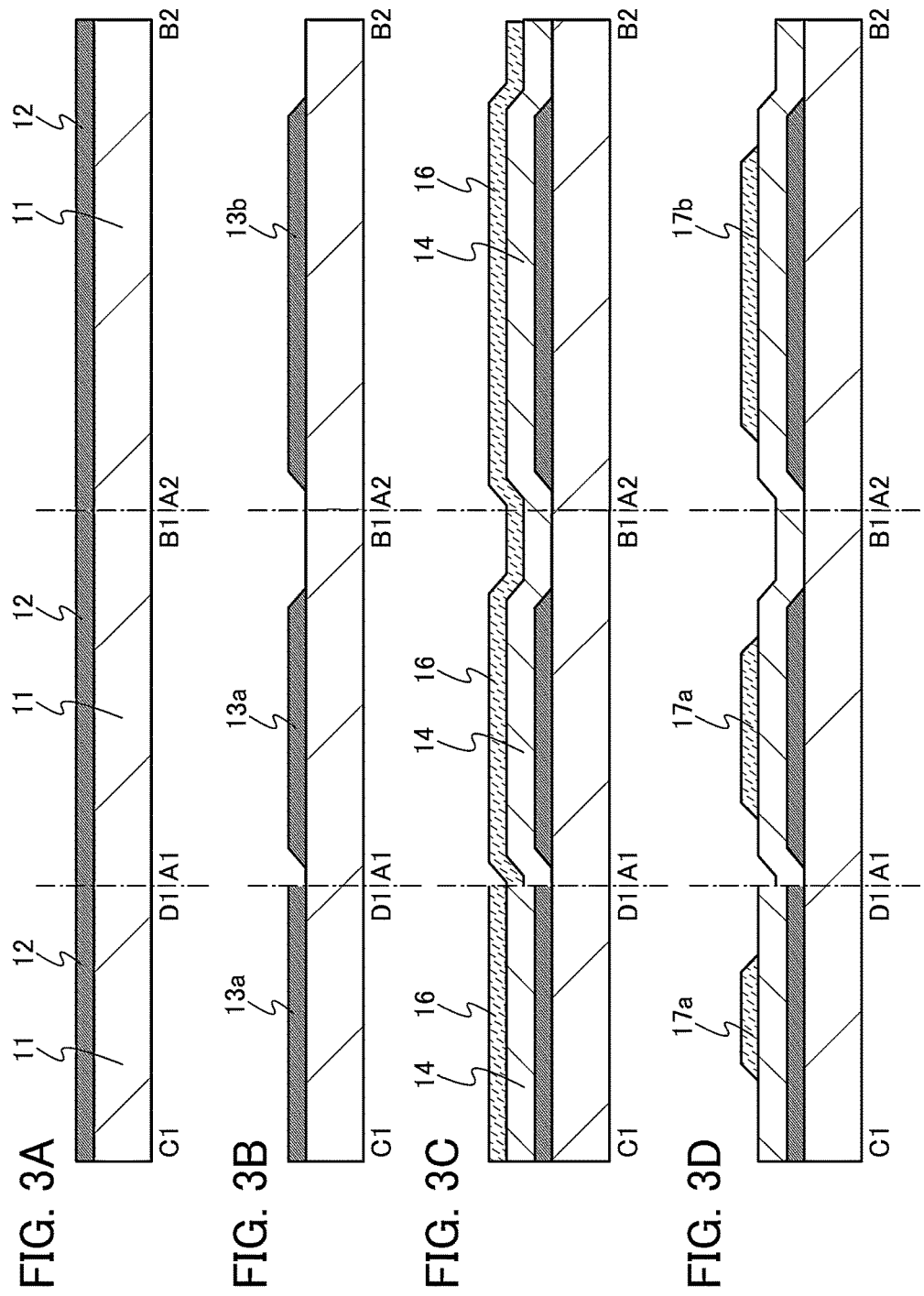

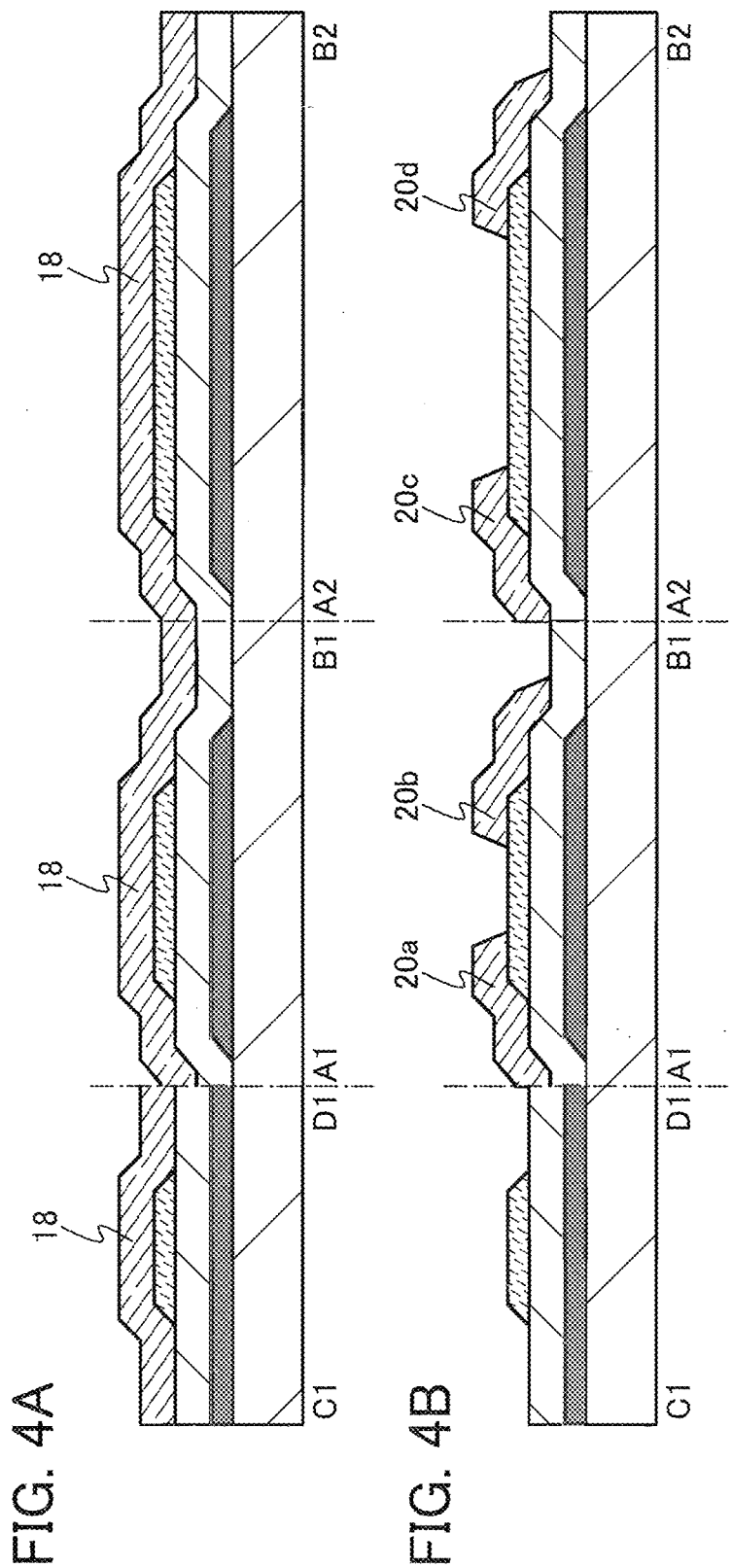

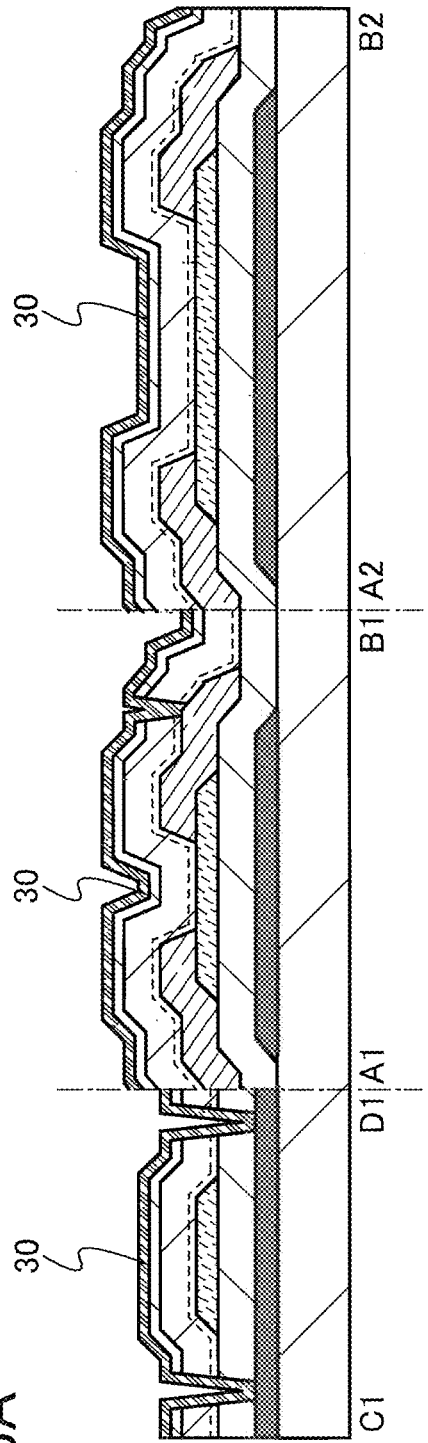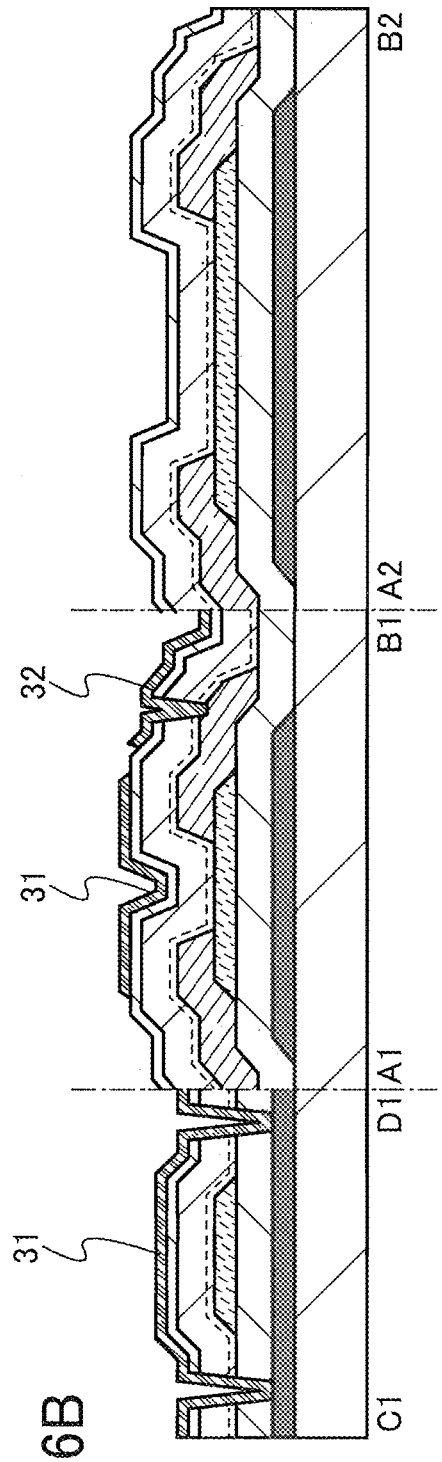

FIG. 7A1 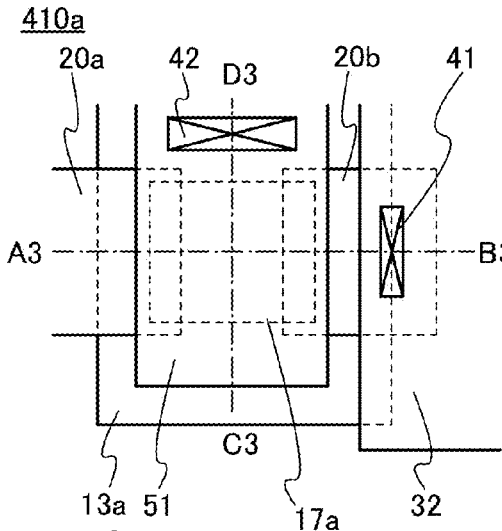
FIG. 7A2 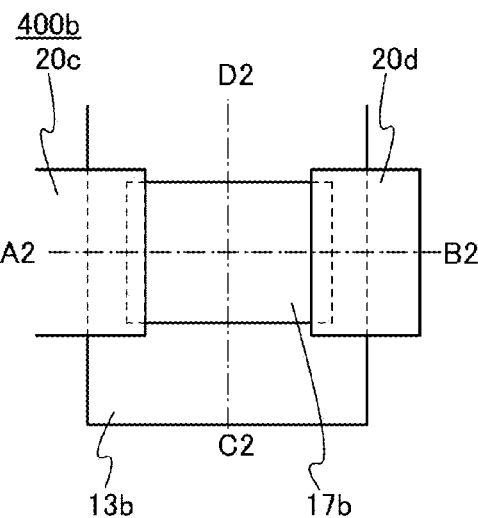

FIG. 7C1 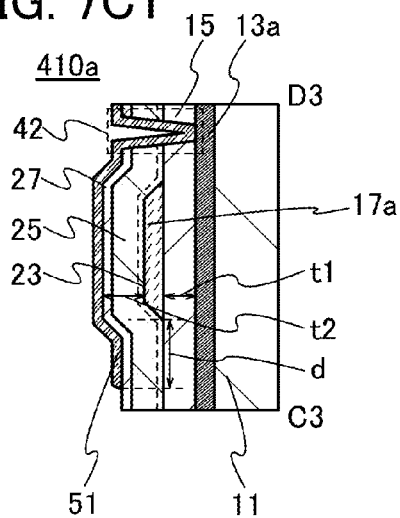
FIG. 7C2 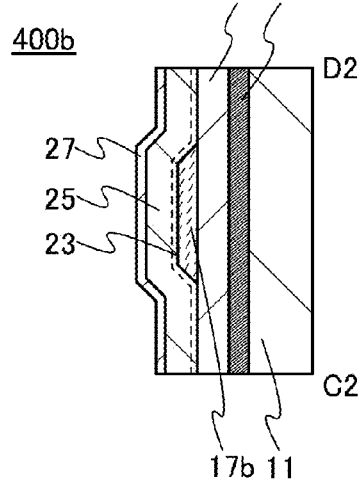

FIG. 8A1
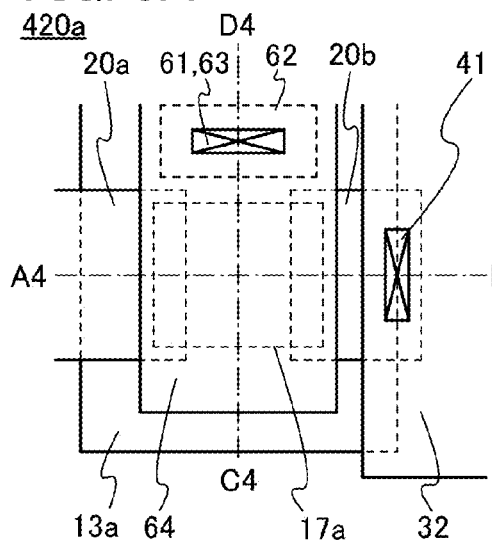
FIG. 8A2
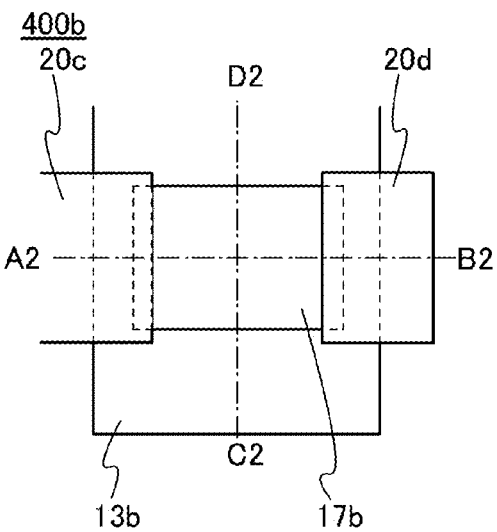
FIG. 8B
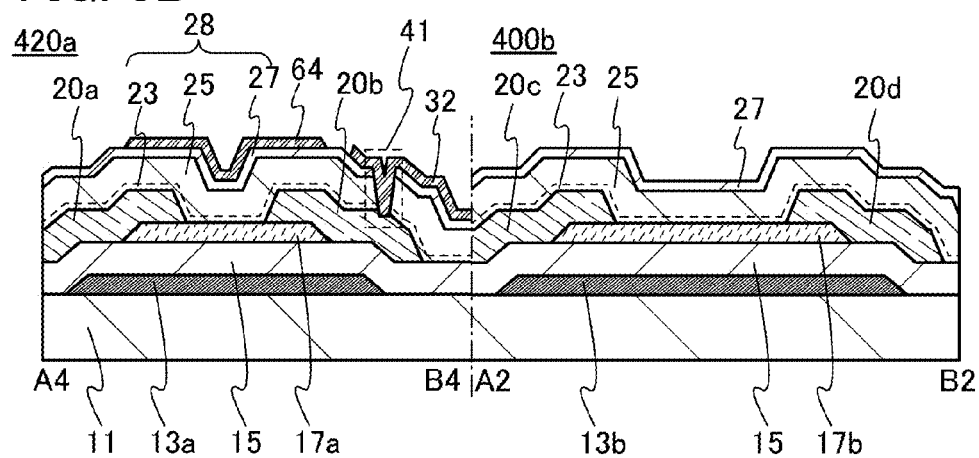
FIG. 8C1
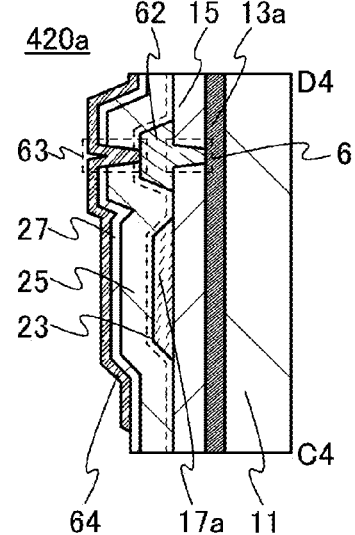
FIG. 8C2
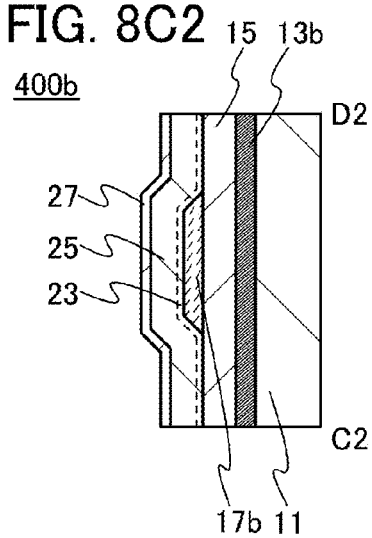

FIG. 10A
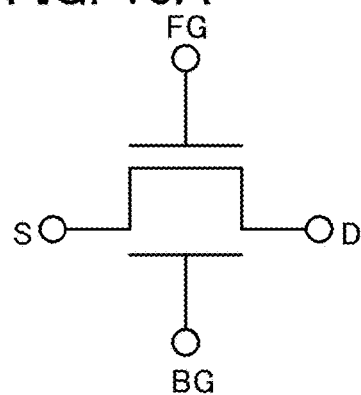
FIG. 10B1
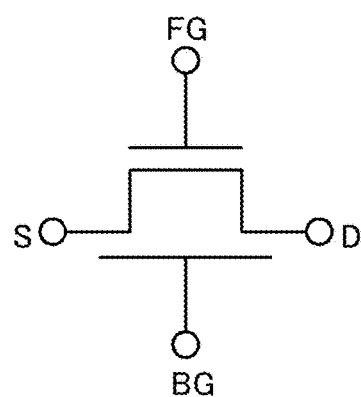
FIG. 10B2
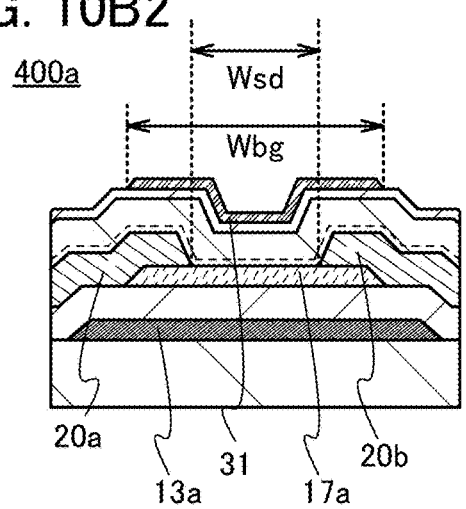
FIG. 10C1
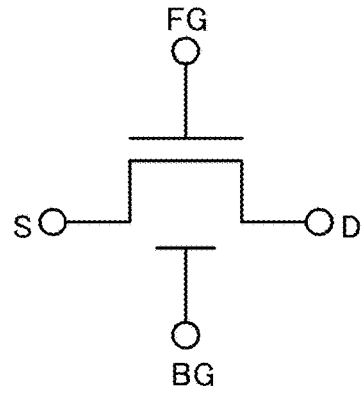
FIG. 10C2
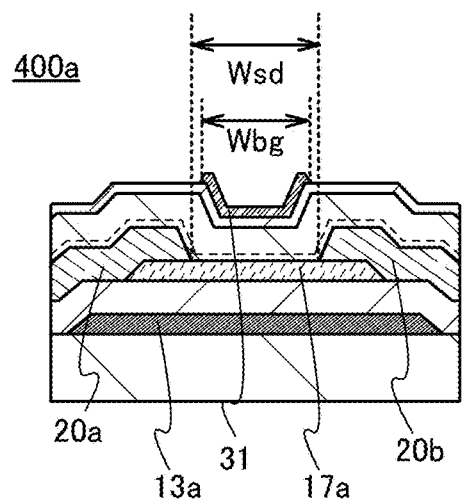

FIG. 11A1 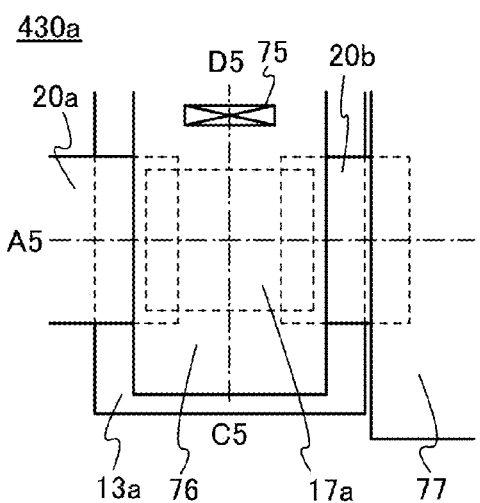
FIG. 11A2 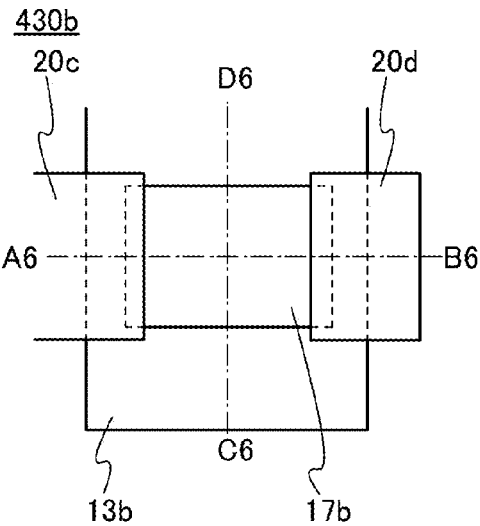

FIG. 11C1 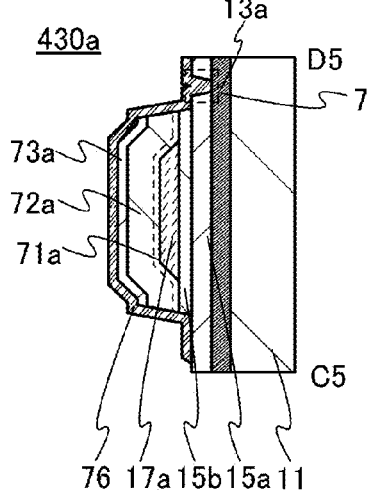
FIG. 11C2 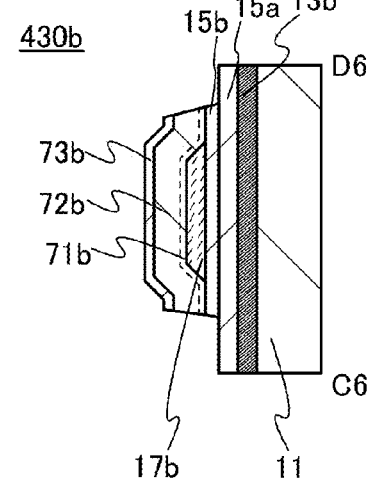

FIG. 12A1
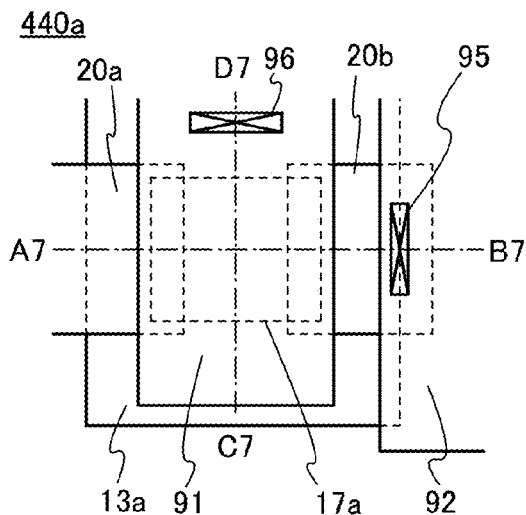
FIG. 12A2
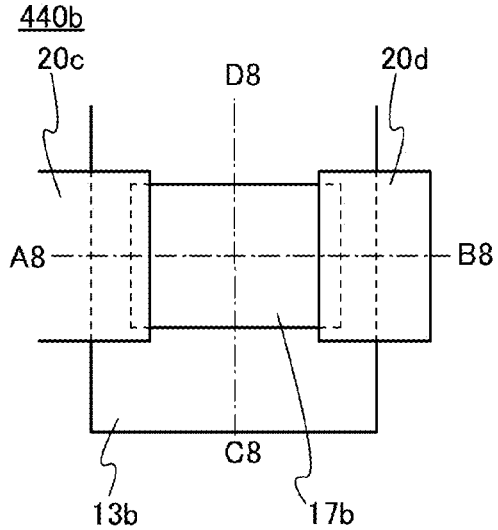
FIG. 12B
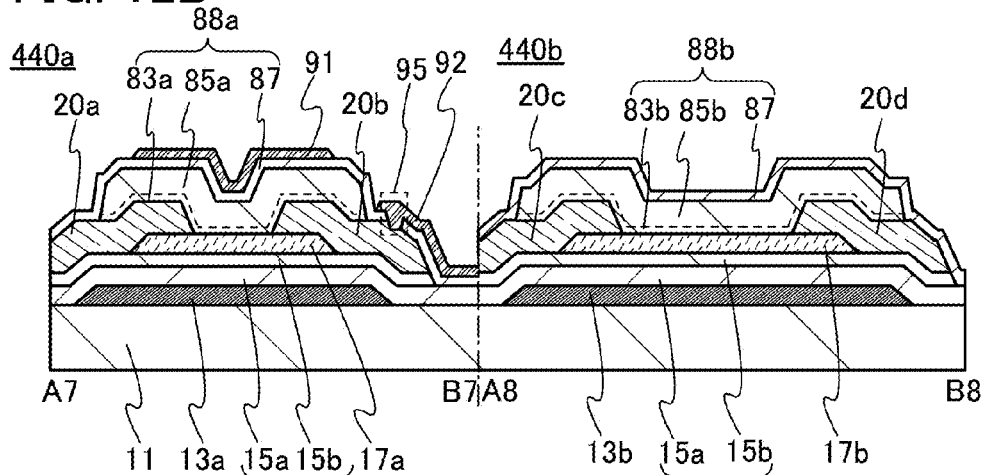
FIG. 12C1
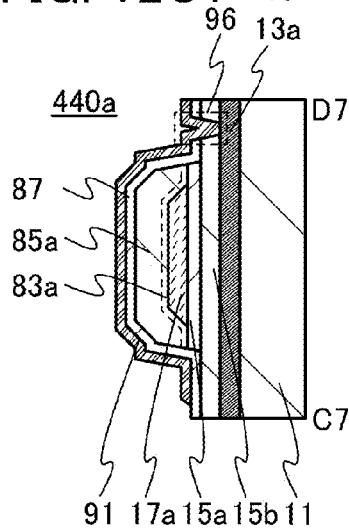
FIG. 12C2
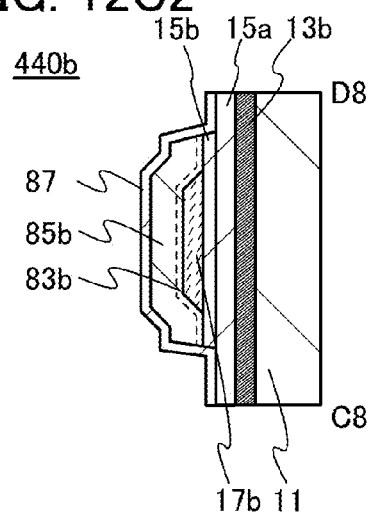

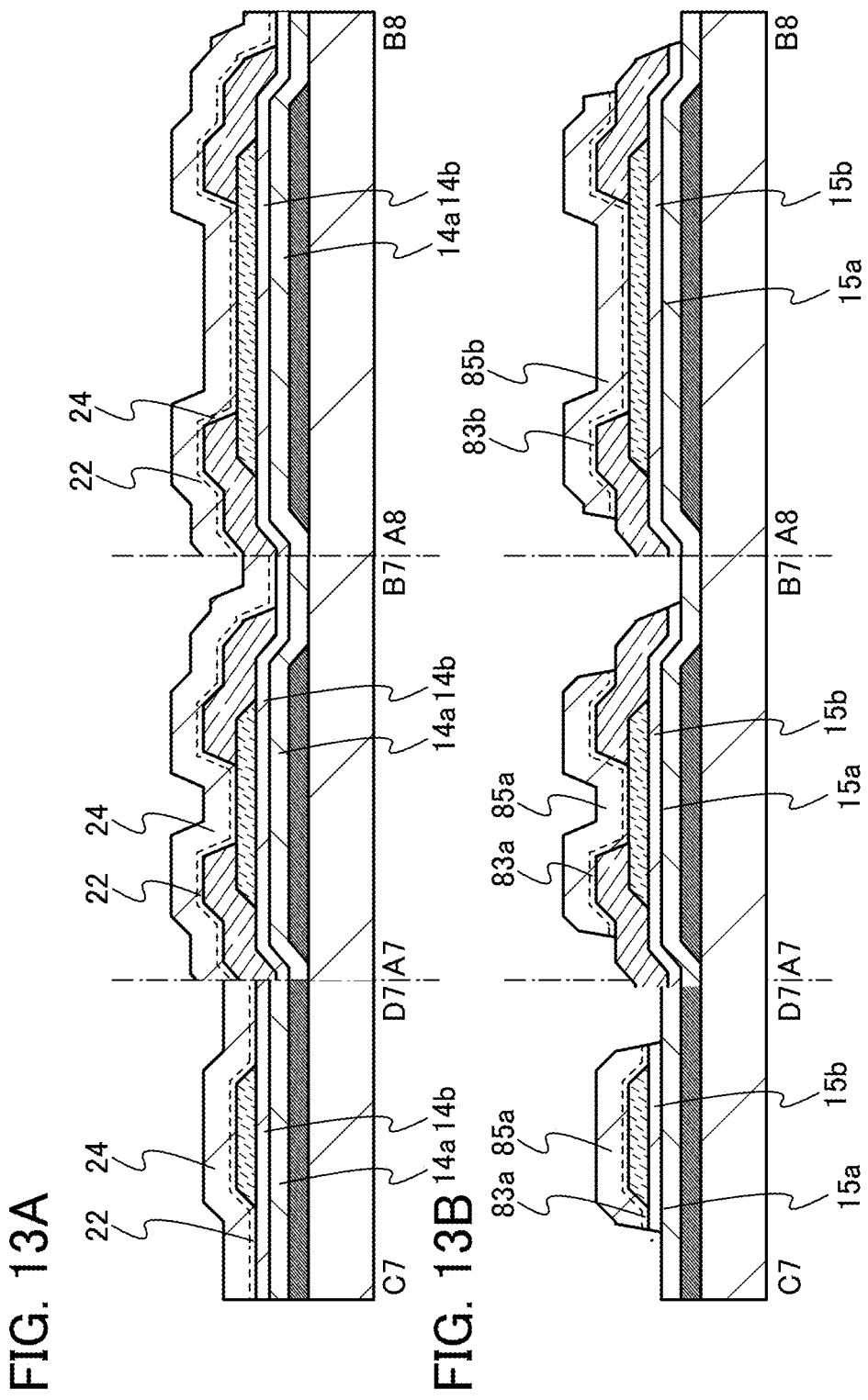

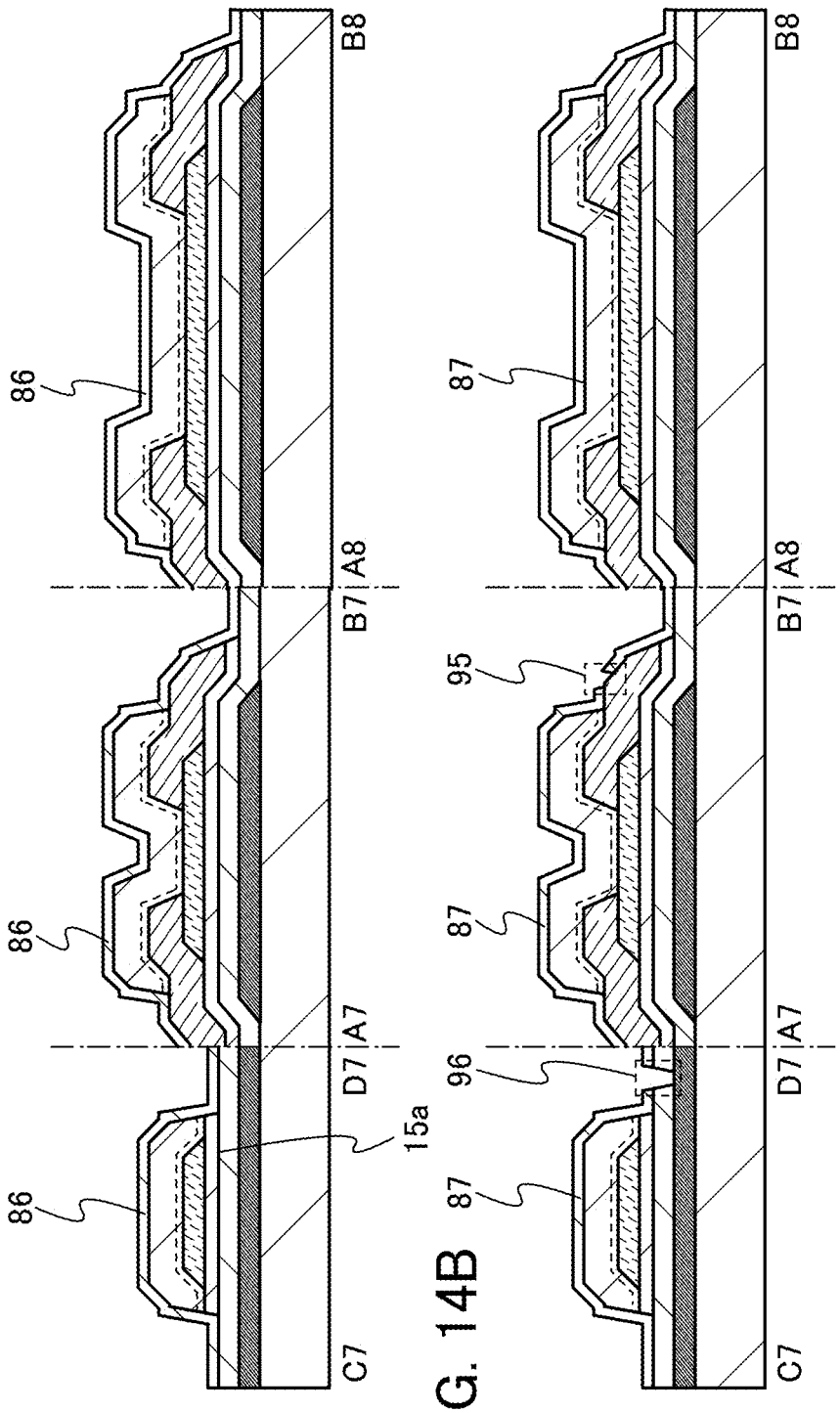

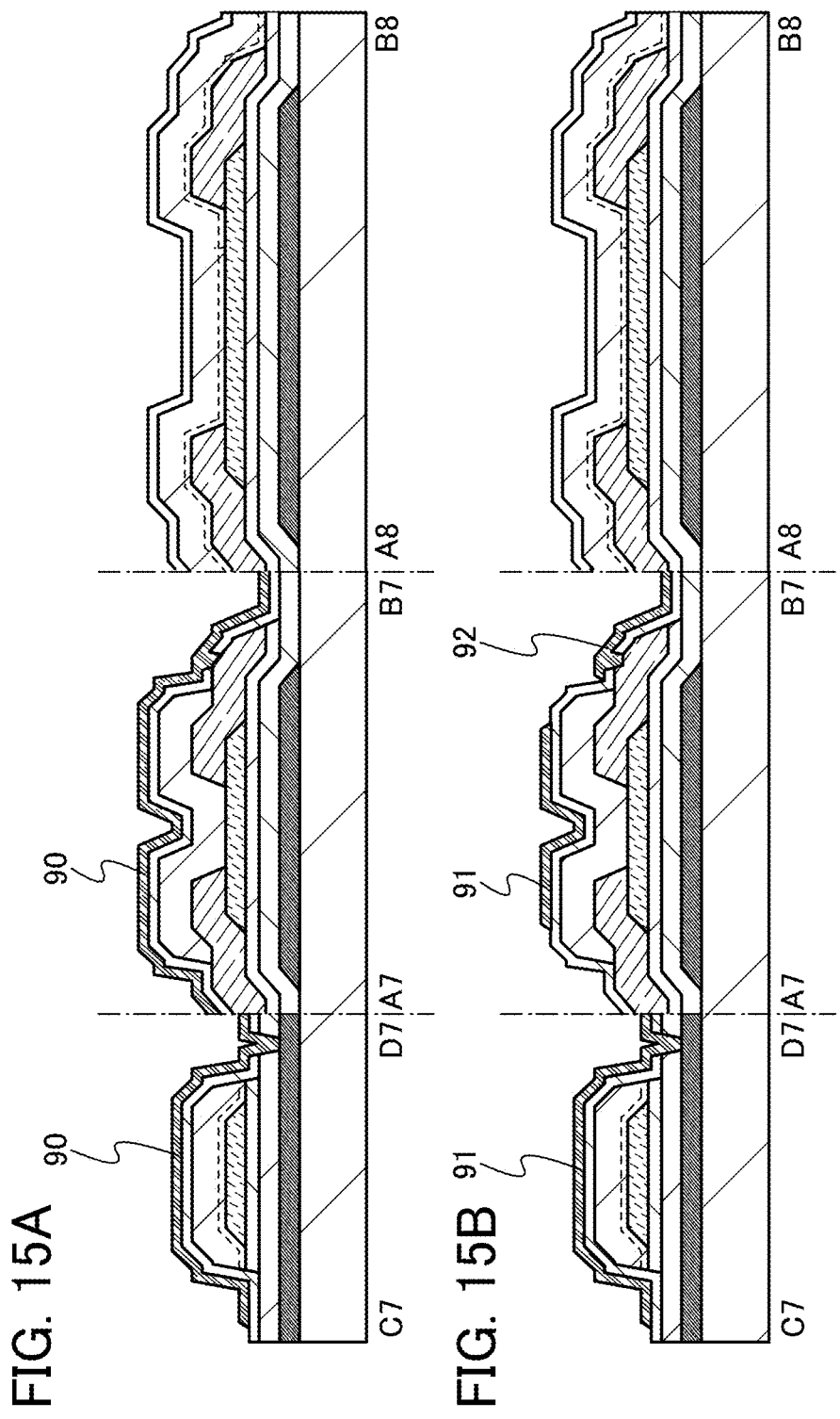

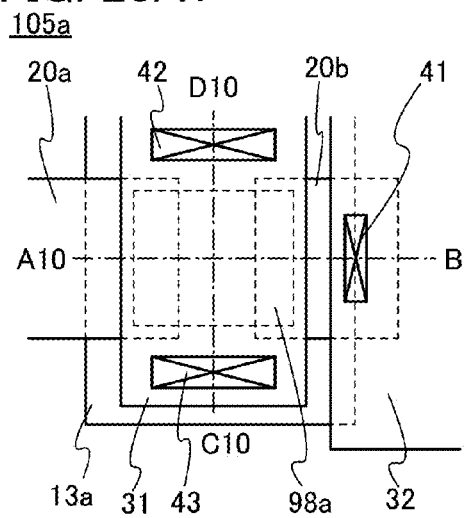
FIG. 20A1
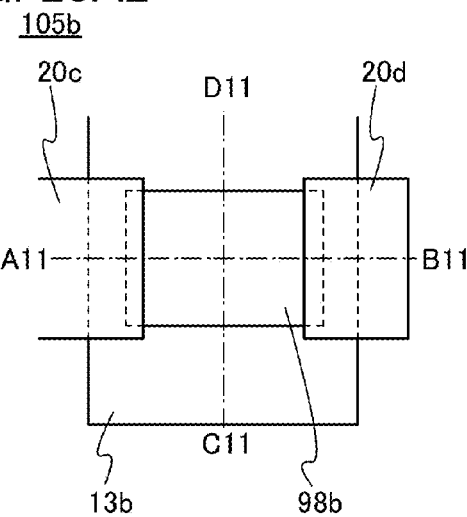
FIG. 20A2
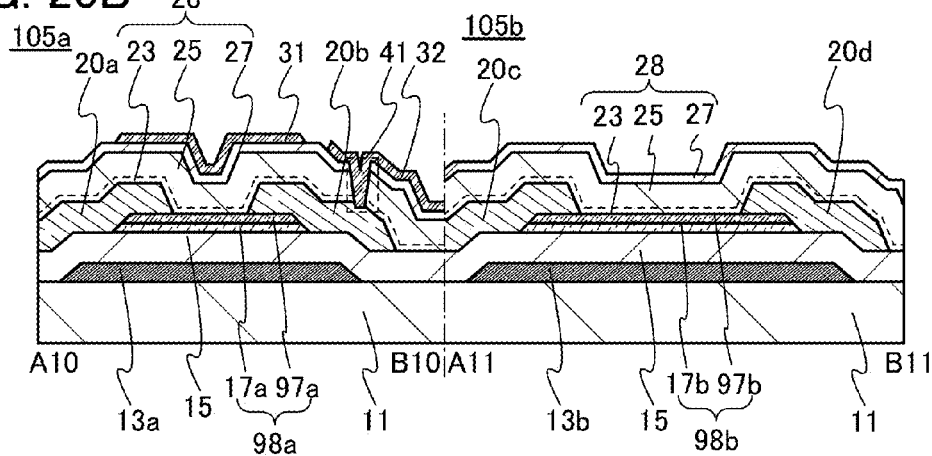
FIG. 20B
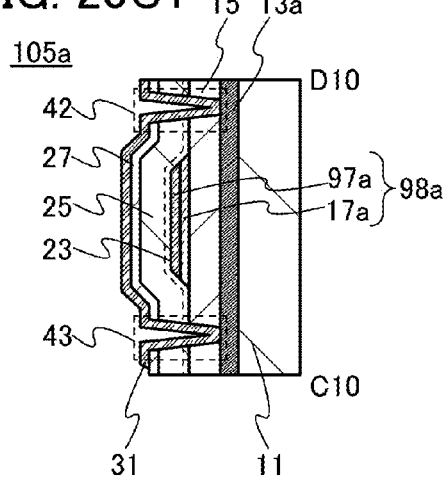
FIG. 20C1
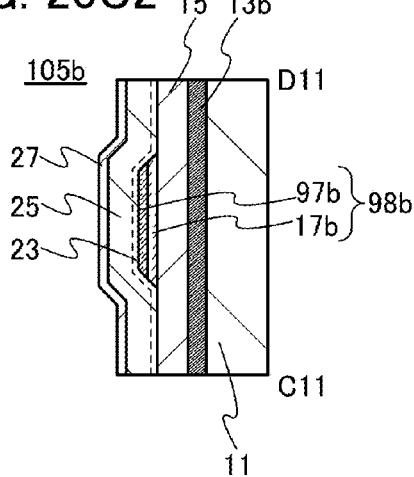
FIG. 20C2

FIG. 36A Off state
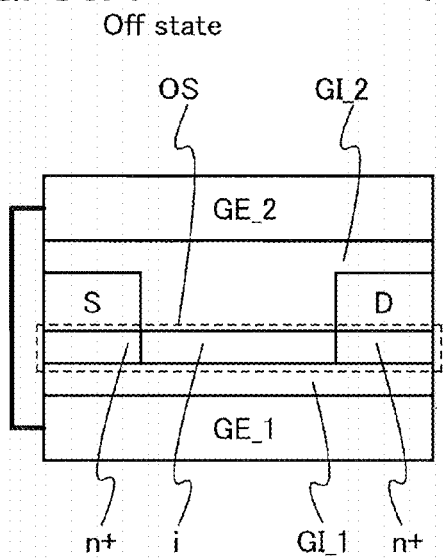
FIG. 36B On state
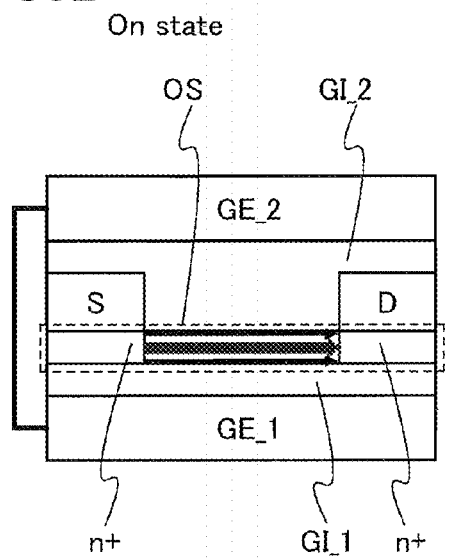
FIG. 36C
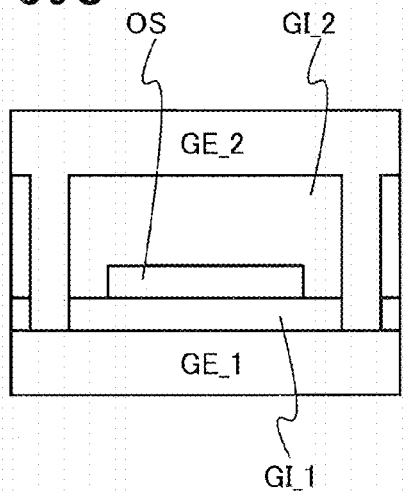

DISPLAY DEVICE

BACKGROUND OF THE INVENTION

1. Field of the Invention

The invention disclosed in this specification and the like relates to a display device and a method for manufacturing the display device. One embodiment of the present invention particularly relates to a display device having a transistor including an oxide semiconductor film and a method for manufacturing the display device.

2. Description of the Related Art

Since display devices using light-emitting elements such as organic electroluminescence (hereinafter, also referred to as EL) have high visibility, are suitable for reduction in thickness, and do not have limitations on viewing angles, they have attracted attention as display devices which can take the place of cathode ray tubes (CRTs) or liquid crystal display devices. In an active matrix display device using a light-emitting element, in general, at least a light-emitting element, a transistor (a switching (selection) transistor) which controls input of a video signal to a pixel, and a transistor (a driving transistor) which controls a value of current supplied to the light-emitting element are provided in each pixel.

Transistors used for display devices are formed using silicon semiconductors such as amorphous silicon, single crystal silicon, and polycrystalline silicon provided over glass substrates.

In recent years, instead of the silicon semiconductor, a technique in which a metal oxide having semiconductor characteristics (an oxide semiconductor) is used for transistors has attracted attention. For example, a technique is disclosed in which a transistor is manufactured using zinc oxide or an In—Ga—Zn oxide as an oxide semiconductor and the transistor is used as a switching transistor or the like of a pixel of a display device (see Patent Document 1).

REFERENCE

Patent Document

[Patent Document 1] Japanese Published Patent Application No. 2007-123861

SUMMARY OF THE INVENTION

In a display device including a light-emitting element, drain current of a driver transistor is supplied to the light-emitting element. Thus, when the threshold voltage fluctuates because of degradation of the driver transistor, the luminance of the light-emitting element also fluctuates. This means that in order to improve the image quality of the display device, it is an important object to suppress fluctuations in the threshold voltage of the driver transistor.

Further, in order to achieve high-speed driving of the display device, it is desirable to use a transistor with high field-effect mobility as the driver transistor.

In contrast, in order to reduce power consumption of the display device, it is desirable to use a transistor having positive threshold voltage (normally-off characteristics) as a selection transistor. Alternatively, as a selection transistor, it is desirable to use a transistor in which drain current is reduced at a gate voltage of 0 V (cutoff current: Icut) in the drain current–gate voltage ($I_d$–$V_g$) characteristic curve.

In view of the above, an object of one embodiment of the present invention is to provide a display device that is less influenced by fluctuations in the threshold voltage of a transistor. Another object of one embodiment of the present invention is to provide a highly reliable display device.

Another object of one embodiment of the present invention is to provide a display device with favorable display characteristics.

Another object of one embodiment of the present invention is to provide a display device with low power consumption.

Note that the descriptions of these objects do not disturb the existence of other objects. In one embodiment of the present invention, there is no need to achieve all the objects. Other objects are apparent from and can be derived from the description of the specification and the like.

In a pixel including a selection transistor, a driver transistor, and a light-emitting element, as the driver transistor, a transistor is used in which a channel is formed in an oxide semiconductor film and its channel length is greater than or equal to 0.5 µm and less than or equal to 4.5 µm, preferably greater than 1 µm and less than or equal to 4 µm, further preferably greater than 1 µm and less than or equal to 3.5 µm, still further preferably greater than 1 µm and less than or equal to 2.5 µm. Further, the driver transistor includes a first gate electrode over an oxide semiconductor film and a second gate electrode below the oxide semiconductor film. The first gate electrode and the second gate electrode are electrically connected to each other and overlap with the oxide semiconductor film. With such a structure, the field-effect mobility and the on-state current of the driver transistor can be improved, and the display device can display favorably even at a high drive frequency. Further, in the selection transistor of a pixel, which does not need to have field-effect mobility as high as that of the driver transistor, a channel length is made longer than at least the channel length of the driver transistor, whereby the power consumption of the pixel can be reduced while the aperture ratio is increased.

Specifically, the following structures can be employed for example.

One embodiment of the present invention is a display device including a pixel having a light-emitting element, a first transistor serving as a selection transistor for the light-emitting element, and a second transistor that serves as a driver transistor and is electrically connected to the first transistor. The first transistor includes a first gate electrode over an insulating surface, a first insulating film over the first gate electrode, a first oxide semiconductor film overlapping with the first gate electrode with the first insulating film positioned therebetween, a first pair of electrodes electrically connected to the first oxide semiconductor film, a second insulating film over the first oxide semiconductor film, and a second gate electrode over the first oxide semiconductor film with the second insulating film positioned therebetween. End portions of the first pair of electrodes are over the first oxide semiconductor film. The second gate electrode overlaps with the first gate electrode and includes, in a channel width direction, a region that faces a side surface of the first oxide semiconductor film with the second insulating film positioned therebetween. The second transistor includes a third gate electrode over the insulating surface, the first insulating film over the third gate electrode, a second oxide semiconductor film overlapping with the third gate electrode with the first insulating film positioned therebetween, and a second pair of electrodes electrically connected to the second oxide semiconductor film. End portions of the second pair of electrodes are over the second oxide semiconductor film. A distance between the first pair of electrodes of the first transistor is greater than or equal to 0.5 μm and less than or equal to 4.5 μm. A distance between the second pair of electrodes of the second transistor is longer than that between the first pair of electrodes of the first transistor.

Another embodiment of the present invention is a display device including a pixel having a light-emitting element, a first transistor serving as a selection transistor for the light-emitting element, and a second transistor that serves as a driver transistor and is electrically connected to the first transistor. The first transistor includes a first gate electrode over an insulating surface, a first insulating film over the first gate electrode, a first oxide semiconductor film overlapping with the first gate electrode with the first insulating film positioned therebetween, a first pair of electrodes electrically connected to the first oxide semiconductor film, a second insulating film over the first oxide semiconductor film, and a second gate electrode over the first oxide semiconductor film with the second insulating film positioned therebetween. End portions of the first pair of electrodes are over the first oxide semiconductor film. The second gate electrode overlaps with the first gate electrode and includes, in a channel width direction, a region that faces a side surface of the first oxide semiconductor film with the second insulating film positioned therebetween. The second transistor includes a third gate electrode over the insulating surface, the first insulating film over the third gate electrode, a second oxide semiconductor film overlapping with the third gate electrode with the first insulating film positioned therebetween, and a second pair of electrodes electrically connected to the second oxide semiconductor film. End portions of the second pair of electrodes are over the second oxide semiconductor film. A distance between the first pair of electrodes of the first transistor is greater than or equal to 0.5 μm and less than or equal to 4.5 μm. A distance between the second pair of electrodes of the second transistor is longer than that between the first pair of electrodes of the first transistor. In addition, cutoff current of the second transistor is lower than that of the first transistor.

In any of the above display devices, the second transistor may further include a fourth gate electrode over the second oxide semiconductor film with the second insulating film positioned therebetween. The fourth gate electrode overlaps with the third gate electrode. The third gate electrode and the fourth gate electrode include a region where the third gate electrode and the fourth gate electrode are in contact with each other.

In any of the above display devices, the first gate electrode and the second gate electrode preferably include a region where the first gate electrode and the second gate electrode are in contact with each other.

In any of the above display devices, one or both of the first insulating film and the second insulating film preferably includes an oxide insulating film containing oxygen at a higher proportion than oxygen in the stoichiometric composition.

One embodiment of the present invention can provide a display device that is less influenced by fluctuations in the threshold voltage of a transistor including an oxide semiconductor film.

One embodiment of the present invention can provide a highly reliable display device.

One embodiment of the present invention can provide a display device with favorable display characteristics.

One embodiment of the present invention can provide a display device with low power consumption.

BRIEF DESCRIPTION OF THE DRAWINGS

FIGS. 2A1, 2A2, 2B, 2C1, 2C2, and 2D are plan views and cross-sectional views illustrating one embodiment of a display device.

FIGS. 3A to 3D are cross-sectional views illustrating one embodiment of a method for manufacturing a display device.

FIGS. 4A and 4B are cross-sectional views illustrating one embodiment of a method for manufacturing a display device.

FIGS. 6A and 6B are cross-sectional views illustrating one embodiment of a method for manufacturing a display device.

FIGS. 7A1, 7A2, 7B, 7C1, and 7C2 are plan views and cross-sectional views illustrating one embodiment of a display device.

FIGS. 8A1, 8A2, 8B, 8C1, and 8C2 are plan views and cross-sectional views illustrating one embodiment of a display device.

FIGS. 10A, 10B1, 10B2, 10C1, and 10C2 illustrate circuit symbols and structures of a transistor.

FIGS. 11A1, 11A2, 11B, 11C1, and 11C2 are plan views and cross-sectional views illustrating one embodiment of a display device.

FIGS. 12A1, 12A2, 12B, 12C1, and 12C2 are plan views and cross-sectional views illustrating one embodiment of a display device.

FIGS. 13A and 13B are cross-sectional views illustrating one embodiment of a method for manufacturing a display device.

FIGS. 14A and 14B are cross-sectional views illustrating one embodiment of a method for manufacturing a display device.

FIGS. 15A and 15B are cross-sectional views illustrating one embodiment of a method for manufacturing a display device.

FIGS. 20A1, 20A2, 20B, 20C1, and 20C2 are plan views and cross-sectional views illustrating one embodiment of a display device.

FIGS. 36A to 36C show flow of carriers in a transistor in an off state and an on state.

DETAILED DESCRIPTION OF THE INVENTION

Figure 1A:
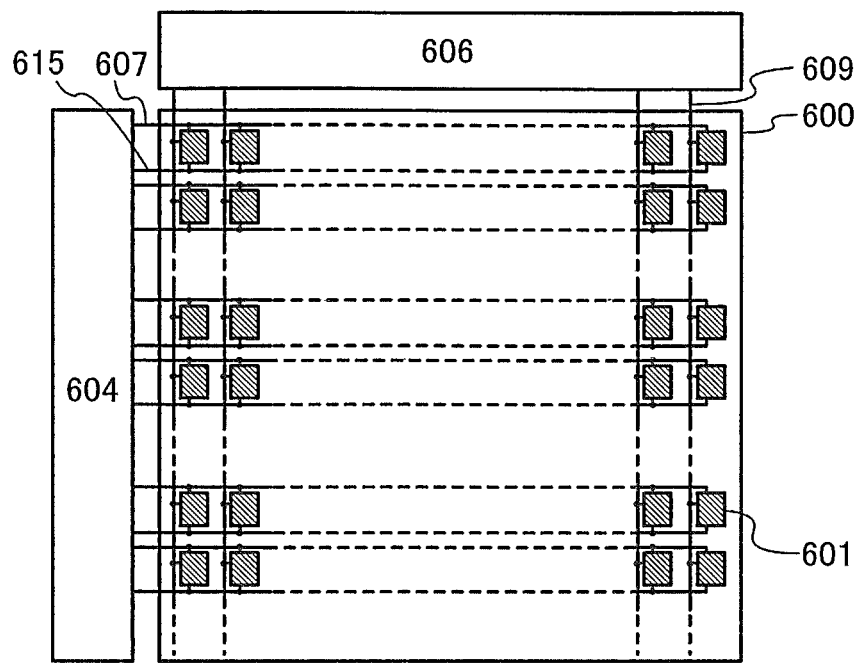
FIGS. 1A and 1B are a conceptual diagram illustrating one embodiment of a display device and a circuit diagram illustrating one embodiment of a pixel.

Hereinafter, embodiments of the present invention will be described in detail with reference to the accompanying drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and example, the same portions or portions having similar functions are denoted by the same reference numerals or the same hatching patterns in different drawings, and description thereof will not be repeated.

Note that in each drawing described in this specification, the size, the film thickness, or the region of each component may be exaggerated for clarity. Therefore, embodiments of the present invention are not limited to such scales.

In this specification, ordinal numbers such as "first", "second", and the like are used in order to avoid confusion among components, and the terms do not limit the components numerically. Therefore, for example, description can be made even when "first" is replaced with "second" or "third", as appropriate.

Functions of a "source" and a "drain" are sometimes replaced with each other when the direction of flow of current is changed in circuit operation, for example. Therefore, the terms "source" and "drain" can be replaced with each other in this specification and the like.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed.

Embodiment 1

In this embodiment, a display device that is one embodiment of the present invention and a manufacturing method thereof will be described with reference to drawings.

Structural Example of Display Device

FIG. 1A is a block diagram of an example of a display device. The display device illustrated in FIG. 1A includes a pixel portion 600, a scan line driver circuit 604, a signal line driver circuit 606, m scan lines 607 arranged parallel or substantially parallel to each other, whose potentials are controlled by the scan line driver circuit 604, and n signal lines 609 arranged parallel or substantially parallel to each other, whose potentials are controlled by the signal line driver circuit 606. The pixel portion 600 includes a plurality of pixels 601 arranged in a matrix. The scan line driver circuit 604 and the signal line driver circuit 606 are collectively referred to as a driver circuit portion in some cases.

Each scan line 607 is electrically connected to the n pixels 601 in the corresponding row among the pixels 601 arranged in m rows and n columns in the pixel portion 600. Each signal line 609 is electrically connected to the m pixels 601 in the corresponding column among the pixels 601 arranged in m rows and n columns. Note that m and n are each an integer of 1 or more. Each capacitor line 615 is electrically connected to the n pixels 601 in the corresponding row among the pixels 601 arranged in m rows and n columns. Note that in the case where the capacitor lines 615 are arranged in parallel or almost in parallel along the signal lines 609, each capacitor line 615 is electrically connected to the m pixels 601 in the corresponding column among the pixels 601 arranged in m rows and n columns.

Configuration Example of Pixel

Figure 1B:
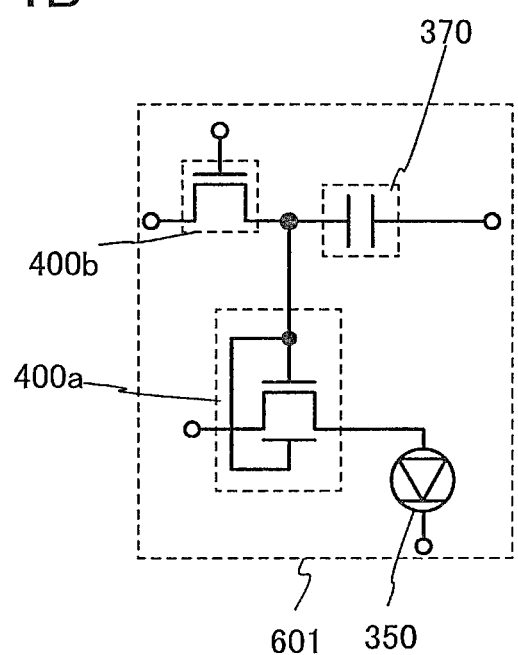

FIG. 1B illustrates an example of a circuit configuration that can be used for the pixel 601 in the display device illustrated in FIG. 1A.

The pixel 601 illustrated in FIG. 1B includes a transistor 400b serving as a selection transistor, a transistor 400a serving as a driver transistor, a capacitor 370, and a light-emitting element 350.

One of a source electrode and a drain electrode of the transistor 400a is electrically connected to one electrode of the light-emitting element 350. The other of the source electrode and the drain electrode of the transistor 400a is electrically connected to an anode line (not illustrated) which is supplied with a high power supply potential. The transistor 400a also includes a pair of gate electrodes overlapping with each other with a semiconductor film provided therebetween. One gate electrode of the transistor 400a is electrically connected to the other gate electrode of the transistor 400a, one of a source electrode and a drain electrode of the transistor 400b, and one electrode of the capacitor 370. A gate electrode of the transistor 400b is electrically connected to the scan line 607. The other of the source electrode and the drain electrode of the transistor 400b is electrically connected to the signal line 609. The other electrode of the capacitor 370 is electrically connected to the capacitor line 615. The other electrode of the light-emitting element 350 is electrically connected to a cathode line (not illustrated) which is supplied with a low power supply potential.

The transistor 400a has a function of controlling current flowing in the light-emitting element 350 by being turned on or off.

To obtain sufficient luminance for the light-emitting element 350, a transistor having high on-state current needs to be used as the transistor 400a serving as a driver transistor. Further, to improve the drive frequency of the display device and achieve smoother image display, the transistor needs to have high field-effect mobility.

Thus, as the transistor 400a in the display device of this embodiment, a transistor is used whose channel length is greater than or equal to 0.5 μm and less than or equal to 4.5 μm, preferably greater than 1 μm and less than or equal to 4 μm, further preferably greater than 1 μm and less than or equal to 3.5 μm, still further preferably greater than 1 μm and less than or equal to 2.5 μm. Because the on-state current of a transistor increases as the ratio of the channel length to the channel width (L/W ratio) becomes smaller, the on-state current of the transistor 400a can be improved when the channel length is reduced to about the above ranges. Alternatively, when the channel length is reduced to about the above ranges and the channel width is also reduced, the transistor can be reduced in size while the on-state current is kept constant, leading to an improvement in the aperture ratio of the pixel.

The transistor 400a further includes an oxide semiconductor film in which a channel is formed, and a first gate electrode and a second gate electrode overlapping with each other with the oxide semiconductor film provided therebetween. The first gate electrode and the second gate electrode included in the transistor 400a are electrically connected to each other. As described above, the oxide semiconductor film is sandwiched between the pair of gate electrodes electrically connected to each other, whereby the pair of gate electrodes can be supplied with the same potential unlike in the case where a constant potential is supplied to only one of the pair of gate electrodes; thus, a channel formation region can be increased, resulting in an increase in the drain current of the transistor 400a. Accordingly, the transistor 400a can be reduced in size while a reduction in the on-state current is suppressed.

In addition, to make a connection between the second gate electrode and the first gate electrode, the second gate electrode is positioned so as to overlap with at least one side surface of the oxide semiconductor film in the channel width direction. Accordingly, an electric field is also applied to the side surface of the oxide semiconductor film in the channel width direction, so that a region where current flows can be increased. Thus, the field-effect mobility of the transistor 400a can be improved.

When the pair of gate electrodes electrically connected to each other is provided, a depletion layer is easily formed in the oxide semiconductor film, which enables the subthreshold characteristics of the transistor 400a to be improved.

A reduction in the channel length shifts the threshold voltage of the transistor in the negative direction in some cases. However, the transistor 400a includes, in addition to the first gate electrode, the second gate electrode (back gate electrode) on a back channel region side; this can prevent negative charge from generating in the back channel region and can suppress a shift in the threshold voltage of the transistor in the negative direction.

The transistor 400b has a function of controlling writing of a data signal by being turned on or off.

A transistor having positive threshold voltage (normally-off characteristics) is preferably used as the transistor 400b. The cutoff current of the transistor is preferably reduced.

As described above, the transistor with a short channel length can have high on-state current; at the same time, the threshold voltage of the transistor might shift in the negative direction (negative shift) in some cases. In the display device of this embodiment, the channel length of the transistor 400a, which serves as a driver transistor that needs to have high on-state current and high field-effect mobility, is set to greater than or equal to 0.5 μm and less than or equal to 4.5 μm, and a pair of gate electrodes electrically connected to each other is provided; thus, the on-state current and the field-effect mobility are improved and a negative shift in the threshold voltage is suppressed.

In contrast, because the transistor 400b serving as a selection transistor does not require field-effect mobility as high as that of the transistor 400a, the channel length of the transistor 400b is made longer than that of the transistor 400a. As a result, a negative shift in the threshold voltage of the transistor 400b is suppressed. With such a structure, the display device can operate at high speed with low power consumption.

In the case where the channel length of the transistor 400a is set greater than or equal to 0.5 μm and less than or equal to 4.5 μm, for example, the channel length of the transistor 400b can be 6 μm. Note that the channel length of the transistor 400b can be set as appropriate depending on characteristics required for the display device, as long as it is at least longer than the channel length of the transistor 400a.

Further, the cutoff current of the transistor 400b is preferably lower than that of the transistor 400a. When the ratio of the channel length to the channel width (L/W ratio) of the transistor 400b is made larger than the L/W ratio of the transistor 400a, the cutoff current of the transistor 400b can be lower than that of the transistor 400a, for example. In the case where the channel widths of the transistor 400a and the transistor 400b are substantially the same, the channel length of the transistor 400b is made longer than that of the transistor 400a, whereby the cutoff current of the transistor 400b can be reduced.

Similarly to the transistor 400a, the transistor 400b may include a pair of gate electrodes electrically connected to each other. However, in the case where the transistor 400b has such a structure, a region where the pair of gate electrodes is connected to each other is necessary, which results in an increase in the area of the transistor 400b and a reduction in the aperture ratio of the pixel. For this reason, the transistor 400b preferably has a single-gate structure. In the case of a large display device, the parasitic capacitance of a gate wiring of the transistor 400b affects the operation speed of the display device. For this reason, the transistor 400b preferably has a single-gate structure in which the parasitic capacitance of the gate wiring is small.

As the light-emitting element 350, an organic electroluminescent element (organic EL element) or an inorganic EL element can be used, for example.

<Circuit Symbol of Transistor>

Here, FIG. 10A illustrates a circuit symbol of the transistor in this specification, which includes the pair of gate electrodes overlapping with each other with the oxide semiconductor film provided therebetween. In the circuit symbol in FIG. 10A, the pair of gate electrodes, the source electrode, and the drain electrode are represented by FG and BG, S, and D, respectively.

FIG. 10B2 is an example of a cross-sectional view of the transistor 400a that can be represented by a circuit symbol in FIG. 10B1. In the transistor 400a illustrated in FIG. 10B2, a pair of electrodes 20a and 20b serving as a source electrode and a drain electrode partly overlaps with a gate electrode 31 over an oxide semiconductor film 17a. In the circuit symbol in FIG. 10B1, similarly in the circuit symbol in FIG. 10A, the pair of gate electrodes, the source electrode, and the drain electrode are represented by FG and BG, S, and D, respectively.

In the channel length direction of the transistor 400a illustrated in FIG. 10B2, a distance Wsd between the pair of electrodes 20a and 20b is shorter than a distance Wbg between end portions of the gate electrode 31. Further, in the cross-sectional view in the channel length direction, the end portions of the gate electrode 31 overlap with the pair of electrodes 20a and 20b.

FIG. 10C2 is an example of a cross-sectional view of the transistor 400a that can be represented by a circuit symbol in FIG. 10C1. In the transistor 400a illustrated in FIG. 10C2, the pair of electrodes 20a and 20b serving as a source electrode and a drain electrode does not overlap with the gate electrode 31 over the oxide semiconductor film 17a. In the circuit symbol in FIG. 10C1, similarly in the circuit symbol in FIG. 10A, the pair of gate electrodes, the source electrode, and the drain electrode are represented by FG and BG, S, and D, respectively.

In the channel length direction of the transistor 400a illustrated in FIG. 10C2, the distance Wsd between the pair of electrodes 20a and 20b is longer than the distance Wbg between end portions of the gate electrode 31. Further, in the cross-sectional view in the channel length direction, the end portions of the gate electrode 31 do not overlap with the pair of electrodes 20a and 20b.

In the drawings attached to this specification, the circuit symbol in FIG. 10A can represent the transistor 400a having a structure represented by the circuit symbol in FIG. 10B1 and the transistor 400a having a structure represented by the circuit symbol in FIG. 10C1.

Structural Example of Transistor Included in Pixel

Next, a specific structure of the transistor included in the pixel of the display device will be described.

FIGS. 2A1, 2A2, 2B, 2C1, and 2C2 are top views and cross-sectional views of the transistor 400a and the transistor 400b included in the pixel 601 of the display device. FIG. 2A1 is a top view of the transistor 400a serving as a driver transistor. FIG. 2A2 is a top view of the transistor 400b serving as a selection transistor. FIG. 2B shows cross-sectional views taken along dashed-dotted line A1-B1 in FIG. 2A1 and dashed-dotted line A2-B2 in FIG. 2A2. FIG. 2C1 is a cross-sectional view taken along dashed-dotted line C1-D1 in FIG. 2A1. FIG. 2C2 is a cross-sectional view taken along dashed-dotted line C2-D2 in FIG. 2A2. Note that in FIGS. 2A1 and 2A2, a substrate 11, insulating films, and the like are omitted for simplicity.

The transistor 400a illustrated in FIGS. 2A1, 2B, and 2C1 is a channel-etched transistor. The transistor 400a includes a gate electrode 13a provided over the substrate 11, an insulating film 15 formed over the substrate 11 and the gate electrode 13a, the oxide semiconductor film 17a overlapping with the gate electrode 13a with the insulating film 15 provided therebetween, and the pair of electrodes 20a and 20b in contact with the oxide semiconductor film 17a. The transistor 400a also includes an insulating film 28 that is composed of an oxide insulating film 23, an oxide insulating film 25, and a nitride insulating film 27 and is over the insulating film 15, the oxide semiconductor film 17a, and the pair of electrodes 20a and 20b; and the gate electrode 31 formed over the insulating film 28. The gate electrode 31 is connected to the gate electrode 13a through opening portions 42 and 43 provided in the insulating film 15 and the insulating film 28. Furthermore, an electrode 32 connected to one of the pair of electrodes 20a and 20b (here, the electrode 20b) is formed over the nitride insulating film 27. Note that the electrode 32 serves as a pixel electrode.

The transistor 400b illustrated in FIGS. 2B and 2C2 is a channel-etched transistor. The transistor 400b includes a gate electrode 13b provided over the substrate 11, the insulating film 15 formed over the substrate 11 and the gate electrode 13b, an oxide semiconductor film 17b overlapping with the gate electrode 13b with the insulating film 15 provided therebetween, and a pair of electrodes 20c and 20d in contact with the oxide semiconductor film 17b. The transistor 400b also includes an insulating film 28 that is composed of the oxide insulating film 23, the oxide insulating film 25, and the nitride insulating film 27 and is over the insulating film 15, the oxide semiconductor film 17b, and the pair of electrodes 20c and 20d.

In each of the transistor 400a and the transistor 400b, the insulating film 15 serves as a gate insulating film (in the transistor 400a, a first gate insulating film). Further, the insulating film 28 serves as a second gate insulating film in the transistor 400a and as a protective insulating film in the transistor 400b.

The transistor 400a of this embodiment has a channel length greater than or equal to 0.5 μm and less than or equal to 4.5 μm, preferably greater than 1 μm and less than or equal to 4 μm, further preferably greater than 1 μm and less than or equal to 3.5 μm, still further preferably greater than 1 μm and less than or equal to 2.5 μm. Furthermore, in the channel width direction of the transistor 400a, the oxide semiconductor film 17a is provided between the gate electrode 13a and the gate electrode 31 with the insulating film 15 provided between the gate electrode 13a and the oxide semiconductor film 17a and with the insulating film 28 provided between the gate electrode 31 and the oxide semiconductor film 17a. In addition, as illustrated in FIG. 2A1, the gate electrode 31 overlaps with end portions of the oxide semiconductor film 17a with the insulating film 28 provided therebetween, when seen from the above.

The oxide semiconductor film 17a included in the transistor 400a has a structure in which side surfaces in the channel length direction overlap with the pair of electrodes 20a and 20b and side surfaces in the channel width direction overlap with the gate electrode 31. In the end portion of the oxide semiconductor film 17a, metal elements constituting an oxide semiconductor are easily bonded to chlorine radicals, fluorine radicals, and the like generated from an etching gas when the oxide semiconductor film 17a is exposed to plasma at the time of etching treatment for processing into an island shape. Thus, in the end portions of the oxide semiconductor film 17a, oxygen bonded to the metal element is easily eliminated, so that an oxygen vacancy is easily formed and the end portions easily become n-type in some cases. In particular, when regions surrounded by dashed lines 33 and 34 in the end portions of the oxide semiconductor film 17a have n-type conductivity, leakage current easily flows between the pair of electrodes 20a and 20b through the regions. In the transistor 400a, the regions overlap with the gate electrode 31, so that an electric field applied to the regions can be controlled by controlling the potential of the gate electrode 31 (including the gate electrode 13a at the same potential as the gate electrode 31). Accordingly, leakage current which might flow between the pair of electrodes 20a and 20b can be controlled by a potential applied to the pair of gate electrodes even when the end portions of the oxide semiconductor film 17a are n-type.

Specifically, in the case where a potential with which the transistor 400a is turned off is applied to the pair of gate electrodes, off-state current that flows between the pair of electrodes 20a and 20b through the end portions of the oxide semiconductor film 17a surrounded by the dashed lines 33 and 34 can be low. Thus, even when the channel length of the transistor 400a is made short to obtain high on-state current, which causes the distance between the pair of electrodes 20a and 20b in the end portions of the oxide semiconductor film 17a to be short, off-state current can be low. That is, high on-state current can be obtained in the case where the transistor 400a is on, and off-state current can be low in the case where the transistor 400a is off.

Further, the transistor 400b described in this embodiment has a longer channel length than the transistor 400a. Thus, a negative shift in the threshold voltage of the transistor 400b having a single-gate structure can be suppressed, so that cutoff current can be low.

A plurality of opening portions are provided in the insulating film 15 and the insulating film 28. As a typical example, as illustrated in FIG. 2B, an opening portion 41 that reaches one of the pair of electrodes 20a and 20b is provided. Further, the opening portions 42 and 43 are provided with the oxide semiconductor film 17a provided therebetween in the channel width direction as illustrated in FIG. 2C1. In other words, the opening portions 42 and 43 are provided on outer sides of the side surfaces of the oxide semiconductor film 17a. In the opening portion 41, one of the pair of electrodes 20a and 20b (here, the electrode 20b) is connected to the electrode 32. Further, in the opening portions 42 and 43, the gate electrode 13a is connected to the gate electrode 31. This means that the gate electrode 13a and the gate electrode 31 surround the oxide semiconductor film 17a in the channel width direction with the insulating film 15 and the insulating film 28 provided between the oxide semiconductor film 17a and each of the gate electrode 13a and the gate electrode 31. Furthermore, the gate electrode 31 faces the side surfaces of the oxide semiconductor film 17a at side surfaces of the opening portions 42 and 43.

Note that as illustrated in FIG. 2C1, a distance d between the side surface of the oxide semiconductor film 17a in the channel width direction and the gate electrode 31 in the opening portion 42 or 43 is 1 to 7.5 times as long as the sum of a thickness t1 of the insulating film 15 and a thickness t2 of the insulating film 28. In the case where the distance d between the side surface of the oxide semiconductor film 17a and the gate electrode 31 in the opening portion 42 or 43 is equal to or longer than the sum of the thickness t1 of the insulating film 15 and the thickness t2 of the insulating film 28, an electric field from the gate electrode 31 affects the side surface of the oxide semiconductor film 17a or the end portion including the side surface and its vicinity as indicated by lines 444 of electric force in FIG. 2D. Thus, a parasitic channel can be prevented from being generated at the side surface of the oxide semiconductor film 17a or the end portion thereof. In contrast, in the case where the distance d between the side surface of the oxide semiconductor film 17a and the gate electrode 31 in the opening portion 42 or 43 is 7.5 or less times as long as the sum of the thickness t1 of the insulating film 15 and the thickness t2 of the insulating film 28, the area of the transistor can be smaller.

The oxide semiconductor film 17a included in the transistor 400a and the oxide semiconductor film 17b included in the transistor 400b can be formed in the same manufacturing process. The oxide semiconductor film 17a and the oxide semiconductor film 17b are each formed using a metal oxide containing at least In or Zn; as a typical example, an In—Ga oxide, an In—Zn oxide, or an In-M-Zn oxide (M is Al, Ga, Y, Zr, La, Ce, or Nd) can be given.

Note that in the case where the oxide semiconductor films 17a and 17b each contain an In-M-Zn oxide, the proportion of In and the proportion of M, not taking Zn and O into consideration, are greater than or equal to 25 atomic % and less than 75 atomic %, respectively, preferably greater than or equal to 34 atomic % and less than 66 atomic %, respectively.

The energy gap of each of the oxide semiconductor films 17a and 17b is 2 eV or more, preferably 2.5 eV or more, further preferably 3 eV or more. With the use of an oxide semiconductor having such a wide energy gap, the off-state current of the transistors 400a and 400b can be reduced.

The thickness of each of the oxide semiconductor films 17a and 17b is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor films 17a and 17b each contains an In-M-Zn oxide (M represents Al, Ga, Y, Zr, La, Ce, or Nd), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratios of metal elements in the formed oxide semiconductor films 17a and 17b vary from the above atomic ratio of metal elements of the sputtering target within a range of ±40% as an error.

An oxide semiconductor film with low carrier density is used for the oxide semiconductor films 17a and 17b. For example, an oxide semiconductor film whose carrier density is $1 \times 10^{17}/cm^3$ or lower, preferably $1 \times 10^{15}/cm^3$ or lower, further preferably $1 \times 10^{13}/cm^3$ or lower, still further preferably $1 \times 10^{11}/cm^3$ or lower is used for the oxide semiconductor films 17a and 17b.

Note that, without limitation to that described above, a material with an appropriate composition may be used for each of the oxide semiconductor films 17a and 17b depending on required semiconductor characteristics and electrical characteristics (e.g., field-effect mobility and threshold voltage) of the transistors. Further, in order to obtain required semiconductor characteristics of the transistors, it is preferable that the carrier density, the impurity concentration, the defect density, the atomic ratio of a metal element to oxygen, the interatomic distance, the density, and the like of each of the oxide semiconductor films 17a and 17b be set to be appropriate.

Note that it is preferable to use, as the oxide semiconductor films 17a and 17b, oxide semiconductor films in which the impurity concentration is low and density of defect states is low, in which case the transistors can have more excellent electrical characteristics. Note that examples of the impurities include hydrogen, nitrogen, an alkali metal, and an alkaline earth metal. In this specification, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Furthermore, a transistor including the highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at voltage (drain voltage) between a source electrode and a drain electrode of from 1 V to 10 V. Thus, the transistor whose channel region is formed in the oxide semiconductor film has a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases.

Hydrogen contained in the oxide semiconductor film reacts with oxygen bonded to a metal atom to be water, and oxygen reacted with hydrogen is released from a metal atom, whereby an oxygen vacancy is formed in a lattice (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that hydrogen be reduced as much as possible as well as the oxygen vacancies in the oxide semiconductor films 17a and 17b. Specifically, the hydrogen concentration of the oxide semiconductor films 17a and 17b, which is measured by secondary ion mass spectrometry (SIMS), is lower than or equal to $2\times10^{20}$ atoms/cm³, preferably lower than or equal to $5\times10^{19}$ atoms/cm³, further preferably lower than or equal to $1\times10^{19}$ atoms/cm³, even further preferably lower than or equal to $5\times10^{18}$ atoms/cm³, still further preferably lower than or equal to $1\times10^{18}$ atoms/cm³, yet still further preferably lower than or equal to $5\times10^{17}$ atoms/cm³, even further more preferably lower than or equal to $1\times10^{16}$ atoms/cm³.

When silicon or carbon that is one of elements belonging to Group 14 is contained in the oxide semiconductor films 17a and 17b, oxygen vacancies are increased in the oxide semiconductor films 17a and 17b, and the oxide semiconductor films 17a and 17b become n-type films. Thus, the concentration of silicon or carbon (the concentration is measured by SIMS) of the oxide semiconductor films 17a and 17b is lower than or equal to $2\times10^{18}$ atoms/cm³, preferably lower than or equal to $2\times10^{17}$ atoms/cm³.

Further, the concentration of alkali metal or alkaline earth metal of the oxide semiconductor films 17a and 17b, which is measured by SIMS, is lower than or equal to $1\times10^{18}$ atoms/cm³, preferably lower than or equal to $2\times10^{16}$ atoms/cm³. Alkali metal and alkaline earth metal might generate carriers when bonded to an oxide semiconductor, in which case the off-state current of the transistor might be increased.

Thus, it is preferable to reduce the concentration of alkali metal or alkaline earth metal of the oxide semiconductor films 17a and 17b.

Further, when containing nitrogen, the oxide semiconductor films 17a and 17b easily become n-type by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably set to, for example, lower than or equal to $5\times10^{18}$ atoms/cm³.

When the concentration of an impurity contained in the oxide semiconductor films 17a and 17b is reduced to the above value, the transistors 400a and 400b can each have positive threshold voltage (normally-off characteristics).

The oxide semiconductor films 17a and 17b may each have a non-single-crystal structure, for example. The non-single-crystal structure includes a c-axis aligned crystalline oxide semiconductor (CAAC-OS) that is described later, a polycrystalline structure, a microcrystalline structure described later, or an amorphous structure, for example. Among the non-single-crystal structure, the amorphous structure has the highest density of defect levels, whereas CAAC-OS has the lowest density of defect levels.

It is preferable to form the oxide semiconductor film 17a using a CAAC-OS film because a channel-etched transistor can be manufactured even when its channel length is, typified by as short as greater than or equal to 0.5 μm and less than or equal to 4.5 μm, preferably greater than 1 μm and less than or equal to 4 μm, further preferably greater than 1 μm and less than or equal to 3.5 μm, still further preferably greater than 1 μm and less than or equal to 2.5 μm.

Note that the oxide semiconductor films 17a and 17b may each be a mixed film including two or more of a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a layered structure of two or more of a region having an amorphous structure, a region having a microcrystalline structure, a region having a polycrystalline structure, a CAAC-OS region, and a region having a single-crystal structure in some cases.

A transistor including an oxide semiconductor film is an accumulation-type transistor. Here, carrier flow in the transistor including an oxide semiconductor film in an off state and in an on state is described with reference to schematic diagrams illustrated in FIGS. 36A to 36C. FIGS. 36A and 36B are cross-sectional views in the channel length direction and FIG. 36C is a cross-sectional view in the channel width direction.

The transistor including an oxide semiconductor film illustrated in FIGS. 36A to 36C includes a gate electrode GE_1, a gate insulating film GI_1 over the gate electrode GE_1, an oxide semiconductor film OS over the gate insulating film GI_1, electrodes S and D over the oxide semiconductor film OS, a gate insulating film GI_2 over the oxide semiconductor film OS and the electrodes S and D, and a gate electrode GE_2 over the gate insulating film GI_2. The oxide semiconductor film OS includes a channel region i, and low-resistance regions n+ in contact with the electrodes S and D. The gate electrode GE_1 and the gate electrode GE_2 are connected to each other as illustrated in FIG. 36C.

In the case where the transistor is in an off state, electrons are forced away from the channel region i of the oxide semiconductor film OS when negative voltage is applied to the gate electrodes GE_1 and GE_2, so that the channel region i is completely depleted as illustrated in FIG. 36A. As a result, the off-state current of the transistor becomes extremely low.

In contrast, in the case of an on state, electrons are accumulated from the low-resistance region $n^+$ in contact with the electrode S to the low-resistance region $n^+$ in contact with the electrode D, and a current path is formed as indicated by arrows in FIG. 36B. As illustrated in FIG. 36C, the gate electrodes GE_1 and GE_2 are set to the same potential, side surfaces of the oxide semiconductor film OS face the gate electrode GE_2, and the gate electrodes GE_1 and GE_2 surround the oxide semiconductor film OS in the channel width direction with the gate insulating film GI_1 provided between the oxide semiconductor film OS and the gate electrode GE_1 and the gate insulating film GI_2 provided between the oxide semiconductor film OS and the gate electrode GE_2. In that case, carriers flow not only at the interfaces between the oxide semiconductor film OS and the gate insulating films GI_1 and GI_2 but also in a wide region in the oxide semiconductor film OS as illustrated in FIG. 36B, which results in an increase in the amount of transferred carriers in the transistor. As a result, the on-state current of the transistor is increased, and the field-effect mobility is increased to greater than or equal to 10 $cm^2/V·s$ or to greater than or equal to 20 $cm^2/V·s$, for example. Note that here, the field-effect mobility is not an approximate value of the mobility as the physical property of the oxide semiconductor film but is the field-effect mobility of a saturation region of the transistor. Note that an increase in field-effect mobility becomes significant when the channel length (also referred to as L length) of the transistor is greater than or equal to 0.5 µm and less than or equal to 6.5 µm, preferably greater than 1 µm and less than 6 µm, further preferably greater than 1 µm and less than or equal to 4 µm, still further preferably greater than 1 µm and less than or equal to 3.5 µm, yet still further preferably greater than 1 µm and less than or equal to 2.5 µm. Further, with a short channel length greater than or equal to 0.5 µm and less than or equal to 6.5 µm, the channel width can also be short, in which case the area of the transistor can be reduced even when a region which is a connection portion of the gate electrode GE_1 and the gate electrode GE_2 is provided as illustrated in FIG. 36C.

The transistor 400a illustrated in FIGS. 2A1, 2B, 2C1, and 2D includes the gate electrode 13a and the gate electrode 31, each of which has a function of blocking an external electric field; thus, fixed charges between the substrate 11 and the gate electrode 13a and over the gate electrode 31 do not affect the oxide semiconductor film 17a. Thus, degradation due to a stress test (e.g., a negative gate bias temperature (−GBT) stress test in which a negative potential is applied to a gate electrode) can be reduced, and changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in the threshold voltage of the transistor between before and after the BT stress test is an important indicator when examining the reliability of the transistor. As the amount of change in the threshold voltage between before and after the BT stress test is small, the transistor has higher reliability.

When the channel length of a transistor is reduced, threshold voltage might shift in the negative direction. However, in the display device of this embodiment, the transistor 400b serving as a selection transistor in the pixel has a longer channel length than the transistor 400a serving as a driver transistor, whereby the display device can operate at high speed with low power consumption.

Further, the insulating film 28 over the oxide semiconductor films 17a and 17b preferably includes an oxide insulating film containing oxygen at higher proportion than the stoichiometric composition. Part of oxygen is released by heating from the oxide insulating film containing oxygen at higher proportion than the stoichiometric composition. The oxide insulating film containing oxygen at higher proportion than the stoichiometric composition is an oxide insulating film of which the amount of released oxygen converted into oxygen atoms is greater than or equal to $1.0 \times 10^{18}$ atoms/$cm^3$, or greater than or equal to $3.0 \times 10^{20}$ atoms/$cm^3$ in thermal desorption spectroscopy (TDS) analysis performed at a surface temperature higher than or equal to 100° C. and lower than or equal to 700° C., or higher than or equal to 100° C. and lower than or equal to 500° C.

In the case where the insulating film 28 includes the oxide insulating film containing oxygen at higher proportion than the stoichiometric composition, part of oxygen contained in the insulating film 28 can be transferred to the oxide semiconductor films 17a and 17b to reduce oxygen vacancies that might be in the oxide semiconductor films.

In a transistor formed using an oxide semiconductor film including oxygen vacancies, the threshold voltage is likely to shift in the negative direction to have normally-on characteristics. This is because charges are generated because of oxygen vacancies in the oxide semiconductor film and the resistance of the oxide semiconductor film is thus reduced. The transistor having normally-on characteristics causes various problems in that malfunction is likely to be caused when in operation and that power consumption is increased when not in operation. Furthermore, there is a problem in that the amount of change in electrical characteristics, typified by threshold voltage, of the transistor is increased with passage of time or by a stress test.

However, in the transistor 400a and the transistor 400b described in this embodiment, an oxide insulating film containing oxygen at higher proportion than the stoichiometric composition is included in the insulating film 28 provided over the oxide semiconductor films 17a and 17b; thus, oxygen contained in the insulating film 28 can be transferred to the oxide semiconductor films 17a and 17b to reduce oxygen vacancies in the oxide semiconductor films. In addition, because the insulating film 28 is not exposed to an etching atmosphere, the insulating film 28 has few defects. As a result, the transistors have normally-off characteristics. Further, the amount of change in electrical characteristics, typified by threshold voltage with respect to operation time, of the transistors with passage of time or due to a stress test can be reduced. Furthermore, a change in the threshold voltage can be reduced even when a stress test is repeatedly performed.

It is also effective for an improvement in electrical characteristics that the transistor 400a and the transistor 400b are channel-etched transistors. Here, a channel-etched transistor and a channel protective transistor are compared. In a channel protective transistor including two gate electrodes with an oxide semiconductor film provided therebetween, for example, a first gate insulating film is provided over a first gate electrode, the oxide semiconductor film is provided over the first gate insulating film, a channel protective film is provided over the oxide semiconductor film, a pair of electrodes in contact with the oxide semiconductor film is provided over the channel protective film, a second gate insulating film is provided over the channel protective film and the pair of electrodes, and a second gate electrode is provided over the second gate insulating film.

The channel protective film is damaged by exposure to plasma in an etching process for forming the pair of electrodes. Thus, defects are easily formed in the channel protective film. As a result, carriers that flow in the oxide semiconductor film are trapped by the defects in the channel protective film and the electrical characteristics of the transistor fluctuate over operation time, resulting in a reduction in the reliability. However, in the transistor 400a and the transistor 400b described in this embodiment, which are channel-etched transistors, a region in the insulating film 28, which overlaps with the oxide semiconductor film 17a or the oxide semiconductor film 17b is not exposed to an etching atmosphere. Thus, there are few defects in the insulating film 28 and the transistor has high reliability.

Further, in the channel protective transistor, the pair of electrodes blocks an electric field applied from the second gate electrode to regions in the oxide semiconductor film which overlap with the pair of electrodes, so that the electric field from the second gate electrode does not evenly affect the oxide semiconductor film. As a result, the amount of carriers that flow in the oxide semiconductor film when induced by the electric field from the second gate electrode is reduced. In contrast, in the transistor 400a described in this embodiment, which is a channel-etched transistor, the electric field from the gate electrode 31 evenly affects a back channel of the oxide semiconductor film 17a. Further, the electric field from the gate electrode 31 also affects the side surface of the oxide semiconductor film 17a. As a result, carriers flow in a wide region in the oxide semiconductor film 17a, so that the on-state current of the transistor and the field-effect mobility are increased.

Furthermore, in the channel protective transistor, one end portion of each of the pair of electrodes is positioned over the channel protective film to make a connection between the oxide semiconductor film and each of the pair of electrodes. The one end portion of each of the pair of electrodes is positioned on an inner side of a connection region of the oxide semiconductor film and each of the pair of electrodes. For this reason, in consideration of misalignment of a photomask, the distance between the connection regions of the oxide semiconductor film and the pair of electrodes needs to be designed to be long. In contrast, in a channel-etched transistor, an oxide semiconductor film is directly in contact with one end portion of each of a pair of electrodes. Thus, the distance between the pair of electrodes in the channel-etched transistor can make short easily in comparison with the channel protective transistor. In particular, in the display device of one embodiment of the present invention, the transistor 400a serving as a driver transistor in the pixel has a short channel length, in which case the display device can be manufactured with a high yield when a channel-etched transistor is used as the transistor 400a.

Here, both of the transistor 400a and the transistor 400b are channel-etched transistors. The structure of the transistor 400a is different from that of the transistor 400b in that the channel length is short and the gate electrode 31 serving as a back gate electrode is included. Thus, the transistor 400a and the transistor 400b can be formed in the same process, which can lead to simplification of the manufacturing process of the display device.

<Details of Components of Transistor>

Components of the transistor 400a and the transistor 400b will be described in detail below.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 11. Furthermore, any of these substrates further provided with a semiconductor element may be used as the substrate 11. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistors 400a and 400b may be provided directly on the flexible substrate. Further alternatively, a separation layer may be provided between the substrate 11 and the transistors 400a and 400b. The separation layer can be used when part or the whole of a semiconductor device formed over the separation layer is separated from the substrate 11 and transferred onto another substrate. In that case, the transistors 400a and 400b can be transferred to a substrate having low heat resistance or a flexible substrate.

The gate electrodes 13a and 13b can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. The gate electrodes 13a and 13b may each have a single-layer structure or a layered structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film that contains aluminum and one or more elements selected from titanium, tantalum, tungsten, molybdenum, chromium, neodymium, and scandium may be used.

The gate electrodes 13a and 13b can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

The insulating film 15 can be formed to have a single-layer structure or a layered structure using, for example, one or more of a silicon oxide film, a silicon oxynitride film, a silicon nitride oxide film, a silicon nitride film, an aluminum oxide film, a hafnium oxide film, a gallium oxide film, a Ga—Zn-based metal oxide film, and a silicon nitride film.

The insulating film 15 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the insulating film 15 is greater than or equal to 5 nm and less than or equal to 400 nm, preferably greater than or equal to 10 nm and less than or equal to 300 nm, more preferably greater than or equal to 50 nm and less than or equal to 250 nm.

The pair of electrodes 20a and 20b and the pair of electrodes 20c and 20d are formed with a single-layer structure or a layered structure using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is formed over a copper-magnesium-aluminum alloy film, a two-layer structure in which a copper film is formed over a titanium film, a two-layer structure in which a copper film is formed over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The insulating film 28 includes the oxide insulating film 23 in contact with the oxide semiconductor films 17a and 17b, the oxide insulating film 25 in contact with the oxide insulating film 23, and the nitride insulating film 27 in contact with the oxide insulating film 25. The insulating film 28 preferably includes at least an oxide insulating film containing oxygen at higher proportion than the stoichiometric composition. Here, as the oxide insulating film 23, an oxide insulating film through which oxygen passes is formed. As the oxide insulating film 25, an oxide insulating film containing oxygen at higher proportion than the stoichiometric composition is formed. As the nitride insulating film 27, a nitride insulating film that blocks hydrogen and oxygen is formed. Although the insulating film 28 has a three-layer structure here, the insulating film 28 can have a single layer structure, a two-layer structure, or a layered structure including four or more layers as appropriate. Note that in these cases, at least an oxide insulating film containing oxygen at higher proportion than the stoichiometric composition is preferably included.

The oxide insulating film 23 is an oxide insulating film through which oxygen passes. Thus, oxygen released from the oxide insulating film 25 provided over the oxide insulating film 23 can be moved to the oxide semiconductor films 17a and 17b through the oxide insulating film 23. Moreover, the oxide insulating film 23 also serves as a film which relieves damage to the oxide semiconductor films 17a and 17b at the time of forming the oxide insulating film 25 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the oxide insulating film 23 be small; as a typical example, the spin density of a signal that appears at g=2.001 due to a dangling bond of silicon is preferably lower than or equal to $3\times10^{17}$ spins/cm$^3$ by electron spin resonance (ESR) measurement. This is because if the density of defects in the oxide insulating film 23 is high, oxygen is bonded to the defects and the amount of oxygen that passes through the oxide insulating film 23 is reduced.

Further, it is preferable that the amount of defects at the interfaces between the oxide insulating film 23 and each of the oxide semiconductor films 17a and 17b be small; as a typical example, the spin density of a signal that appears at g=1.93 due to an oxygen vacancy in the oxide semiconductor films 17a and 17b is preferably lower than or equal to $1\times10^{17}$ spins/cm$^3$, more preferably lower than or equal to the lower limit of detection by ESR measurement.

Note that in the oxide insulating film 23, all oxygen that enters the oxide insulating film 23 from the outside is transferred to the outside of the oxide insulating film 23 in some cases. Alternatively, some oxygen that enters the oxide insulating film 23 from the outside remains in the oxide insulating film 23. Furthermore, movement of oxygen occurs in the oxide insulating film 23 in some cases in such a manner that oxygen enters the oxide insulating film 23 from the outside and oxygen contained in the oxide insulating film 23 is transferred to the outside of the oxide insulating film 23.

The oxide insulating film 25 is formed in contact with the oxide insulating film 23. The oxide insulating film 25 is formed using an oxide insulating film that contains oxygen at higher proportion than the stoichiometric composition. Part of oxygen is released by heating from the oxide insulating film that contains oxygen at higher proportion than the stoichiometric composition. The oxide insulating film containing oxygen at higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$, in TDS analysis performed at a surface temperature higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, or greater than or equal to 50 nm and less than or equal to 400 nm can be used for the oxide insulating film 25.

Further, it is preferable that the amount of defects in the oxide insulating film 25 be small; as a typical example, the spin density of a signal that appears at g=2.001 originating from a dangling bond of silicon is preferably lower than 1.5×10$^{18}$ spins/cm$^3$, further preferably lower than or equal to 1×10$^{18}$ spins/cm$^3$ by ESR measurement. Note that the oxide insulating film 25 is provided more apart from the oxide semiconductor films 17a and 17b than the oxide insulating film 23 is; thus, the oxide insulating film 25 may have higher defect density than the oxide insulating film 23.

The nitride insulating film 27 has an effect of blocking at least hydrogen and oxygen. Preferably, the nitride insulating film 27 has an effect of blocking oxygen, hydrogen, water, an alkali metal, an alkaline earth metal, or the like. It is possible to prevent outward diffusion of oxygen from the oxide semiconductor films 17a and 17b and entry of hydrogen, water, or the like into the oxide semiconductor films 17a and 17b from the outside by providing the nitride insulating film 27 over the insulating film 28.

The nitride insulating film 27 is formed using a silicon nitride film, a silicon nitride oxide film, an aluminum nitride film, an aluminum nitride oxide film, or the like having a thickness greater than or equal to 50 nm and less than or equal to 300 nm, preferably greater than or equal to 100 nm and less than or equal to 200 nm.

Note that instead of the nitride insulating film 27, an oxide insulating film having a blocking effect against oxygen, hydrogen, water, and the like may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

In the transistor 400a, a transparent conductive film is used for the gate electrode 31 and the electrode 32. The transparent conductive film is formed using an indium tin oxide (hereinafter, also referred to as ITO), an indium zinc oxide, an indium oxide containing tungsten oxide, an indium zinc oxide containing tungsten oxide, an indium oxide containing titanium oxide, an indium tin oxide containing titanium oxide, an indium tin oxide containing silicon oxide, or the like.

<Improvement in Current Drive Capability Due to Dual-Gate Driving>

In the display device of this embodiment, a "dual-gate transistor" is used as the transistor 400a serving as a driver transistor in the pixel, which needs to have high on-state current and high field-effect mobility. In the dual-gate transistor, the gate electrode 13a and the gate electrode 31 overlapping with each other are provided over and below the oxide semiconductor film 17a where a channel is formed, respectively, and the gate electrodes are electrically connected to each other. The channel length of the dual-gate transistor is made as short as greater than or equal to 0.5 μm and less than or equal to 4.5 μm. Description is given below of an improvement in the current drive capability of a dual-gate transistor due to a short channel length L. In the transistor, gate electrodes facing each other with an oxide semiconductor film provided therebetween are connected to each other and have the same potential.

<<Saturation Mobility of Ideal Model>>

Figure 30:
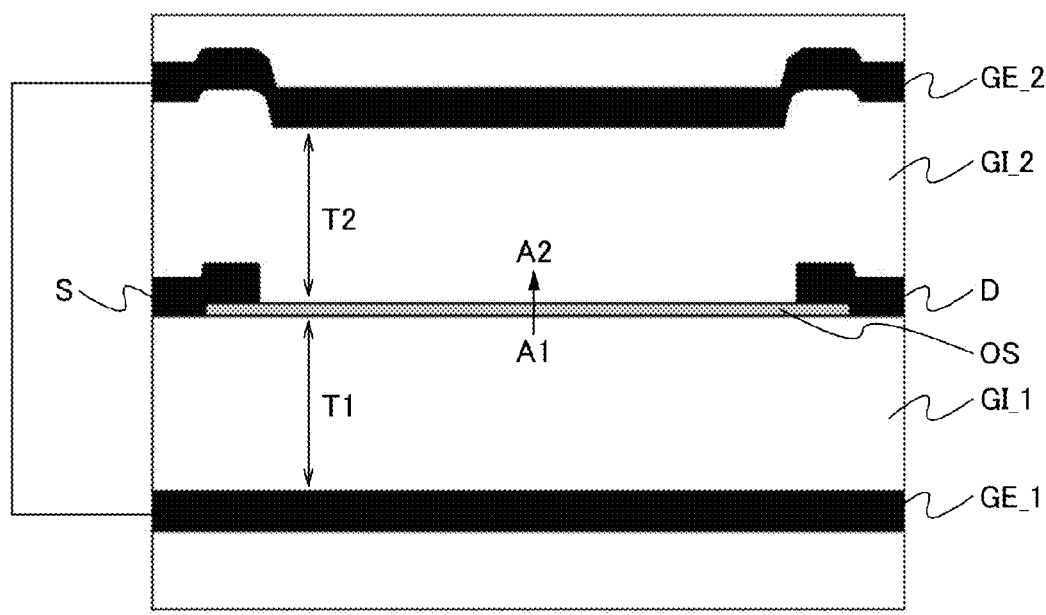
FIG. 30 illustrates a transistor model used for calculation.

First, calculation was performed on an ideal model regardless of effects of an interface state, interface scattering, and the like. FIG. 30 illustrates a model of a transistor used for the calculation. Note that device simulation software "Atlas" (manufactured by Silvaco Data Systems Inc.) was used for the calculation.

In the transistor illustrated in FIG. 30, a gate insulating film GI_1 is formed over a gate electrode GE_1; an oxide semiconductor film OS is formed over the gate insulating film GI_1; a source electrode S and a drain electrode D are formed over the gate insulating film GI_1 and the oxide semiconductor film OS; a gate insulating film GI_2 is formed over the oxide semiconductor film OS, the source electrode S, and the drain electrode D; and a gate electrode GE_2 is formed over the gate insulating film GI_2. The gate electrode GE_1 is connected to the gate electrode GE_2 through an opening portion (not illustrated) formed in the gate insulating film GI_1 and the gate insulating film GI_2.

Calculation conditions are shown in Table 1.

TABLE 1

| | |
|---|---|
| Channel length | 2 μm, 3 μm, 6 μm, or 10 μm |
| Channel width | 50 μm |
| Thickness of GI_1 (T1) | 450 nm |
| Thickness of GI_2 (T2) | 450 nm |
| Dielectric constants of GI_1 and GI_2 (Er) | 3.9 |
| Thickness of OS | 35 nm |
| Mobility of OS | 10 cm$^2$/Vsec |
| Dielectric constant of OS (Er) | 15 |
| Donor density of OS under SD | 1 × 10$^{19}$/cm$^3$ |
| Donor density of OS in channel region | 6.6 × 10$^{-9}$/cm$^3$ |
| Drain voltage | 1 V or 10 V |

The gate electrode GE_1 and the gate electrode GE_2 are connected to each other and therefore have potentials equal to each other at all times. Furthermore, an effect in a channel width direction is not considered because a two-dimensional simulation was performed on the model. Saturation mobility $\mu_{FE}$ was obtained by substituting a value of $V_g$–$I_d$ characteristics at a drain voltage $V_d$ of 10 V into Formula 1. Note that here, field-effect mobility in a saturation region is described as the saturation mobility. The maximum value of the saturation mobility obtained by calculation is an index of current drive capability in the saturation region (gate voltage $V_g$<drain voltage $V_d$+threshold voltage $V_{th}$), and is not an approximate value of the mobility as the physical property of the oxide semiconductor film.

$$\mu_{FE} = \left(\frac{\partial \sqrt{I_d}}{\partial V_g}\right)^2 \frac{2L}{C_{Bottom} W} \quad \text{[Formula 1]}$$

In Formula 1, W represents the channel width of a transistor and $C_{Bottom}$ represents capacitance per unit area between the gate electrode GE_1 and the oxide semiconductor film OS.

Figure 31A:
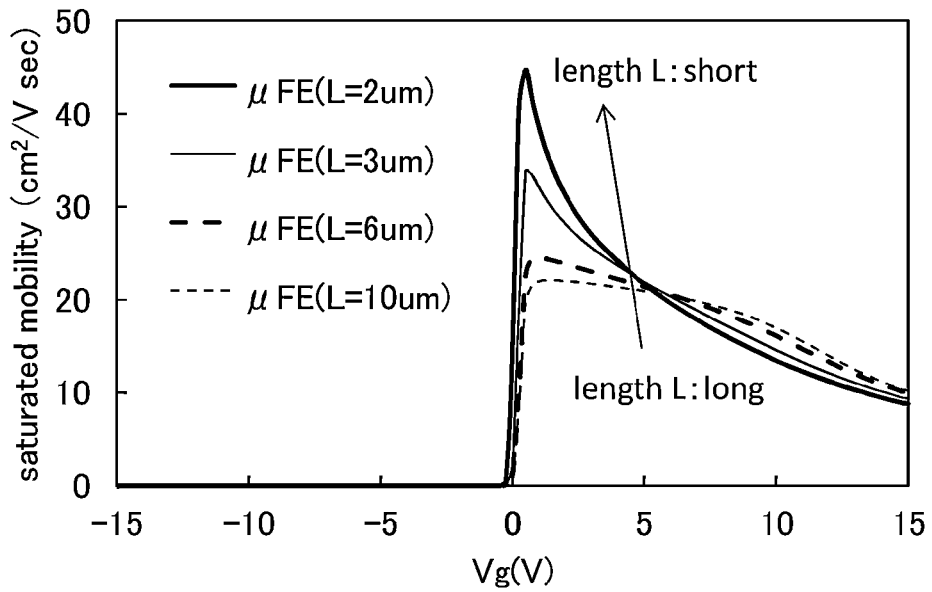
FIGS. 31A and 31B each show channel length dependence of saturation mobility obtained by calculation.
Figure 31B:
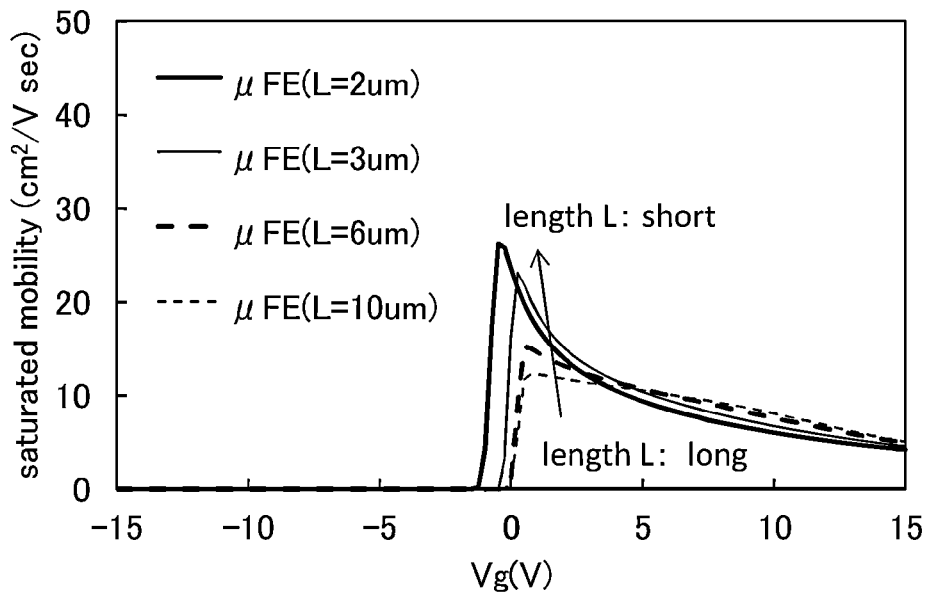

FIG. 31A shows calculation result of the dual-gate transistor, and FIG. 31B shows calculation result of the single-gate transistor that does not include a gate electrode GE_2.

FIGS. 31A and 31B show that the saturation mobility has a sharp peak in both of the dual-gate transistor and the single-gate transistor. The peak value of the saturation mobility is increased as the channel length L becomes shorter.

Description is given below of whether an increase in the saturation mobility with decreasing the channel length L corresponds to the improvement in the current drive capability of the transistor.

Figure 32:
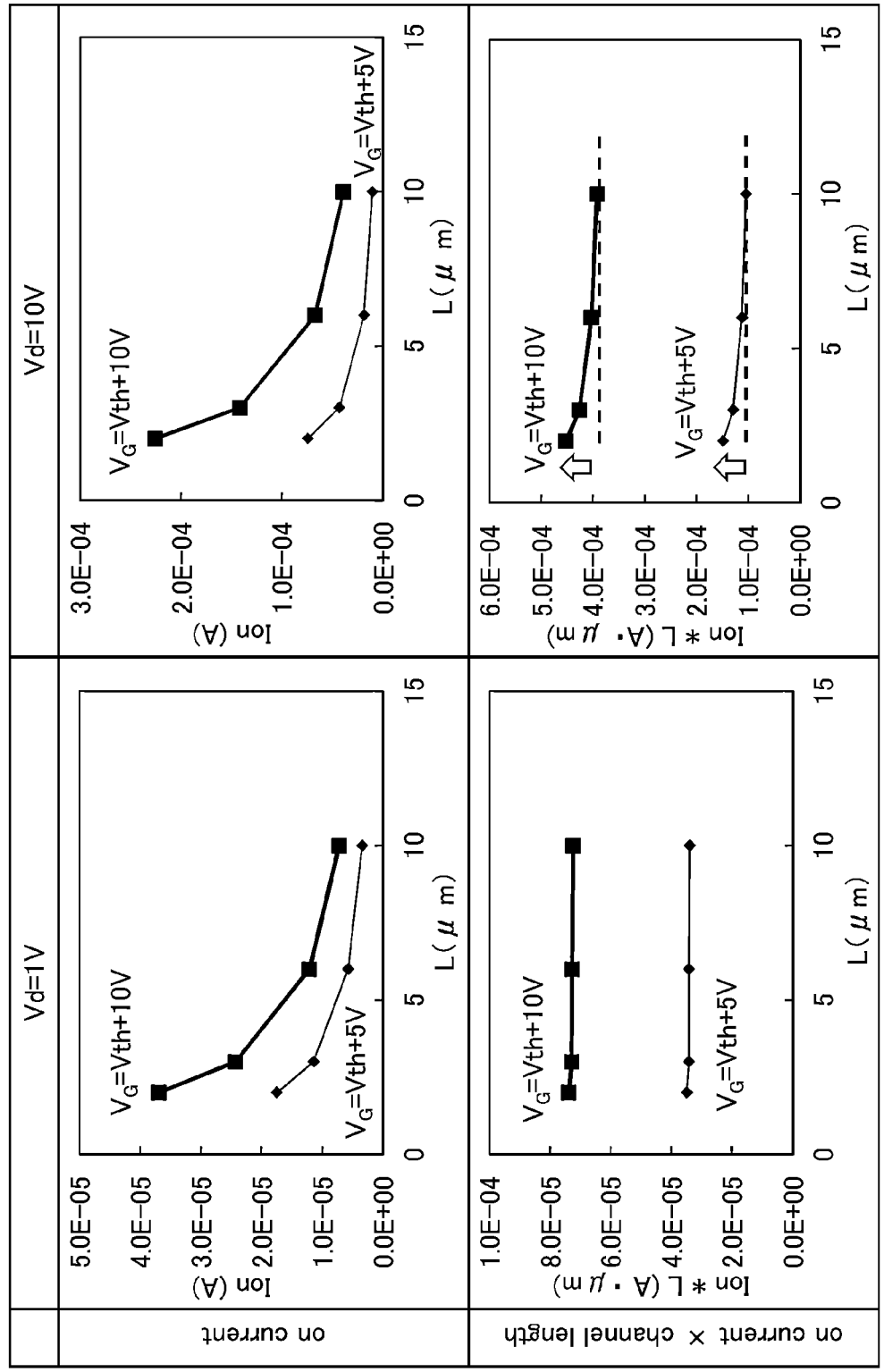
FIG. 32 shows channel length dependence of on-state current obtained by calculation.

FIG. 32 shows on-state current versus channel length plots at gate voltages $V_g$ of ($V_{th}$+5) V and ($V_{th}$+10) V, which are obtained from the calculation result of the ideal model. In FIG. 32, the top plots each show on-state current and the bottom plots each show a value obtained by multiplying the on-state current by the channel length. Note that in FIG. 32, the left plots show the calculation results at a drain voltage $V_d$ of 1 V and the right plots show the calculation results at a drain voltage $V_d$ of 10 V.

In FIG. 32, the on-state current is inversely proportional to the channel length L. This is because the on-state current is inversely proportional to the channel length L.

When the on-state current is completely inversely proportional to the channel length, a value obtained by multiplying the on-state current by the channel length is constant regardless of the channel length. In FIG. 32, a value obtained by multiplying the on-state current by the channel length at a drain voltage $V_d$ of 1 V is substantially constant to the channel length L. In contrast, a value obtained by multiplying the on-state current by the channel length at a drain voltage $V_d$ of 10 V is increased as the channel length L becomes shorter. This suggests that in the case of a drain voltage $V_d$ of 10 V, an effective channel length which is described later is shorter than the channel length (a distance between the source electrode S and the drain electrode D) determined in FIG. 30.

<<Theory of Bulk Current>>

The reason why a peak of the saturation mobility is caused at low gate voltage in the transistor with the ideal model is described below.

It is assumed that in the transistor illustrated in FIG. 30, the density of electrons in the oxide semiconductor film OS is constant in the thickness direction of the oxide semiconductor film OS and represented by a value $n_0(y)$; y represents a given position in the oxide semiconductor film OS in the channel length direction. Potential $\varphi$ in the thickness direction of the oxide semiconductor film OS is represented by Formula 2, which is constant. Note that it is assumed that a gate voltage $V_g\_1$ of the gate electrode GE_1 and a gate voltage $V_g\_2$ of the gate electrode GE_2 are equal to each other, and a flat band voltage on the gate electrode GE_1 side and a flat band voltage on the gate electrode GE_2 side are collectively referred to as a flat band voltage $V_{FB}$.

$$\varphi - V(y) = V_g - V_{FB} - V(y) \quad \text{[Formula 2]}$$

In this case, in an accumulation-type transistor including an oxide semiconductor film, a drain current $I_d$ can be approximately represented by only a bulk current $I_{bulk}$ as shown in Formula 3.

$$I_d \cong I_{bulk} = \frac{Wt}{L_{eff}} \mu k_B T [n_0(0) - n_0(L_{eff})] \quad \text{[Formula 3]}$$

Note that in Formula 3, t represents the thickness of the oxide semiconductor film, $\mu$ represents the electron mobility of the oxide semiconductor film, $k_B$ represents the Boltzmann's constant, T represents the absolute temperature, and $L_{eff}$ represents an effective channel length. The effective channel length refers to the distance between an n region which extends under the source electrode and an n region which extends under the drain electrode in the oxide semiconductor film. The effective channel length becomes shorter than the channel length particularly in the case where the channel length is short or the drain voltage is high.

Note that $n_0(0)$ represents the electron density of a source-electrode-side end portion of a region determined by the effective channel length, which can be represented by Formula 4. Further, $n_0(L_{eff})$ represents the electron density of a drain-electrode-side end portion of the region determined by the effective channel length, which can be represented by Formula 5. In Formulae 4 and 5, $N_D$ represents the donor density of the channel region in the oxide semiconductor film and q represents elementary charge.

$$n_0(0) = N_D e^{q\varphi/k_B T} = N_D e^{q(V_g - V_{FB})/k_B T} \quad \text{[Formula 4]}$$

$$n_0(L_{eff}) = N_D e^{q(\varphi - V_d)/k_B T} = N_D e^{q(V_g - V_{FB} - V_d)/k_B T} \quad \text{[Formula 5]}$$

In the case of a saturation region satisfying $V_d > V_g - V_{th}$ and $V_g > V_{th}$, the drain voltage $V_d$ can be replaced with $V_g - V_{th}$, so that Formula 3 is changed into Formula 6.

$$I_d = \frac{Wt}{L_{eff}} \mu k_B T N_D e^{-qV_{FB}/k_B T} (e^{qV_g/k_B T} - e^{qV_{th}/k_B T}) \quad \text{[Formula 6]}$$

Saturation mobility $\mu_{FE}^{sat}$ to the drain current $I_d$ obtained by Formula 6 is represented by Formula 7.

$$\mu_{FE}^{sat} \equiv \left(\frac{d\sqrt{I_d}}{dV_g}\right)^2 \frac{2L}{C_{GI}W} = \frac{L\mu q^2 N_D e^{-qV_{FB}/k_B T}}{2L_{eff} C_{GI} k_B T} \frac{e^{qV_g/k_B T}}{1 - e^{q(V_g - V_{th})/k_B T}} \quad \text{[Formula 7]}$$

In Formula 7, a denominator is 0 when $V_g$ is $V_{th}$, in which case the saturation mobility $\mu_{FE}^{sat}$ diverges to infinity. This is the cause of the peak of the saturation mobility at low gate voltage $V_g$, which is shown in FIGS. 31A and 31B. That is, the more the drain current is affected by the bulk current which flows inside the oxide semiconductor film OS, the clearer the peak is as shown in the saturation mobility observed in the case of a channel length of 2 μm in FIGS. 31A and 31B.

In addition, the saturation mobility is probably increased when the effective channel length $L_{eff}$ is shorter than the channel length L. In the oxide semiconductor film OS, when the n regions are formed in vicinities of regions of the oxide semiconductor film OS each of which is in contact with the source electrode S or the drain electrode D, the effective channel length $L_{eff}$ becomes shorter than the channel length L, for example. This effect is apparent from the saturation mobility $\mu_{FE}^{sat}$ shown in Formula 7 that is proportional to $L/L_{eff}$.

<<Current Density in Oxide Semiconductor Film>>

The effect of the bulk current on saturation mobility is a phenomenon peculiar to a transistor including an oxide semiconductor film, which is an accumulation-type device. The effect of the bulk current is small in a transistor including a silicon film as a semiconductor film, which is an inversion-type device.

Figure 33A:
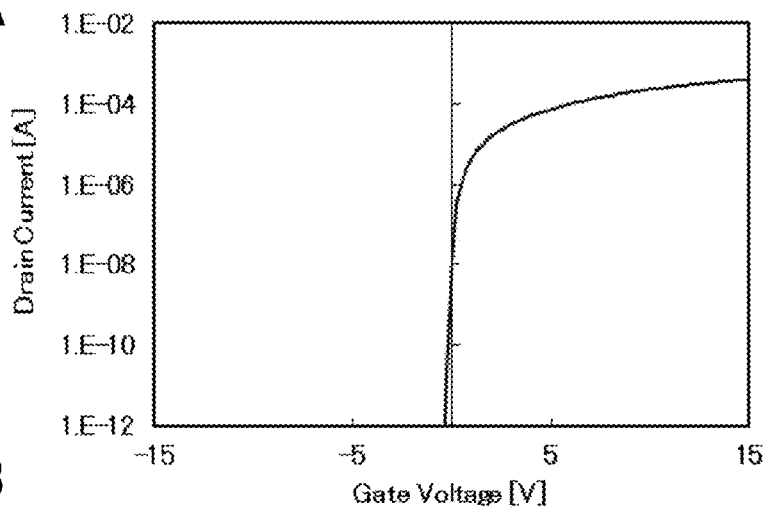
FIG. 33A shows the $V_g$-$I_d$ characteristics of a transistor obtained by calculation and FIGS. 33B and 33C each show current distribution in an oxide semiconductor film obtained by calculation.
Figure 33B:
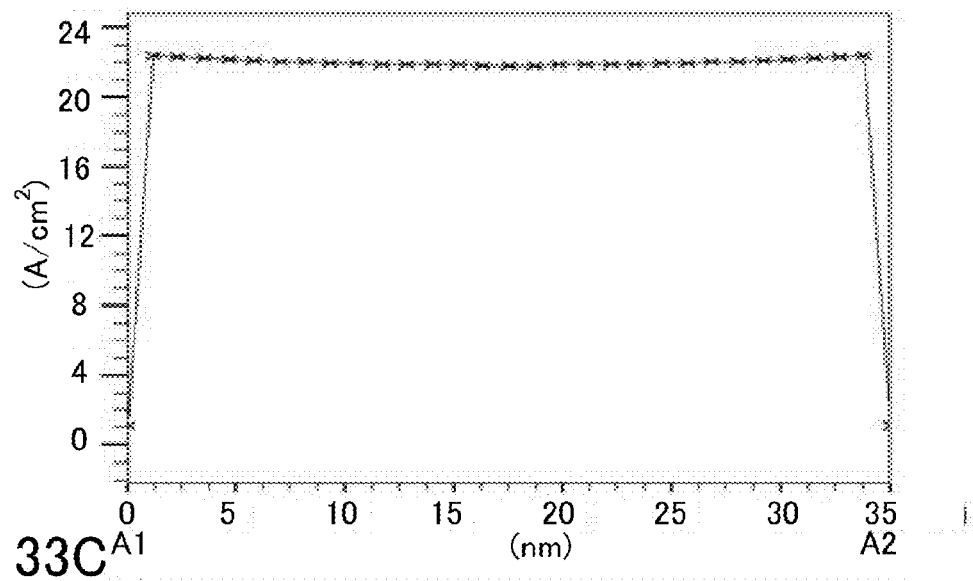
Figure 33C:
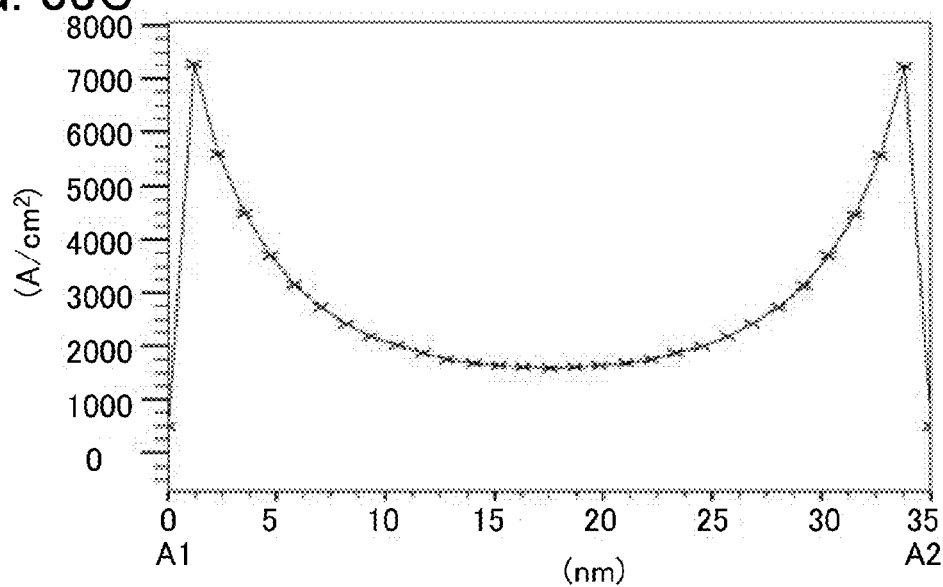

FIGS. 33B and 33C are plots of current density distributions obtained by device simulation. FIG. 33A illustrates $V_g - I_d$ characteristics obtained by calculation with a drain voltage of 10 V. FIGS. 33B and 33C each show a current density distribution in the oxide semiconductor film in a cross-sectional direction along A1-A2 in FIG. 30. FIG. 33B shows the current density distribution in a saturation region ($V_g = 0.5$ V), and FIG. 33C shows the current density distribution in a linear region ($V_g = 15$ V). Note that in the calculation, a transistor had a channel length L of 2 μm and a channel width W of 50 μm, and the drain voltage $V_d$ was 10 V.

FIG. 33B shows that the current density distribution in the oxide semiconductor film OS is almost uniform in the saturation region (at low gate voltage $V_g$). In contrast, FIG. 33C shows that current flowing in the vicinity of a surface of the oxide semiconductor film OS is dominant in the linear region (at high gate voltage $V_g$). Since the current density distribution is almost uniform in the oxide semiconductor film OS in the saturation region as shown in FIG. 33B, a cause of the peak in the saturation mobility is the bulk current.

Figure 34A:
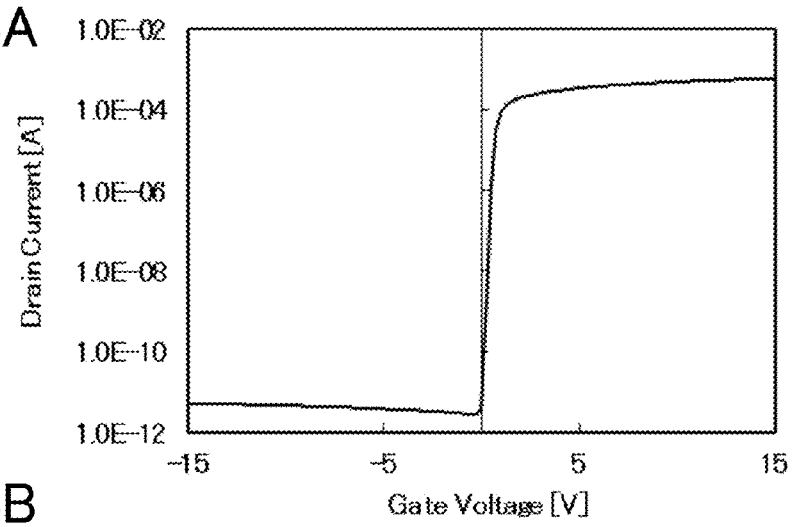
FIG. 34A shows the $V_g$-$I_d$ characteristics of a transistor obtained by calculation and FIGS. 34B and 34C each show current distribution in a silicon film obtained by calculation.
Figure 34B:
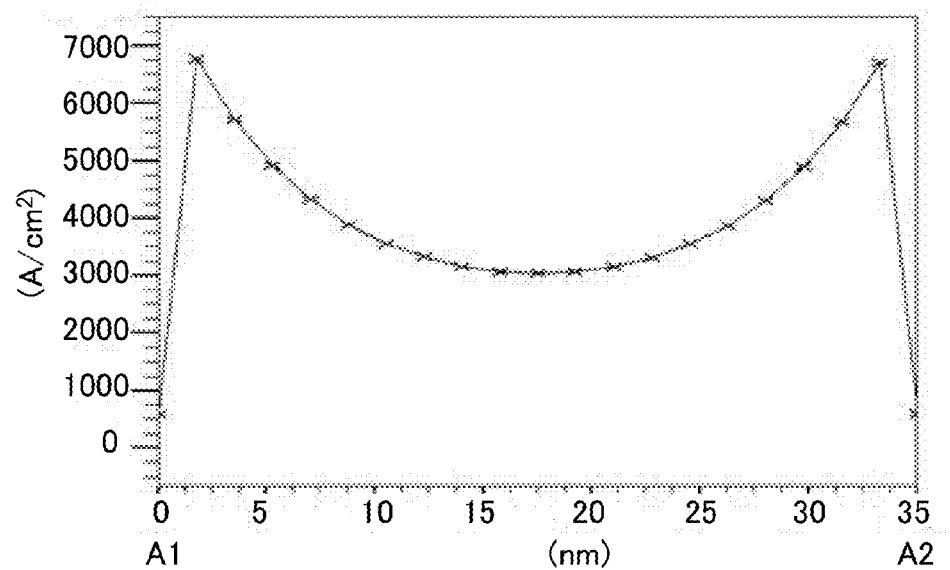
Figure 34C:
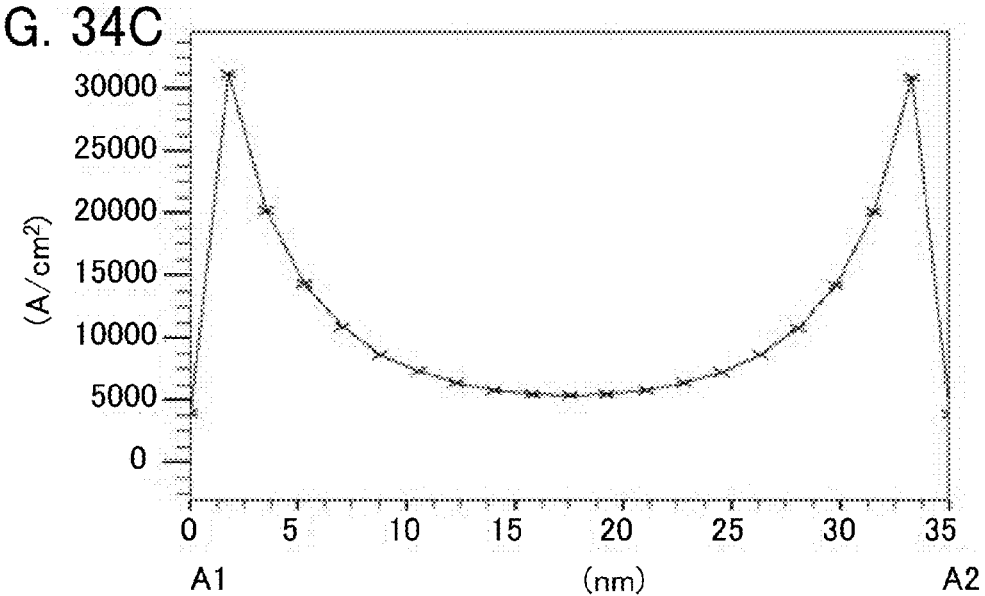

FIGS. 34B and 34C each show a current density distribution in a semiconductor film of an inversion-type device, which is obtained by device simulation. FIGS. 34A to 34C show the calculation results of a transistor obtained by replacing the oxide semiconductor film OS with a semiconductor (silicon) film including an n-p-n junction in the transistor illustrated in FIG. 30. A channel region of the semiconductor film is assumed to have acceptor impurities with a density of $1 \times 17/cm^3$.

FIG. 34A illustrates $V_g$–$I_d$ characteristics obtained by calculation with a drain voltage of 10 V. FIGS. 34B and 34C each show a current density distribution in the semiconductor film in a cross-sectional direction along A1-A2 in FIG. 30. FIG. 34B shows the current density distribution in a saturation region ($V_g$=0.5 V), and FIG. 34C shows the current density distribution in a linear region ($V_g$=15 V). Note that in the calculation, a transistor had a channel length L of 2 μm and a channel width W of 50 μm, and the drain voltage $V_d$ was 10 V.

Unlike in the transistor including the oxide semiconductor film that is an accumulation-type device, in the transistor including the semiconductor film that is an inversion-type device, current flowing through a surface of the semiconductor film is increased even at around the threshold voltage as shown in FIG. 34B. The effect of the bulk current in the inversion-type device is smaller than that in the accumulation-type device.

The above results show that in a transistor including an oxide semiconductor film that is an accumulation-type device with the ideal model, the saturation mobility has a sharp peak due to the bulk current. Furthermore, because of the bulk current, the saturation mobility is improved as the channel length L becomes short.

As the channel length L becomes shorter, the peak value of the saturation mobility due to the bulk current is increased. This is probably because the effective channel length $L_{eff}$ becomes shorter than the channel length L due to formation of the n regions in the vicinities of the regions of the oxide semiconductor film OS each of which is in contact with the source electrode S or the drain electrode D. Furthermore, it is probable that when the channel length L is short, the effective channel length $L_{eff}$ becomes shorter than the channel length L by a phenomenon (conduction band lowering effect: CBL effect) in which the conduction band minimum (Ec) of the oxide semiconductor film OS is reduced and the conduction band minimum gets closer to the Fermi energy because of the effect of the source electrode S and the drain electrode D. As shown in Formula 7, as the effective channel length $L_{eff}$ becomes short, the saturation mobility is increased in proportion to $L/L_{eff}$. This effect becomes significant as the channel length L becomes short; therefore, it is probable that the saturation mobility is increased as the channel length L becomes short.

<<Model Assuming Shallow Electron Trap State>>

Next, to approximate the saturation mobility of the transistor with the ideal model to that of an actual transistor, calculation was performed on the assumption that there is an acceptor level that is negatively charged when trapping an electron, i.e., a shallow electron trap state, at the interface between the gate insulating film GI_1 and the oxide semiconductor film OS in the transistor with the ideal model. Calculation results are shown in FIGS. 35A to 35C.

Figure 35A:
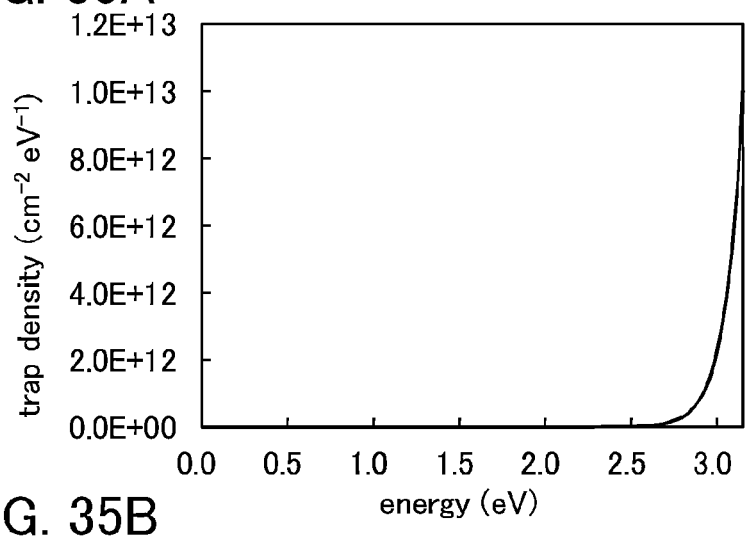
FIG. 35A shows an electron trap used for calculation and FIGS. 35B and 35C each show channel length dependence of saturation mobility obtained by calculation.

FIG. 35A shows density of states (DOS) of the electron trap state which is assumed to be at the interface between the gate insulating film GI_1 and the oxide semiconductor film OS.

Next, the saturation mobilities of a dual-gate transistor and a single-gate transistor were calculated. FIG. 35B shows the calculation result of the dual-gate transistor, and FIG. 35C shows the calculation result of the single-gate transistor.

Figure 35B:
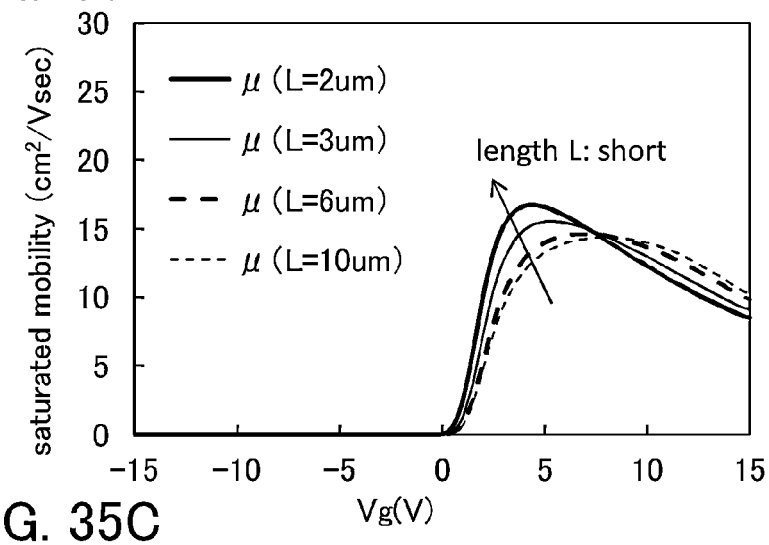
Figure 35C:
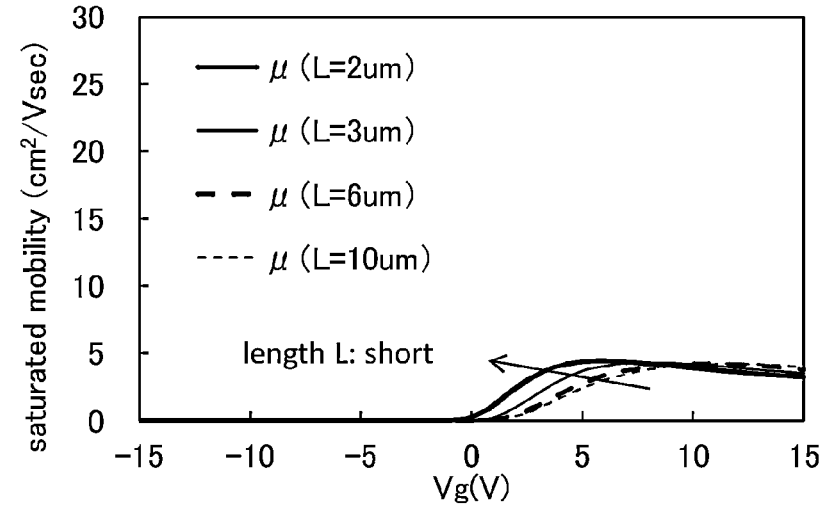

As shown in FIGS. 35B and 35C, unlike in the saturation mobility of the transistor with the ideal model, a sharp peak is not observed in the saturation mobilities of the dual-gate transistor and the single-gate transistor. In FIG. 35C, the peak values of the saturation mobilities are each around 5 $cm^2/V \cdot sec$, which shows that the saturation mobility of the transistor in the single-gate driving does not depend too much on the channel length L. In contrast, the peak values of the saturation mobilities of the dual-gate transistor are each greater than or equal to 15 $cm^2/V \cdot sec$ and a little less than 20 $cm^2/V \cdot sec$, and are increased as the channel length L becomes short. These results are similar to those in Example described later.

Consequently, it is found that the saturation mobility is increased as the channel length L becomes short in a dual-gate transistor.

<Comparison Between Channel-Etched Transistor and Channel-Protective Transistor Operated by Dual-Gate Driving>

The field-effect mobility $\mu_{FE}$ and the on-state current $I_{on}$ of a channel-etched transistor are compared with those of a channel protective transistor below using calculation results of the electrical characteristics of the transistors. Note that the transistors are operated by dual-gate driving. In each of the transistors, gate electrodes facing each other with an oxide semiconductor film provided therebetween are connected to each other and have the same potential.

Figure 29A:
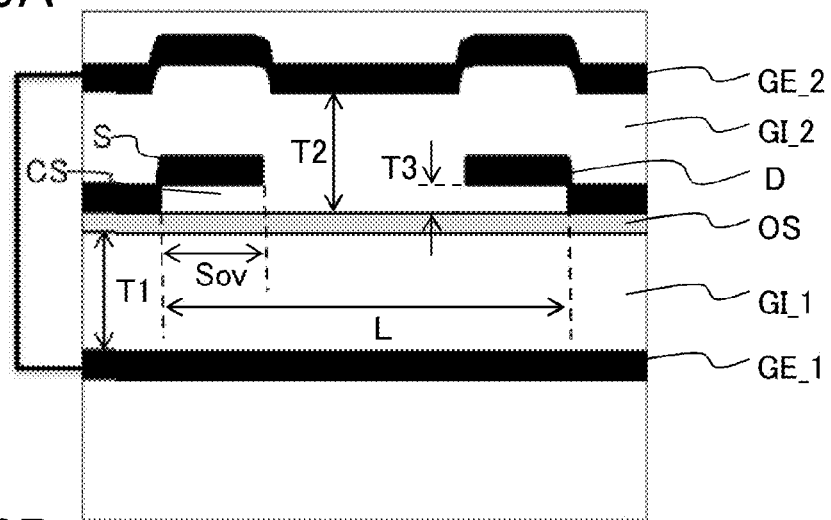
FIGS. 29A to 29C show a structure of a transistor used for calculation, field-effect mobility obtained by the calculation, and on-state current obtained by the calculation.

FIG. 29A illustrates a structure of the channel-protective transistor used for the calculation. Note that device simulation software "Atlas" (manufactured by Silvaco Data Systems Inc.) was used for the calculation.

In the channel-protective transistor, a gate insulating film GI_1 is formed over a gate electrode GE_1, an oxide semiconductor film OS is formed over the gate insulating film GI_1, and a source electrode S and a drain electrode D are formed over the gate insulating film GI_1 and the oxide semiconductor film OS. Note that a channel protective film CS is formed between the oxide semiconductor film OS and end portions of the source electrode S and the drain electrode D. In addition, a gate insulating film GI_2 is formed over the oxide semiconductor film OS, the source electrode S, the drain electrode D, and the channel protective film CS; and a gate electrode GE_2 is formed over the gate insulating film GI_2. The gate electrode GE_1 is connected to the gate electrode GE_2 in an opening portion (not illustrated) formed in the gate insulating film GI_1 and the gate insulating film GI_2.

In the channel-etched transistor, a channel protective film CS is not provided, and end portions of a source electrode S and a drain electrode D are in contact with an oxide semiconductor film OS.

Calculation conditions are shown in Table 2.

TABLE 2

| | |
|---|---|
| Channel length (L) | 10 μm |
| Channel width (W) | 50 μm |
| Thickness of GI_1 (T1) | 450 nm |
| Thickness of GI_2 (T2) | 450 nm |
| Thickness of channel protective film CS (T3) | 100 nm |
| Dielectric constants of GI_1, GI_2, and CS (Er) | 3.9 |
| Thickness of OS | 35 nm |
| Mobility of OS | 10 cm$^2$/Vsec |
| Dielectric constant of OS (Er) | 15 |
| Donor density of OS under SD | $1 \times 10^{19}$/cm$^3$ |
| Donor density of OS in channel region | $6.6 \times 10^{-9}$/cm$^3$ |

As a comparison example of the dual-gate transistor which is illustrated in FIG. 29A, a transistor operated by a single-gate driving that does not include a gate electrode GE_2 was used and subjected to calculation in the manner similar to that of the dual-gate transistor. The single-gate transistor corresponds to the transistor 400b serving as a selection transistor illustrated in FIGS. 2A2, 2B, and 2C2.

Figure 29B:
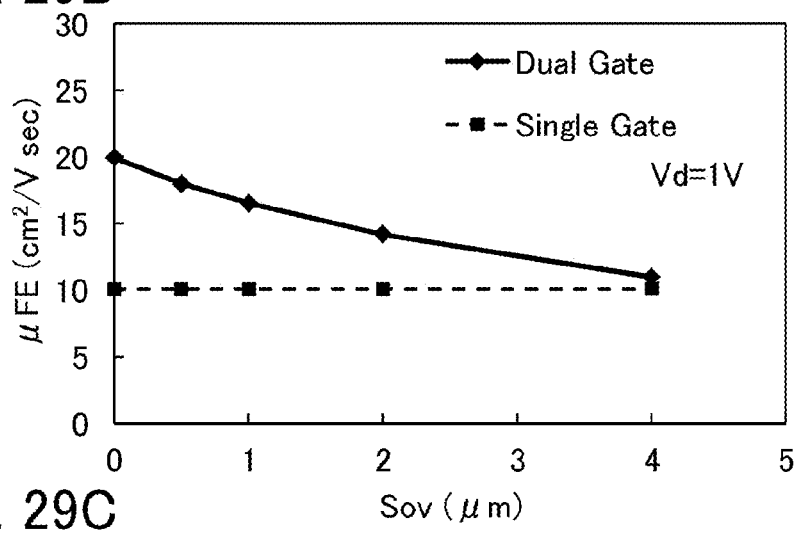
Figure 29C:
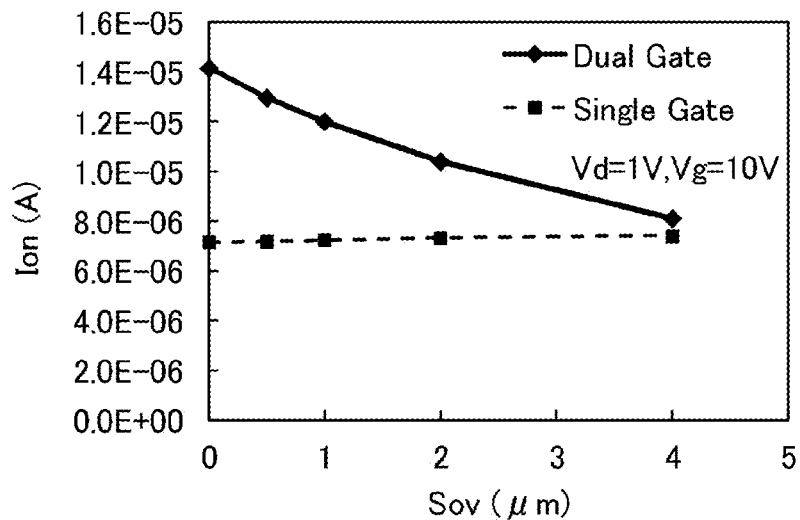

In the channel-protective transistor, Sov denotes the length of a region where the source electrode S or the drain electrode D overlaps with the oxide semiconductor film OS with the channel protective film CS provided therebetween. A region which is in the source electrode S or the drain electrode D and overlaps with the oxide semiconductor film OS with the channel protective film CS provided therebetween is referred to as an Sov region. FIG. 29B shows the calculation result of the relationship between Sov and field-effect mobility. FIG. 29C shows the calculation result of the relationship between Sov and on-state current.

Furthermore, the field-effect mobility and the on-state current of the channel-etched transistor were calculated on the assumption that Sov was 0 μm. The calculation result of the field-effect mobility and that of the on-state current are shown in FIGS. 29B and 29C, respectively.

Note that FIG. 29B shows the result at a drain voltage $V_d$ of 1 V. FIG. 29C shows the result at a drain voltage $V_d$ of 1 V and a gate voltage $V_g$ of 10 V.

As shown in FIG. 29B, the field-effect mobility of the channel-etched transistor (Sov=0 μm) operated by the dual-gate driving is approximately twice that of the channel-etched transistor operated by the single-gate driving. In contrast, the field-effect mobility of the channel-protective transistor operated by the dual-gate driving is decreased as the Sov becomes larger.

As shown in FIG. 29C, the on-state current of the channel-etched transistor (Sov=0 μm) operated by the dual-gate driving is approximately twice that of the transistor operated by the single-gate driving. In contrast, the on-state current of the channel-protective transistor operated by the dual-gate driving is reduced as the Sov becomes larger.

In the channel-protective transistor, the Sov regions of the source electrode S and the drain electrode D block an electric field of the gate electrode GE_2. Accordingly, a region whose carrier density cannot be controlled by the voltage of the gate electrode GE_2 is increased in the oxide semiconductor film OS. It is probable that the field-effect mobility and the on-state current are thus decreased as the Sov becomes larger. In view of the above, the channel-etched dual-gate transistor is much more effective in increasing the field-effect mobility and the on-state current than the channel-protective dual-gate transistor is. In other words, it is effective to use a channel-etched transistor as the transistor 400a serving as a driver transistor for the light-emitting element in the display device of this embodiment.

The distance between the pair of electrodes in the channel-etched transistor can be made small easily in comparison with the channel protective transistor. Thus, the transistor 400a can have a channel length greater than or equal to 0.5 μm and less than or equal to 4.5 μm, preferably greater than 1 μm and less than or equal to 4 μm, further preferably greater than 1 μm and less than or equal to 3.5 μm, still further preferably greater than 1 μm and less than or equal to 2.5 μm.

<Method for Manufacturing Display Device>

Next, a method for manufacturing the display device including the transistor 400a and the transistor 400b illustrated in FIGS. 2A1, 2A2, 2B, 2C1, 2C2, and 2D is described with reference to FIGS. 3A to 3D, FIGS. 4A and 4B, FIGS. 5A and 5B, and FIGS. 6A and 6B. In each of FIGS. 3A to 3D, FIGS. 4A and 4B, FIGS. 5A and 5B, and FIGS. 6A and 6B, a cross-sectional view in the channel length direction along line A1-B1 and a cross-sectional view in the channel width direction along line C1-D1 are used for describing a method for manufacturing the transistor 400a, and a cross-sectional view in the channel length direction along line A2-B2 is used for describing a method for manufacturing the transistor 400b.

Note that the cross-sectional view of the transistor 400b in the channel width direction is similar to that of the transistor 400a except that the gate electrode 31 which is in contact with the gate electrode 13a in the opening portions 42 and 43 is not included.

As illustrated in FIG. 3A, a conductive film 12 to be the gate electrodes 13a and 13b is formed over the substrate 11.

In this case, a glass substrate is used as the substrate 11.

The conductive film 12 is formed by a sputtering method, a CVD method, an evaporation method, or the like.

As the conductive film 12, a 100 nm-thick tungsten film is formed by a sputtering method.

Then, a mask is formed over the conductive film 12 by a photolithography process using a first photomask. Next, the conductive film 12 is partly etched using the mask to form the gate electrodes 13a and 13b. After that, the mask is removed (see FIG. 3B).

The conductive film 12 can be partly etched by one or both of wet etching and dry etching.

Here, a mask is formed by a photolithography process and the conductive film 12 is dry-etched using the mask to form the gate electrodes 13a and 13b.

Note that the gate electrodes 13a and 13b may be formed by an electrolytic plating method, a printing method, an ink-jet method, or the like instead of the above formation method.

Next, as illustrated in FIG. 3C, an insulating film 14 to be the insulating film 15 is formed over the substrate 11 and the gate electrodes 13a and 13b, and an oxide semiconductor film 16 to be the oxide semiconductor films 17a and 17b is formed over the insulating film 14.

The insulating film 14 is formed by a sputtering method, a CVD method, an evaporation method, or the like.

In the case where a silicon oxide film, a silicon oxynitride film, or a silicon nitride oxide film is formed as the insulating film 14, a deposition gas containing silicon and an oxidizing gas are preferred to be used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the insulating film 14, a metal organic chemical vapor deposition (MOCVD) method can be employed.

The oxide semiconductor film 16 can be formed by a sputtering method, a coating method, a pulsed laser deposition method, a laser ablation method, or the like.

In the case where the oxide semiconductor film 16 is formed by a sputtering method, a power supply device for generating plasma can be an RF power supply device, an AC power supply device, a DC power supply device, or the like as appropriate.

As a sputtering gas, a rare gas (argon as a typical example) atmosphere, an oxidizing atmosphere, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film 16 to be formed.

To make the oxide semiconductor film 16 intrinsic or substantially intrinsic, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film 16 can be prevented as much as possible.

Here, a 35-nm-thick In—Ga—Zn oxide film is formed as the oxide semiconductor film 16 by a sputtering method using an In—Ga—Zn-oxide target (In:Ga:Zn=1:1:1).

Then, after a mask is formed over the oxide semiconductor film 16 by a photolithography process using a second photomask, the oxide semiconductor film 16 is partly etched using the mask. Thus, the oxide semiconductor films 17a and 17b subjected to element isolation are formed. After that, the mask is removed (see FIG. 3D).

The oxide semiconductor film 16 can be partly etched by one or both of wet etching and dry etching.

Here, a mask is formed by a photolithography process and the oxide semiconductor film 16 is wet-etched using the mask to form the oxide semiconductor films 17a and 17b.

After that, heat treatment may be performed at higher than or equal to 150° C. and lower than the strain point of the substrate, preferably higher than or equal to 200° C. and lower than or equal to 450° C., further preferably higher than or equal to 300° C. and lower than or equal to 450° C. This heat treatment can reduce the amount of hydrogen, water, and the like contained in the oxide semiconductor films 17a and 17b, which results in a reduction in impurities contained in the oxide semiconductor films 17a and 17b.

Next, as illustrated in FIG. 4A, a conductive film 18 to be the pair of electrodes 20a and 20b of the transistor 400a and the pair of electrodes 20c and 20d of the transistor 400b is formed.

The conductive film 18 is formed by a sputtering method, a CVD method, an evaporation method, or the like.

Here, a 50-nm-thick tungsten film and a 300-nm-thick copper film are sequentially stacked by a sputtering method to form the conductive film 18.

Next, a mask is formed over the conductive film 18 by a photolithography process using a third photomask. Then, the conductive film 18 is etched using the mask, so that the pair of electrodes 20a and 20b and the pair of electrodes 20c and 20d are formed. After that, the mask is removed (see FIG. 4B).

Here, the tungsten film and the copper film are dry-etched using the mask to form the pair of electrodes 20a and 20b and the pair of electrodes 20c and 20d. Note that in the case where the copper film is etched by a wet etching method first and then the tungsten film is etched by a dry etching method using $SF_6$, fluoride is formed on the surface of the copper film. By the fluoride, diffusion of copper elements from the copper film is reduced and thus the copper concentration in the oxide semiconductor films 17a and 17b can be reduced.

Figures 5A, 5B:
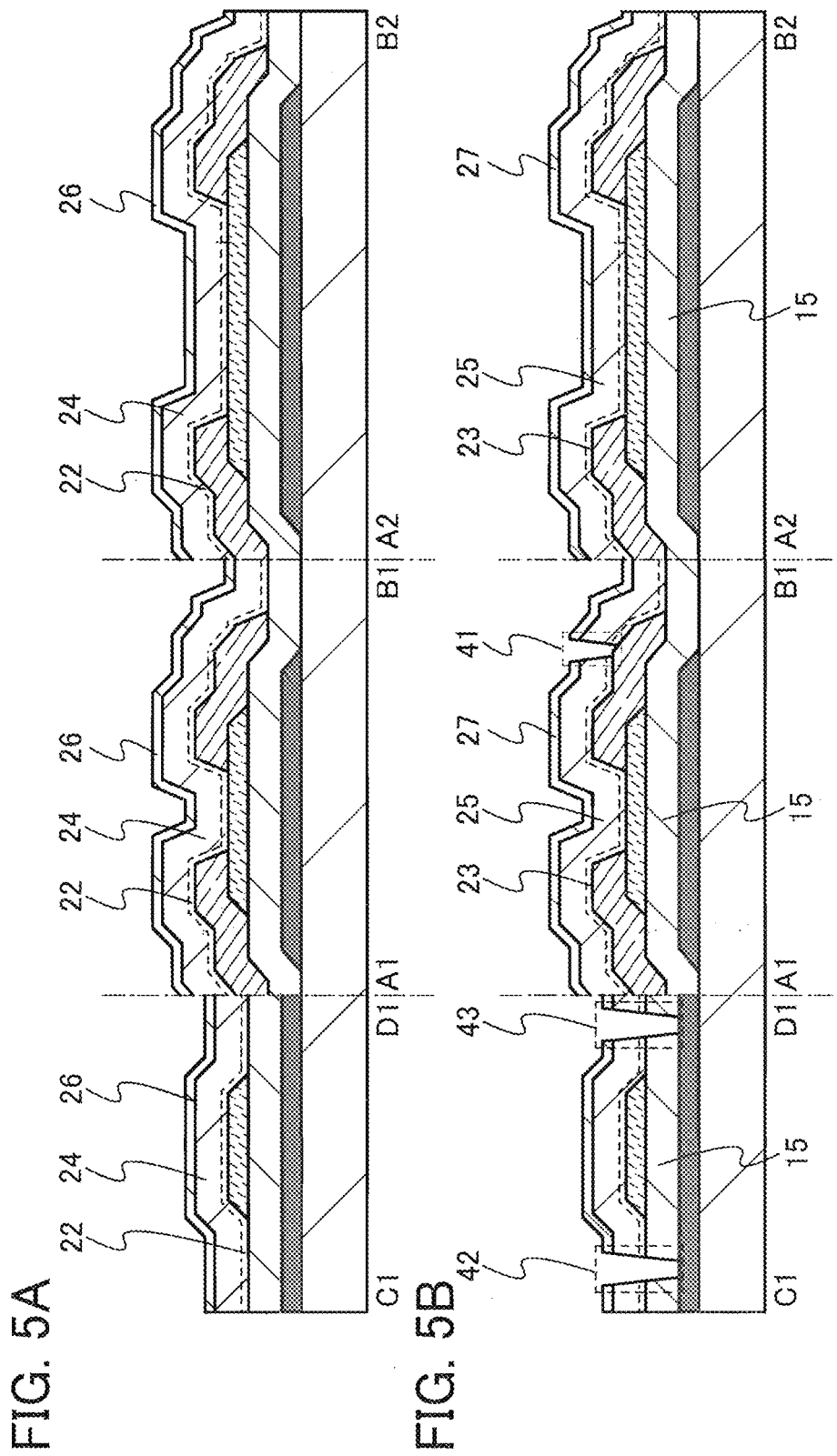
FIGS. 5A and 5B are cross-sectional views illustrating one embodiment of a method for manufacturing a display device.

Next, as illustrated in FIG. 5A, an oxide insulating film 22 to be the oxide insulating film 23 and an oxide insulating film 24 to be the oxide insulating film 25 are formed over the oxide semiconductor film 17a and the pair of electrodes 20a and 20b and over the oxide semiconductor film 17b and the pair of electrodes 20c and 20d.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 22 and the oxide insulating film 24 can be reduced and oxygen in the oxide insulating film 24 can be moved to the oxide semiconductor films 17a and 17b; accordingly, the amount of oxygen vacancies in the oxide semiconductor films 17a and 17b can be reduced.

As the oxide insulating film 22, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 22. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film which permeates oxygen can be formed as the oxide insulating film 22. Further, by providing the oxide insulating film 22, damage to the oxide semiconductor films 17a and 17b can be reduced in a step of forming the oxide insulating film 25 which is formed later.

Under the above film formation conditions, the bonding strength of silicon and oxygen becomes strong in the above substrate temperature range. Thus, as the oxide insulating film 22, a dense and hard oxide insulating film which permeates oxygen, as a typical example, a silicon oxide film or a silicon oxynitride film having an etching rate lower than or equal to 10 nm/min, preferably lower than or equal to 8 nm/min when etching is performed at 25° C. with 0.5 weight % using hydrofluoric acid can be formed.

In the case where hydrogen, water, and the like are contained in the oxide semiconductor films 17a and 17b, the hydrogen, water, and the like can be removed in this step because the oxide insulating film 22 is formed while heating is performed. Hydrogen contained in the oxide semiconductor films 17a and 17b is bonded to an oxygen radical formed in plasma to form water. Since the substrate is heated in the step of forming the oxide insulating film 22, water formed by bonding of oxygen and hydrogen is released from the oxide semiconductor films 17a and 17b. That is, when the oxide insulating film 22 is formed by a plasma CVD method, the amount of water and hydrogen contained in the oxide semiconductor films 17a and 17b can be reduced.

Further, time for heating in a state where the oxide semiconductor films are exposed can be shortened because heating is performed in a step of forming the oxide insulating film 22. Thus, the amount of oxygen released from the oxide semiconductor film by heat treatment can be reduced. That is, the amount of oxygen vacancies in the oxide semiconductor films 17a and 17b can be reduced.

Note that by setting the pressure in the treatment chamber to be greater than or equal to 100 Pa and less than or equal to 250 Pa, the amount of water contained in the oxide insulating film 23 is reduced; thus, variation in electrical characteristics of the transistors 400a and 400b can be reduced and change in threshold voltage can be inhibited.

Further, by setting the pressure in the treatment chamber to be greater than or equal to 100 Pa and less than or equal to 250 Pa, damage to the oxide semiconductor films 17a and 17b can be reduced when the oxide insulating film 22 is formed, so that the amount of oxygen vacancies contained in the oxide semiconductor films 17a and 17b can be reduced. In particular, when the film formation temperature of the oxide insulating film 22 or the oxide insulating film 24 which is formed later is set to be high, typified by a temperature higher than 220° C., part of oxygen contained in the oxide semiconductor films 17a and 17b is released and oxygen vacancies are easily formed. Further, when the film formation conditions for reducing the amount of defects in the oxide insulating film 24 which is formed later are used to increase reliability of the transistor, the amount of released oxygen is easily reduced. Thus, it is difficult to reduce oxygen vacancies in the oxide semiconductor films 17a and 17b in some cases. However, by setting the pressure in the treatment chamber to be greater than or equal to 100 Pa and less than or equal to 250 Pa to reduce damage to the oxide semiconductor films 17a and 17b at the time of forming the oxide insulating film 22, oxygen vacancies in the oxide semiconductor films 17a and 17b can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 22 can be reduced. Consequently, the amount of hydrogen entering the oxide semiconductor films 17a and 17b can be reduced; thus, the negative shift in the threshold voltage of the transistor can be inhibited.

Here, as the oxide insulating film 22, a 50-nm-thick silicon oxynitride film is formed by a plasma CVD method in which silane at a flow rate of 30 sccm and dinitrogen monoxide at a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film which permeates oxygen can be formed.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 24, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the oxide insulating film 25 becomes higher than that in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film which contains oxygen at a higher proportion than the stoichiometric composition and from which part of oxygen is released by heating. Further, the oxide insulating film 22 is provided over the oxide semiconductor film 17. Accordingly, in the step of forming the oxide insulating film 24, the oxide insulating film 22 serves as a protective film of the oxide semiconductor film 17. Consequently, the oxide insulating film 24 can be formed using the high-frequency power having a high power density while damage to the oxide semiconductor film 17 is reduced.

Here, as the oxide insulating film 24, a 400-nm-thick silicon oxynitride film is formed by a plasma CVD method in which silane at a flow rate of 200 sccm and dinitrogen monoxide at a flow rate of 4000 sccm are used as the source gas, the pressure in the reaction chamber is 200 Pa, the substrate temperature is 220° C., and the high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 cm$^2$, and the power per unit area (power density) into which the supplied power is converted is 0.25 W/cm$^2$.

Next, heat treatment is performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 24 can be moved to the oxide semiconductor films 17a and 17b, so that the amount of oxygen vacancies contained in the oxide semiconductor films 17a and 17b can be further reduced.

In the case where the oxide insulating film 22 and the oxide insulating film 24 contain water, hydrogen, or the like, water, hydrogen, or the like contained in the oxide insulating film 22 and the oxide insulating film 24 is moved to the oxide semiconductor films 17a and 17b by heat treatment performed after a nitride insulating film 26 that blocks water, hydrogen, and the like is formed, so that defects are generated in the oxide semiconductor films 17a and 17b. However, when the heat treatment is performed prior to formation of the nitride insulating film 26, water, hydrogen, or the like contained in the oxide insulating film 22 and the oxide insulating film 24 can be released; thus, variation in electrical characteristics of the transistors 400a and 400b can be reduced, and change in threshold voltage can be inhibited.

Note that when the oxide insulating film 24 is formed over the oxide insulating film 22 while being heated, oxygen can be moved to the oxide semiconductor films 17a and 17b to reduce the oxygen vacancies in the oxide semiconductor films 17a and 17b; thus, the heat treatment needs not to be performed.

Here, heat treatment is performed at 350° C. for one hour in an atmosphere of nitrogen and oxygen.

Furthermore, when the pair of electrodes 20a and 20b and the pair of electrodes 20c and 20d are formed, the oxide semiconductor films 17a and 17b are damaged by the etching of the conductive film, so that oxygen vacancies are generated on the back channel side (the side of the oxide semiconductor films 17a and 17b which is opposite to the side facing to the gate electrodes 13a and 13b) of the oxide semiconductor films 17a and 17b. However, with the use of the oxide insulating film containing oxygen at a higher proportion than the stoichiometric composition as the oxide insulating film 24, the oxygen vacancies generated on the back channel side can be reduced by heat treatment. As a result, the reliability of the transistors 400a and 400b can be improved.

Next, the nitride insulating film 26 to be the nitride insulating film 27 is formed by a sputtering method, a CVD method, or the like.

Note that in the case where the nitride insulating film 26 is formed by a plasma CVD method, the substrate placed in the treatment chamber of the plasma CVD apparatus that is vacuum-evacuated is preferably set to be higher than or equal to 300° C. and lower than or equal to 400° C., more preferably, higher than or equal to 320° C. and lower than or equal to 370° C., so that a dense nitride insulating film can be formed.

In the case where a silicon nitride film is formed by the plasma CVD method as the nitride insulating film 26, a deposition gas containing silicon, nitrogen, and ammonia are preferably used as a source gas. As the source gas, ammonia whose amount is smaller than the amount of nitrogen is used, whereby ammonia is dissociated in the plasma and activated species are generated. The activated species cut a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in a source gas, decomposition of a deposition gas containing silicon and decomposition of nitrogen are not promoted, so that a sparse silicon nitride film in which bonds between silicon and hydrogen remain and defects are increased is formed. Thus, in a source gas, the flow ratio of the nitrogen to the ammonia is set to be preferably greater than or equal to 5 and less than or equal to 50, more preferably greater than or equal to 10 and less than or equal to 50.

Here, in the reaction chamber of a plasma CVD apparatus, a 50-nm-thick silicon nitride film is formed as the nitride insulating film 26 by a plasma CVD method in which silane at a flow rate of 50 sccm, nitrogen at a flow rate of 5000 sccm, and ammonia at a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

Through the above-described steps, the oxide insulating film 22, the oxide insulating film 24, and the nitride insulating film 26 can be formed.

Next, heat treatment is performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C.

Next, a mask is formed over the nitride insulating film 26 by a photolithography process using a fourth photomask, and then each of the insulating film 14, the oxide insulating film 22, the oxide insulating film 24, and the nitride insulating film 26 is partly etched using the mask, so that the insulating film 15 and the insulating film 28 including the oxide insulating film 23, the oxide insulating film 25, and the nitride insulating film 27 are formed. As illustrated in the cross-sectional view along line A1-B1 in FIG. 5B, which is the cross-sectional view of the transistor 400a in the channel length direction, the opening portion 41 is provided in the insulating film 28. Further, as illustrated in the cross-sectional view along line C1-D1 in FIG. 5B, which is the cross-sectional view of the transistor 400a in the channel width direction, the opening portions 42 and 43 are provided in the insulating film 15 and the insulating film 28.

Then, as illustrated in FIG. 6A, a conductive film 30 to be the gate electrode 31 and the electrode 32 is formed.

The conductive film 30 is formed by a sputtering method, a CVD method, an evaporation method, or the like.

Here, an ITO film with a thickness of 100 nm is formed as the conductive film 30 by a sputtering method.

Then, a mask is formed over the conductive film 30 by a photolithography process using a fifth photomask. Next, the conductive film 30 is partly etched using the mask to form the gate electrode 31 and the electrode 32. After that, the mask is removed.

Note that as illustrated in FIG. 6B, in the channel width direction of the transistor 400a, the gate electrode 31 is formed so as to face the side surfaces of the oxide semiconductor film 17a at the side surfaces of the opening portions provided in the insulating film 15 and the insulating film 28.

Through the above process, the transistor 400a and the transistor 400b can be manufactured.

In the transistor described in this embodiment, the oxide insulating film containing oxygen at higher proportion than the stoichiometric composition is formed to overlap with the oxide semiconductor film that serves as a channel region, and thus, oxygen in the oxide insulating film can be transferred to the oxide semiconductor film. Consequently, oxygen vacancies contained in the oxide semiconductor film can be reduced, so that the transistor can have high reliability.

Further, in the channel width direction of the transistor 400a serving as a driver transistor for the light-emitting element, the gate electrode 31 faces the side surfaces of the oxide semiconductor film 17a at the side surfaces of the opening portions 42 and 43 provided in the insulating film 15 and the insulating film 28, whereby the electric field from the gate electrode 31 also affects the side surfaces of the oxide semiconductor film 17a and carriers flow in a wide region in the oxide semiconductor film 17a, so that the field-effect mobility and the on-state current of the transistor are increased.

When the transistor 400a serving as a driver transistor for the light-emitting element has a channel length greater than or equal to 0.5 µm and less than or equal to 4.5 µm, preferably greater than 1 µm and less than or equal to 4 µm, further preferably greater than 1 µm and less than or equal to 3.5 µm, still further preferably greater than 1 µm and less than or equal to 2.5 µm, the field-effect mobility of the transistor can be further increased. Accordingly, the display device can operate at high speed.

In addition, when the transistor 400b serving as a selection transistor in the pixel has a longer channel length than the transistor 400a, cutoff current can be low. Accordingly, low power consumption of the display device can be achieved.

Through the above steps, a display device which includes a transistor having an oxide semiconductor film and has favorable electrical characteristics can be obtained. Further, the display device including the transistor having the oxide semiconductor film can have high reliability.

Note that the structures, methods, and the like described in this embodiment can be used as appropriate in combination with any of the structures, methods, and the like described in the other embodiments.

Modification Example 1 of Display Device

Figure 7B:
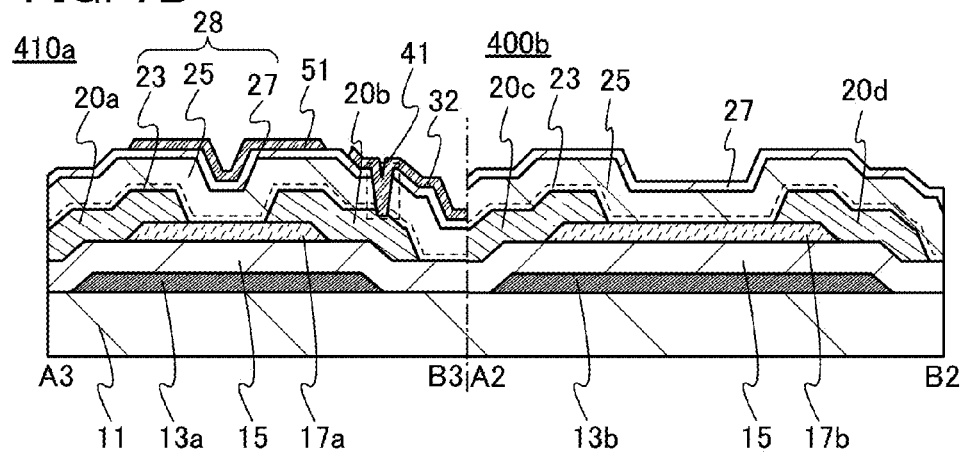

A display device having a structure that is different from that illustrated in FIGS. 2A1, 2A2, 2B, 2C1, 2C2, and 2D is described with reference to FIGS. 7A1, 7A2, 7B, 7C1, and 7C2. The display device illustrated in FIGS. 7A1, 7A2, 7B, 7C1, and 7C2 includes a pixel having a transistor 410a serving as a driver transistor and the transistor 400b serving as a selection transistor. FIG. 7A1 is a top view of the transistor 410a serving as a driver transistor. FIG. 7A2 is a top view of the transistor 400b serving as a selection transistor. FIG. 7B shows cross-sectional views taken along dashed-dotted line A3-B3 in FIG. 7A1 and dashed-dotted line A2-B2 in FIG. 7A2. FIG. 7C1 is a cross-sectional view taken along dashed-dotted line C3-D3 in FIG. 7A1. FIG. 7C2 is a cross-sectional view taken along dashed-dotted line C2-D2 in FIG. 7A2. Note that in FIGS. 7A1 and 7A2, the substrate 11, insulating films, and the like are omitted for simplicity.

The transistor 400b serving as a selection transistor illustrated in FIGS. 7A2, 7B, and 7C2 has a structure similar to that in FIGS. 2A2, 2B, and 2C2.

Unlike the above-described transistor 400a, the transistor 410a has a structure in which, in the channel width direction, the gate electrode 13a and a gate electrode 51 are connected to each other on an outer side of one side surface of the oxide semiconductor film 17a, and the gate electrode 13a and the gate electrode 51 face each other with the insulating film 15 and the insulating film 28 provided therebetween on an outer side of the other side surface of the oxide semiconductor film 17a.

The transistor 410a illustrated in FIGS. 7A1, 7B, and 7C1 is a channel-etched transistor. The transistor 410a includes the gate electrode 13a provided over the substrate 11, the insulating film 15 formed over the substrate 11 and the gate electrode 13a, the oxide semiconductor film 17a overlapping with the gate electrode 13a with the insulating film 15 provided therebetween, and the pair of electrodes 20a and 20b in contact with the oxide semiconductor film 17a. The transistor 410a also includes an insulating film 28 that is composed of the oxide insulating film 23, the oxide insulating film 25, and the nitride insulating film 27 and is over the insulating film 15, the oxide semiconductor film 17a, and the pair of electrodes 20a and 20b; and the gate electrode 51 formed over the insulating film 28. The gate electrode 51 is connected to the gate electrode 13a through the opening portion 42 provided in the insulating film 15 and the insulating film 28. Furthermore, the electrode 32 connected to one of the pair of electrodes 20a and 20b (here, the electrode 20b) is formed over the insulating film 28. Note that the electrode 32 serves as a pixel electrode.

The transistor 410a has a channel length greater than or equal to 0.5 µm and less than or equal to 4.5 µm, preferably greater than 1 µm and less than or equal to 4 µm, further preferably greater than 1 µm and less than or equal to 3.5 µm, still further preferably greater than 1 µm and less than or equal to 2.5 µm. Furthermore, in the transistor 410a, the oxide semiconductor film 17a is provided between the gate electrode 13a and the gate electrode 51. In addition, as illustrated in FIG. 7A1, the gate electrode 51 overlaps with the end portions of the oxide semiconductor film 17a with the insulating film 28 provided therebetween, when seen from the above.

Further, a plurality of opening portions are provided in the insulating film 15 and the insulating film 28. As a typical example, as illustrated in FIG. 7B, the opening portion 41 that reaches one of the pair of electrodes 20a and 20b is provided. Furthermore, as illustrated in FIG. 7C1, the opening portion 42 is provided in the insulating film 15 and the insulating film 28 on an outer side of one side surface of the oxide semiconductor film 17a in the channel width direction, and the gate electrode 51 and the gate electrode 13a are connected to each other through the opening portion 42. The gate electrode 51 faces the side surface of the oxide semiconductor film 17a in the channel width direction at the side surface of the opening portion 42. The gate electrode 51 and the gate electrode 13a are not connected to each other on an outer side of the other side surface of the oxide semiconductor film 17a in the channel width direction. End portions of the gate electrode 51 are positioned on the outer sides of the side surfaces of the oxide semiconductor film 17a.

Note that as illustrated in FIG. 7C1, a distance d between the side surface of the oxide semiconductor film 17a in the channel width direction and a projected end portion of the gate electrode 51 on the interface between the insulating film 15 and the insulating film 28 is preferably 1 to 7.5 times as long as the sum of the thickness t1 of the insulating film 15 and the thickness t2 of the insulating film 28. In the case where the distance d is equal to or longer than the sum of the thickness t1 of the insulating film 15 and the thickness t2 of the insulating film 28, an electric field from the gate electrode 51 affects the side surface of the oxide semiconductor film 17a or the end portion including the side surface and its vicinity. Thus, a parasitic channel can be prevented from being generated at the side surface of the oxide semiconductor film 17a or the end portion thereof. In addition, in the case where the distance d is 7.5 or less times as long as the sum of the thickness t1 of the insulating film 15 and the thickness t2 of the insulating film 28, the area of the transistor can be smaller.

Next, a manufacturing process of the transistor 410a will be described.

Through steps of FIGS. 3A to 3D, FIGS. 4A and 4B, and FIG. 5A, the gate electrode 13a, the insulating film 14, the oxide semiconductor film 17a, the pair of electrodes 20a and 20b, the oxide insulating film 22, the oxide insulating film 24, and the nitride insulating film 26 are formed over the substrate 11. In the steps, a photolithography process is performed using the first to third photomasks.

Next, after a mask is formed over the nitride insulating film 26 by a photolithography process using a fourth photomask, the insulating film 14, the oxide insulating film 22, the oxide insulating film 24, and the nitride insulating film 26 are partly etched to form the opening portions 41 and 42 illustrated in FIGS. 7A1, 7B, and 7C1.

Subsequently, the conductive film 30 is formed as in the step of FIG. 6A. Then, after a mask is formed over the conductive film 30 by a photolithography process using a fifth photomask, the conductive film 30 is partly etched to form the gate electrode 51 and the electrode 32 illustrated in FIGS. 7A1, 7B, and 7C1.

Through the above process, the transistor 410a can be manufactured.

Modification Example 2 of Display Device

A display device having a structure that is different from the structures illustrated in FIGS. 2A1, 2A2, 2B, 2C1, 2C2, and 2D and FIGS. 7A1, 7A2, 7B, 7C1, and 7C2 is described with reference to FIGS. 8A1, 8A2, 8B, 8C1, and 8C2. The display device illustrated in FIGS. 8A1, 8A2, 8B, 8C1, and 8C2 includes a pixel having a transistor 420a serving as a driver transistor and the transistor 400b serving as a selection transistor. FIG. 8A1 is a top view of the transistor 420a serving as a driver transistor. FIG. 8A2 is a top view of the transistor 400b serving as a selection transistor. FIG. 8B shows cross-sectional views taken along dashed-dotted line A4-B4 in FIG. 8A1 and dashed-dotted line A2-B2 in FIG. 8A2. FIG. 8C1 is a cross-sectional view taken along dashed-dotted line C4-D4 in FIG. 8A1. FIG. 8C2 is a cross-sectional view taken along dashed-dotted line C2-D2 in FIG. 8A2. Note that in FIGS. 8A1 and 8A2, the substrate 11, insulating films, and the like are omitted for simplicity.

The transistor 400b serving as a selection transistor illustrated in FIGS. 8A2, 8B, and 8C2 has a structure similar to that in FIGS. 2A2, 2B, and 2C2. Unlike in the above-described driver transistor 410a, the gate electrode 13a and a gate electrode 64 are connected to each other through a conductive film 62 in the transistor 420a serving as a driver transistor in FIGS. 8A1, 8B, and 8C1.

The transistor 420a illustrated in FIGS. 8A1, 8B, and 8C1 is a channel-etched transistor. The transistor 420a includes the gate electrode 13a provided over the substrate 11, the insulating film 15 formed over the substrate 11 and the gate electrode 13a, the oxide semiconductor film 17a overlapping with the gate electrode 13a with the insulating film 15 provided therebetween, and the pair of electrodes 20a and 20b in contact with the oxide semiconductor film 17a. The transistor 420a also includes an insulating film 28 that is composed of the oxide insulating film 23, the oxide insulating film 25, and the nitride insulating film 27 and is over the insulating film 15, the oxide semiconductor film 17a, and the pair of electrodes 20a and 20b; and the gate electrode 64 formed over the insulating film 28. The gate electrode 64 is connected to the gate electrode 13a through the conductive film 62. Furthermore, the electrode 32 connected to one of the pair of electrodes 20a and 20b (here, the electrode 20b) is formed over the insulating film 28. Note that the electrode 32 serves as a pixel electrode.

The transistor 420a has a channel length greater than or equal to 0.5 μm and less than or equal to 4.5 μm, preferably greater than 1 μm and less than or equal to 4 μm, further preferably greater than 1 μm and less than or equal to 3.5 μm, still further preferably greater than 1 μm and less than or equal to 2.5 μm. Furthermore, in the transistor 420a, the oxide semiconductor film 17a is provided between the gate electrode 13a and the gate electrode 64. In addition, as illustrated in FIG. 8A1, the gate electrode 64 overlaps with the end portions of the oxide semiconductor film 17a with the insulating film 28 provided therebetween, when seen from the above.

Further, a plurality of opening portions are provided in the insulating film 15 and the insulating film 28. As a typical example, as illustrated in FIG. 8B, the opening portion 41 that reaches one of the pair of electrodes 20a and 20b is provided in the transistor 420a. Furthermore, as illustrated in FIG. 8C1, the conductive film 62 is connected to the gate electrode 13a through an opening portion 61 provided in the insulating film 15. Note that the conductive film 62 is formed at the same time as the pair of electrodes 20a and 20b. The gate electrode 64 is connected to the conductive film 62 through an opening portion 63 provided in the insulating film 28. That is, the gate electrode 13a and the gate electrode 64 are electrically connected to each other through the conductive film 62. In addition, the conductive film 62 having the same potential as the gate electrode 13a and the gate electrode 64 faces the side surface of the oxide semiconductor film 17a.

Note that although the transistor 420a has a structure in which the gate electrode 13a and the gate electrode 64 are connected to each other through the conductive film 62 on an outer side of only one side surface of the oxide semiconductor film 17a in the channel width direction as illustrated in FIG. 8C1, the gate electrode 13a and the gate electrode 64 may be connected to each other through the conductive film 62 on the outer sides of both side surfaces of the oxide semiconductor film 17a in the channel width direction.

Next, a manufacturing process of the transistor 420a will be described.

Through steps of FIGS. 3A to 3D, the gate electrode 13a, the insulating film 14, and the oxide semiconductor film 17a are formed over the substrate 11. In the steps, a photolithography process is performed using the first and second photomasks.

Then, after a mask is formed over the insulating film 14 by a photolithography process using a third photomask, the insulating film 14 is partly etched to form the opening portion 61 illustrated in FIGS. 8A1 and 8C1.

Next, as in the steps of FIGS. 4A and 4B, a mask is formed over the conductive film 18 by a photolithography process using a fourth photomask and then, the conductive film 18 is partly etched to form the pair of electrodes 20a and 20b and the conductive film 62.

Subsequently, the oxide insulating film 22, the oxide insulating film 24, and the nitride insulating film 26 are formed as in the step of FIG. 5A. Next, after a mask is formed over the nitride insulating film 26 by a photolithography process using a fifth photomask, the nitride insulating film 26 is partly etched to form the opening portion 63 illustrated in FIGS. 8A1 and 8C1.

After that, the conductive film 30 is formed as in the step of FIG. 6A. Then, after a mask is formed over the conductive film 30 by a photolithography process using a sixth photomask, the conductive film 30 is partly etched to form the gate electrode 64 and the electrode 32 illustrated in FIGS. 8A1, 8B, and 8C1.

Through the above process, the transistor 420a can be manufactured.

Modification Example 3 of Display Device

Figure 11B:
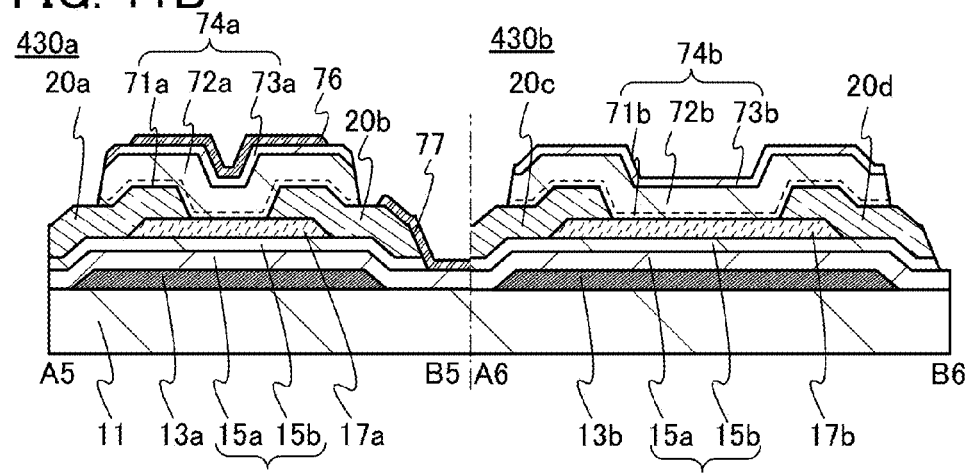

A display device having a structure that is different from the structures illustrated in FIGS. 2A1, 2A2, 2B, 2C1, 2C2, and 2D, FIGS. 7A1, 7A2, 7B, 7C1, and 7C2, and FIGS. 8A1, 8A2, 8B, 8C1, and 8C2 is described with reference to FIGS. 11A1, 11A2, 11B, 11C1, and 11C2. The display device illustrated in FIGS. 11A1, 11A2, 11B, 11C1, and 11C2 includes a pixel having a transistor 430a serving as a driver transistor and a transistor 430b serving as a selection transistor. FIG. 11A1 is a top view of the transistor 430a serving as a driver transistor. FIG. 11A2 is a top view of the transistor 430b serving as a selection transistor. FIG. 11B shows cross-sectional views taken along dashed-dotted line A5-B5 in FIG. 11A1 and dashed-dotted line A6-B6 in FIG. 11A2. FIG. 11C1 is a cross-sectional view taken along dashed-dotted line C5-D5 in FIG. 11A1. FIG. 11C2 is a cross-sectional view taken along dashed-dotted line C6-D6 in FIG. 11A2. Note that in FIGS. 11A1 and 11A2, the substrate, insulating films, and the like are omitted for simplicity.

In the transistor 430a illustrated in FIGS. 11A1, 11B, and 11C1, an electrode 77 connected to one of the pair of electrodes 20a and 20b is provided over the insulating film 15. Unlike the other driver transistors described above, the transistor 430a includes an insulating film 74a, which is isolated from an insulating film 74b, over the oxide semiconductor film 17a and the pair of electrodes 20a and 20b.

In addition, unlike the transistor 400b described above, the transistor 430b illustrated in FIGS. 11A2, 11B, and 11C2 includes the insulating film 74b, which is isolated from the insulating film 74a, over the oxide semiconductor film 17b and the pair of electrodes 20c and 20d.

The transistor 430a illustrated in FIGS. 11A1, 11B, and 11C1 is a channel-etched transistor. The transistor 430a includes the gate electrode 13a provided over the substrate 11, the insulating film 15 formed over the substrate 11 and the gate electrode 13a, the oxide semiconductor film 17a overlapping with the gate electrode 13a with the insulating film 15 provided therebetween, and the pair of electrodes 20a and 20b in contact with the oxide semiconductor film 17a. The transistor 430a also includes an insulating film 74a serving as a gate insulating film, which is composed of an oxide insulating film 71a, an oxide insulating film 72a, and a nitride insulating film 73a and is over the insulating film 15, the oxide semiconductor film 17a, and the pair of electrodes 20a and 20b; and a gate electrode 76 formed over the insulating film 74a and a nitride insulating film 15a. The gate electrode 76 is connected to the gate electrode 13a through an opening portion 75 provided in the nitride insulating film 15a. Furthermore, the electrode 77 connected to one of the pair of electrodes 20a and 20b (here, the electrode 20b) is formed over the insulating film 15. Note that the electrode 77 serves as a pixel electrode.

The transistor 430b illustrated in FIGS. 11A2, 11B, and 11C2 is a channel-etched transistor. The transistor 430b includes the gate electrode 13b provided over the substrate 11, the insulating film 15 formed over the substrate 11 and the gate electrode 13b, the oxide semiconductor film 17b overlapping with the gate electrode 13b with the insulating film 15 provided therebetween, and the pair of electrodes 20c and 20d in contact with the oxide semiconductor film 17b. The transistor 430b also includes an insulating film 74b that is composed of an oxide insulating film 71b, an oxide insulating film 72b, and a nitride insulating film 73b and is over the insulating film 15, the oxide semiconductor film 17b, and the pair of electrodes 20c and 20d.

The insulating film 15 included in the transistors 430a and 430b is formed using the nitride insulating film 15a and an oxide insulating film 15b. The oxide insulating film 15b is formed in a region overlapping with any of the oxide semiconductor film 17a, the pair of electrodes 20a and 20b, the oxide insulating film 71a, the oxide semiconductor film 17b, the pair of electrodes 20c and 20d, and the oxide insulating film 71b.

The insulating films 74a and 74b are isolated from each other and overlap with the oxide semiconductor film 17a and the oxide semiconductor film 17b, respectively. Specifically, in the channel length direction of the transistor 430a illustrated in FIG. 11B, end portions of the insulating film 74a are positioned over the pair of electrodes 20a and 20b, whereas in the channel width direction of the transistor 430a illustrated in FIG. 11C1, end portions of the insulating film 74a are positioned on the outer sides of the oxide semiconductor film 17a. Further, in the channel length direction of the transistor 430b illustrated in FIG. 11B, end portions of the insulating film 74b are positioned over the pair of electrodes 20c and 20d, whereas in the channel width direction of the transistor 430b illustrated in FIG. 11C2, end portions of the insulating film 74b are positioned on outer sides of the oxide semiconductor film 17b.

Furthermore, in the channel width direction in FIG. 11C1, the gate electrode 76 faces the side surfaces of the oxide semiconductor film 17a at side surfaces of the insulating film 74a serving as a gate insulating film. Note that in the channel length direction, the end portions of the insulating film 74a may be positioned over the insulating film 15 instead of over the pair of electrodes 20a and 20b. In such a case, the electrode 77 is formed over the insulating film 74a and is connected to one of the pair of electrodes 20a and 20b through an opening portion in the insulating film 74a.

The transistor 430a has a channel length greater than or equal to 0.5 μm and less than or equal to 4.5 μm, preferably greater than 1 μm and less than or equal to 4 μm, further preferably greater than 1 μm and less than or equal to 3.5 μm, still further preferably greater than 1 μm and less than or equal to 2.5 μm. Furthermore, in the channel width direction of the transistor 430a, the oxide semiconductor film 17a is provided between the gate electrode 13a and the gate electrode 76 with the insulating film 15 provided between the gate electrode 13a and the oxide semiconductor film 17a and with the insulating film 74a provided between the gate electrode 76 and the oxide semiconductor film 17a. In addition, as illustrated in FIG. 11A1, the gate electrode 76 overlaps with the end portions of the oxide semiconductor film 17a with the insulating film 74a provided therebetween, when seen from the above.

Furthermore, the transistor 430b has a longer channel length than the transistor 430a. Thus, the cutoff current of the transistor 430b serving as a selection transistor in the pixel can be reduced.

Note that although FIG. 11C1 illustrates an example where the gate electrode 13a and the gate electrode 76 are connected to each other on an outer side of only one side surface of the oxide semiconductor film 17a in the channel width direction, the gate electrode 13a and the gate electrode 76 may be connected to each other on the outer sides of both side surfaces of the oxide semiconductor film 17a in the channel width direction.

Next, a manufacturing process of the transistors 430a and 430b will be described.

In the manufacturing process of the transistors 430a and 430b, through steps of FIGS. 3A to 3D, FIGS. 4A and 4B, and FIG. 5A, the gate electrodes 13a and 13b, the insulating film 14, the oxide semiconductor films 17a and 17b, the pair of electrodes 20a and 20b, the pair of electrodes 20c and 20d, the oxide insulating film 22, the oxide insulating film 24, and the nitride insulating film 26 are formed over the substrate 11. In the steps, a photolithography process is performed using the first to third photomasks.

Next, after a mask is formed over the nitride insulating film 26 by a photolithography process using a fourth photomask as in the step of FIG. 5B, the oxide insulating film 22, the oxide insulating film 24, and the nitride insulating film 26 are partly etched to form the insulating films 74a and 74b isolated from each other. Note that in the case where the insulating film 14 is a stack including a nitride insulating film and an oxide insulating film, the insulating film 14 is partly etched in the etching of the oxide insulating film 23. As a result, the insulating film 15 including a step formed by the nitride insulating film 15a and the oxide insulating film 15b is formed as illustrated in FIG. 11B.

After that, the gate electrode 76 and the electrode 77 are formed through the process illustrated in FIGS. 6A and 6B.

Through the above process, the transistors 430a and 430b can be manufactured.

Modification Example 4 of Display Device

Figure 9A:
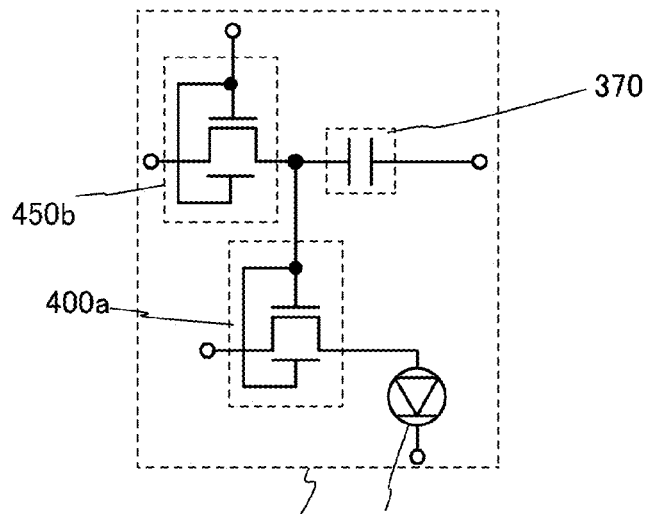
FIGS. 9A to 9D are a circuit diagram, a plan view, and cross-sectional views illustrating a display device.

A display device having a structure that is different from the structures illustrated in FIGS. 2A1, 2A2, 2B, 2C1, 2C2, and 2D, FIGS. 7A1, 7A2, 7B, 7C1, and 7C2, FIGS. 8A1, 8A2, 8B, 8C1, and 8C2, and FIGS. 11A1, 11A2, 11B, 11C1, and 11C2 is described with reference to FIGS. 9A to 9D. FIG. 9A is an equivalent circuit diagram of a pixel 602 included in the display device.

As illustrated in FIG. 9A, the pixel 602 of this modification example includes the light-emitting element 350, the transistor 400a serving as a driver transistor for the light-emitting element 350, a transistor 450b serving as a selection transistor, and the capacitor 370. Each of the transistor 400a and the transistor 450b is what is called a dual-gate transistor including gate electrodes positioned over and below an oxide semiconductor film.

The transistor 400a included in the pixel 602 can have a structure similar to that illustrated in FIGS. 2A1, 2B, 2C1, and 2D.

Figure 9B:
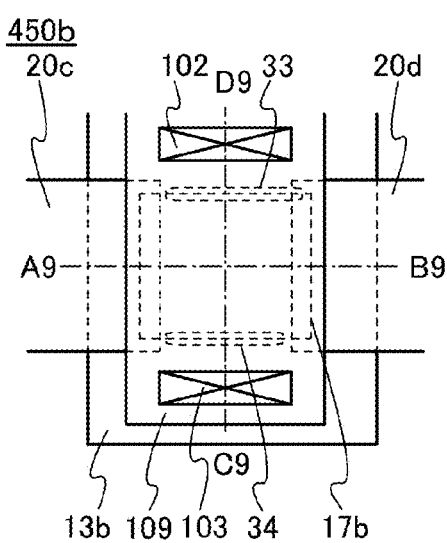
Figure 9C:
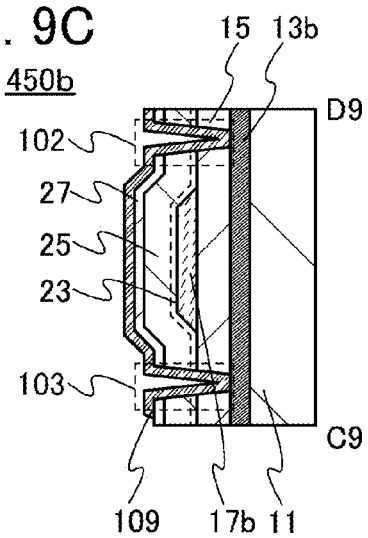
Figure 9D:
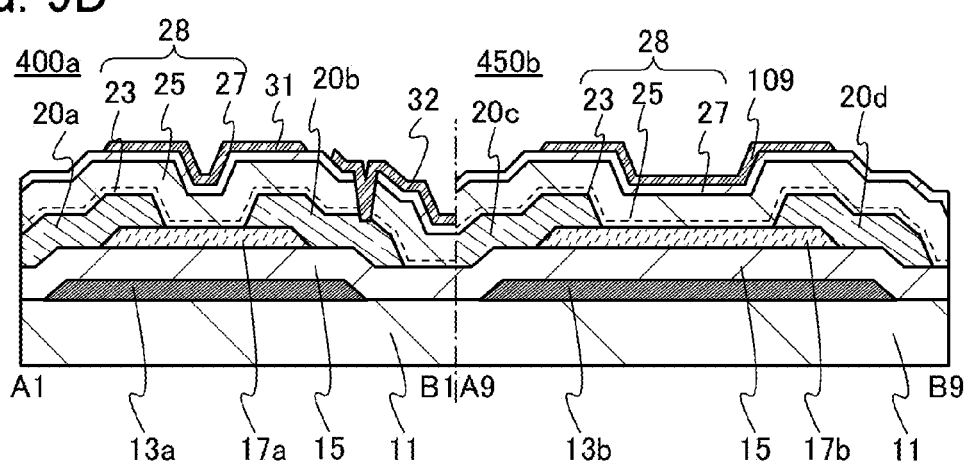

FIG. 9B is a top view of the transistor 450b serving as a selection transistor. FIG. 9C is a cross-sectional view taken along dashed-dotted line C9-D9 in FIG. 9B. FIG. 9D shows cross-sectional views taken along dashed-dotted line A1-B1 of the transistor 400a illustrated in FIG. 2A1 and dashed-dotted line A9-B9 in FIG. 9B. Note that in FIG. 9B, the substrate 11, insulating films, and the like are omitted for simplicity.

The transistor 450b illustrated in FIGS. 9A to 9D includes a gate electrode 109 overlapping with the oxide semiconductor film 17b and the gate electrode 13b over the insulating film 28, unlike the other selection transistors described above.

The transistor 450b illustrated in FIGS. 9A to 9D is a channel-etched transistor. The transistor 450b includes the gate electrode 13b provided over the substrate 11, the insulating film 15 formed over the substrate 11 and the gate electrode 13b, the oxide semiconductor film 17b overlapping with the gate electrode 13b with the insulating film 15 provided therebetween, and the pair of electrodes 20c and 20d in contact with the oxide semiconductor film 17b. The transistor 450b also includes the insulating film 28 serving as a gate insulating film, which is composed of the oxide insulating film 23, the oxide insulating film 25, and the nitride insulating film 27 and is over the insulating film 15, the oxide semiconductor film 17b, and the pair of electrodes 20c and 20d; and the gate electrode 109 formed over the insulating film 28 and the insulating film 15. The gate electrode 109 is connected to the gate electrode 13b through opening portions 102 and 103 provided in the insulating film 15 and the insulating film 28.

The gate electrode 109 included in the transistor 450b is formed using the same layer as the gate electrode 31 included in the transistor 400a.

Further, the channel length of the transistor 450b is longer than at least the channel length of the transistor 400a. Further, in the channel width direction, the oxide semiconductor film 17b is provided between the gate electrode 13b and the gate electrode 109 with the insulating film 15 provided between the gate electrode 13b and the oxide semiconductor film 17b and with the insulating film 28 provided between the gate electrode 109 and the oxide semiconductor film 17b. Furthermore, as illustrated in FIG. 9B, the gate electrode 109 overlaps with the end portions of the oxide semiconductor film 17b with the insulating film 28 provided therebetween, when seen from the above.

In each of the transistors 400a and 450b, defects might be formed at the end portion of the oxide semiconductor film processed into an island shape by etching or the like because of damage due to the processing, and the end portion of the oxide semiconductor film is polluted by attachment of impurities or the like. For this reason, in the case where one gate electrode is formed either over or below an oxide semiconductor film in a transistor, even when the oxide semiconductor film is intrinsic or substantially intrinsic, end portions of the oxide semiconductor film are easily activated to be n-type (low-resistance regions) by application of stress such as an electric field. In the case where the n-type end portions overlap with regions between the pair of electrodes 20c and 20d, which are surrounded by the dashed lines 33 and 34 in FIG. 9B, for example, the n-type regions serve as carrier paths, resulting in formation of a parasitic channel. As a result, drain current with respect to the threshold voltage is gradually increased, so that the threshold voltage of the transistor shifts in the negative direction.

However, the transistor 450b illustrated in FIGS. 9A to 9D includes the gate electrode 13b and the gate electrode 109 having the same potentials and the gate electrode 109 faces the side surfaces of the oxide semiconductor film 17b in the channel width direction at the side surfaces of the insulating film 28, whereby an electric field from the gate electrode 109 affects the oxide semiconductor film 17b also from the side surfaces of the oxide semiconductor film 17b. As a result, a parasitic channel is prevented from being generated at the side surface of the oxide semiconductor film 17b or the end portion including the side surface and its vicinity. Thus, the transistor 450b can have favorable electrical characteristics of a sharp increase in drain current with respect to the threshold voltage. Note that the above descriptions can be also used for the gate electrode 13a, the gate electrode 31, and the oxide semiconductor film 17a included in the transistor 400a.

Although the above-described structures of the display device of this embodiment and the display devices of the modification examples are partly different from each other, the structures can be freely combined with each other.

The structures, methods, and the like described in this embodiment can be used as appropriate in combination with any of the structures, methods, and the like described in other embodiments.

Embodiment 2

In this embodiment, a display device and a manufacturing method thereof, which are different from those in Embodiment 1, will be described with reference to drawings. In this embodiment, a transistor in which oxygen vacancies contained in an oxide semiconductor film are further reduced will be described with reference to FIGS. 12A1, 12A2, 12B, 12C1, and 12C2, FIGS. 13A and 13B, FIGS. 14A and 14B, and FIGS. 15A and 15B.

FIGS. 12A1, 12A2, 12B, 12C1, and 12C2 are top views and cross-sectional views of transistors included in a pixel of the display device of this embodiment.

The display device of this embodiment includes a pixel having a transistor 440a serving as a driver transistor and a transistor 440b serving as a selection transistor. FIG. 12A1 is a top view of the transistor 440a serving as a driver transistor. FIG. 12A2 is a top view of the transistor 440b serving as a selection transistor. FIG. 12B shows cross-sectional views taken along dashed-dotted line A7-B7 in FIG. 12A1 and dashed-dotted line A8-B8 in FIG. 12A2. FIG. 12C1 is a cross-sectional view taken along dashed-dotted line C7-D7 in FIG. 12A1. FIG. 12C2 is a cross-sectional view taken along dashed-dotted line C8-D8 in FIG. 12A2. Note that in FIGS. 12A1 and 12A2, the substrate 11, insulating films, and the like are omitted for simplicity.

The transistor 440a illustrated in FIGS. 12A1, 12B, and 12C1 is a channel-etched transistor. The transistor 440a includes the gate electrode 13a provided over the substrate 11, the insulating film 15 formed over the substrate 11 and the gate electrode 13a, the oxide semiconductor film 17a overlapping with the gate electrode 13a with the insulating film 15 provided therebetween, and the pair of electrodes 20a and 20b in contact with the oxide semiconductor film 17a. The transistor 440a includes, over the insulating film 15, the oxide semiconductor film 17a, and the pair of electrodes 20a and 20b, an insulating film 88a that is composed of an oxide insulating film 83a, an oxide insulating film 85a, and a nitride insulating film 87, and a gate electrode 91 formed over the insulating film 88a. The gate electrode 91 is connected to the gate electrode 13a through an opening portion 96 provided in the insulating film 15 and the nitride insulating film 87. Furthermore, an electrode 92 connected to one of the pair of electrodes 20a and 20b (here, the electrode 20b) is formed over the nitride insulating film 87. The electrode 92 is connected to the electrode 20b through an opening portion 95 provided in the nitride insulating film 87. Note that the electrode 92 serves as a pixel electrode.

The transistor 440b illustrated in FIGS. 12A2, 12B, and 12C2 is a channel-etched transistor. The transistor 440b includes a gate electrode 13b provided over the substrate 11, the insulating film 15 formed over the substrate 11 and the gate electrode 13b, an oxide semiconductor film 17b overlapping with the gate electrode 13b with the insulating film 15 provided therebetween, and a pair of electrodes 20c and 20d in contact with the oxide semiconductor film 17b. The transistor 440b also includes an insulating film 88b that is composed of an oxide insulating film 83b, an oxide insulating film 85b, and the nitride insulating film 87 and is over the insulating film 15, the oxide semiconductor film 17b, and the pair of electrodes 20c and 20d.

In the transistor 440a, the insulating film 15 and the insulating film 88a each serve as a gate insulating film. Further, in the transistor 440b, the insulating film 15 serves as a gate insulating film. The insulating film 15 includes the nitride insulating film 15a and the oxide insulating film 15b. The oxide insulating film 15b is formed in a region overlapping with any of the oxide semiconductor films 17a and 17b, the pair of electrodes 20a and 20b, the pair of electrodes 20c and 20d, and the oxide insulating film 83a.

Note that in the transistor 440b, a second gate electrode may be provided in a region which is over the insulating film 88b and which overlaps with the gate electrode 13b and the oxide semiconductor film 17b. In that case, the second gate electrode is preferably connected to the gate electrode 13b through an opening portion provided in the insulating film 15 and the nitride insulating film 87.

In this embodiment, the nitride insulating film 15a is formed using a silicon nitride film. For the oxide insulating film 15b, any of the oxides listed for the insulating film 15 in Embodiment 1 can be used as appropriate. The nitride insulating film 15a and the oxide insulating film 15b each can be formed by any of the listed methods for forming the insulating film 14 as appropriate. The oxide insulating films 83a and 83b can be formed using a material and a formation method similar to those of the oxide insulating film 23 described in Embodiment 1, as appropriate. The oxide insulating films 85a and 85b can be formed using a material and a formation method similar to those of the oxide insulating film 25 described in Embodiment 1, as appropriate. The nitride insulating film 87 can be formed using a material and a formation method similar to those of the nitride insulating film 27 described in Embodiment 1, as appropriate. The gate electrode 91 and the electrode 92 can be formed using a material and a formation method similar to those of the gate electrode 31 and the electrode 32 described in Embodiment 1, as appropriate.

The oxide insulating films 83a and 85a are isolated from the oxide insulating films 83b and 85b. Further, the oxide insulating films 83a and 85a overlap with the oxide semiconductor film 17a and the oxide insulating films 83b and 85b overlap with the oxide semiconductor film 17b. Specifically, in the cross-sectional view in the channel length direction of the transistor 440a illustrated in FIG. 12B, end portions of the oxide insulating films 83a and 85a are positioned over the pair of electrodes 20a and 20b, whereas in the cross-sectional view in the channel width direction of the transistor 440a illustrated in FIG. 12C1, end portions of the oxide insulating films 83a and 85a are positioned on the outer sides of the side surfaces of the oxide semiconductor film 17a. Similarly, in the cross-sectional view in the channel length direction of the transistor 440b illustrated in FIG. 12B, end portions of the oxide insulating films 83b and 85b are positioned over the pair of electrodes 20c and 20d, whereas in the cross-sectional view in the channel width direction of the transistor 440b illustrated in FIG. 12C2, end portions of the oxide insulating films 83b and 85b are positioned on the outer sides of the side surfaces of the oxide semiconductor film 17b.

The nitride insulating film 87 is formed so as to cover the top surfaces and side surfaces of the oxide insulating films 83a, 83b, 85a, and 85b, and is in contact with the nitride insulating film 15a.

Note that in the channel length direction of the transistor 440a, the end portions of the oxide insulating films 83a and 85a may be positioned over the nitride insulating film 15a instead of over the pair of electrodes 20a and 20b. Further, in the channel length direction of the transistor 440b, the end portions of the oxide insulating films 83b and 85b may be positioned over the nitride insulating film 15a instead of over the pair of electrodes 20c and 20d.

In the cross-sectional view of the transistor 440a in the channel width direction illustrated in FIG. 12C1, the gate electrode 91 faces the side surfaces of the oxide semiconductor film 17a with side surfaces of the oxide insulating films 83a and 85a positioned therebetween.

The transistor 440a of this embodiment has a channel length greater than or equal to 0.5 μm and less than or equal to 4.5 μm, preferably greater than 1 μm and less than or equal to 4 μm, further preferably greater than 1 μm and less than or equal to 3.5 μm, still further preferably greater than 1 μm and less than or equal to 2.5 μm. Further, in the channel width direction of the transistor 440a, the oxide semiconductor film 17a is provided between the gate electrode 13a and the gate electrode 91 with the insulating film 15 provided between the gate electrode 13a and the oxide semiconductor film 17a and with the insulating film 88a provided between the gate electrode 91 and the oxide semiconductor film 17a. Furthermore, as illustrated in FIG. 12A1, the gate electrode 91 overlaps with end portions of the oxide semiconductor film 17a with the insulating film 88a provided therebetween, when seen from the above.

Further, the transistor 440b has a longer channel length than the transistor 440a. Thus, the cutoff current of the transistor 440b serving as a selection transistor in the pixel can be reduced.

In the channel width direction of the transistor 440a, as illustrated in FIG. 12C1, the opening portion 96 is provided in the insulating film 15 and the nitride insulating film 87 on an outer side of one side surface of the oxide semiconductor film 17a. In the opening portion 96, the gate electrode 91 is connected to the gate electrode 13a. The gate electrode 91 faces the side surface of the oxide semiconductor film 17a in the channel width direction at the side surfaces of the oxide insulating films 83a and 85a. The gate electrode 91 and the gate electrode 13a are not connected to each other on an outer side of the other side surface of the oxide semiconductor film 17a in the channel width direction. End portions of the gate electrode 91 are positioned on outer sides of the side surfaces of the oxide semiconductor film 17a.

Note that although the transistor 440a has a structure in which the gate electrode 13a and the gate electrode 91 are connected to each other on an outer side of only one side surface of the oxide semiconductor film 17a in the channel width direction as illustrated in FIG. 12C1, the gate electrode 13a and the gate electrode 91 may be connected to each other on the outer sides of both side surfaces of the oxide semiconductor film 17a in the channel width direction.

In the transistor 440a or the transistor 440b described in this embodiment, the oxide semiconductor film 17a and the oxide insulating film 85a, or the oxide semiconductor film 17b and the oxide insulating film 85b are surrounded by the nitride insulating film 15a and the nitride insulating film 87. The nitride insulating film 15a and the nitride insulating film 87 each have a small oxygen diffusion coefficient and have a barrier property against oxygen. Thus, part of oxygen contained in the oxide insulating films 85a and 85b can be moved to the oxide semiconductor films 17a and 17b, so that the amount of oxygen vacancies in the oxide semiconductor films 17a and 17b can be reduced. In addition, the nitride insulating film 15a and the nitride insulating film 87 each have a small diffusion coefficient of water, hydrogen, and the like and have a barrier property against water, hydrogen, and the like, which can prevent diffusion of water, hydrogen, and the like from the outside into the oxide semiconductor films 17a and 17b. For these reason, the transistor 440a and the transistor 440b have high reliability.

Next, a manufacturing process of the display device of this embodiment including the transistors 440a and 440b will be described with reference to FIGS. 13A and 13B, FIGS. 14A and 14B, and FIGS. 15A and 15B.

In each of FIGS. 13A and 13B, FIGS. 14A and 14B, and FIGS. 15A and 15B, a cross-sectional view in the channel length direction along line A7-B7 and a cross-sectional view in the channel width direction along line C7-D7 are used for describing a method for manufacturing the transistor 440a, and a cross-sectional view in the channel length direction along line A8-B8 is used for describing a method for manufacturing the transistor 440b.

Note that the cross-sectional view of the transistor 440b in the channel width direction is similar to that of the transistor 440a except that the gate electrode 91 which is in contact with the gate electrode 13a in the opening portion 96 is not included.

In the manufacturing process of the transistors 440a and 440b, the gate electrodes 13a and 13b, the nitride insulating film 15a, the oxide insulating film 14b, the oxide semiconductor films 17a and 17b, the pair of electrodes 20a and 20b, and the pair of electrodes 20c and 20d are formed over the substrate 11 through steps similar to those in FIGS. 3A to 3D and FIGS. 4A and 4B. In the steps, a photolithography process is performed using the first to third photomasks.

Then, the oxide insulating film 22 and the oxide insulating film 24 are formed as illustrated in FIG. 13A. Subsequently, oxygen contained in the oxide insulating film 24 is partly transferred to the oxide semiconductor film 17a and the oxide semiconductor film 17b by heat treatment. This heat treatment can reduce the amount of oxygen vacancies contained in the oxide semiconductor films 17a and 17b.

Next, a mask is formed over the oxide insulating film 24 by a photolithography process using a fourth photomask and then, the oxide insulating film 22 and the oxide insulating film 24 are partly etched to form the oxide insulating films 83a and 85a, and the oxide insulating films 83b and 85b which are isolated from each other. Note that the oxide insulating film 14b is partly etched in the etching of the oxide insulating film 24, whereby the oxide insulating film 15b is formed. As a result, the nitride insulating film 15a is exposed as illustrated in FIG. 13B. In other words, the insulating film 15 including a step is formed.

After that, a nitride insulating film 86 illustrated in FIG. 14A is formed. In this step, in the cross-sectional view of the transistor 440a along line C7-D7 in the channel width direction, the nitride insulating film 15a and the nitride insulating film 86 are in contact with each other. That is, the oxide semiconductor film 17a and the oxide insulating film 85a are surrounded by the nitride insulating film 15a and the nitride insulating film 86.

Although not illustrated in the drawings, when the nitride insulating film 86 is formed, also in the cross-sectional view of the transistor 440b in the channel width direction, the oxide semiconductor film 17b and the oxide insulating film 85b are surrounded by the nitride insulating film 15a and the nitride insulating film 86.

Next, after a mask is formed over the nitride insulating film 86 by a photolithography process using a fifth photomask, the nitride insulating film 86 is partly etched to form the opening portion 95. Further, the nitride insulating film 15a and the nitride insulating film 86 are partly etched to form the opening portion 96 (see FIG. 14B).

After that, a conductive film 90 to be the gate electrode 91 and the electrode 92 of the transistor 440a is formed as illustrated in FIG. 15A. The conductive film 90 can be formed in a manner similar to that of the conductive film 30 described in Embodiment 1.

Then, a mask is formed over the conductive film 90 by a photolithography process using a sixth photomask. Next, the conductive film 90 is partly etched using the mask to form the gate electrode 91 and the electrode 92. After that, the mask is removed (see FIG. 15B).

Note that as illustrated in FIG. 15B, in the cross-sectional view of the transistor 440a in the channel width direction, the gate electrode 91 is formed so as to face the side surfaces of the oxide semiconductor film 17a at the side surfaces of the oxide insulating film 83a and the oxide insulating film 85a.

After that, heat treatment may be performed. The oxide insulating films 85a and 85b are each formed using an oxide insulating film containing oxygen at higher proportion than the stoichiometric composition. Further, the nitride insulating film 15a and the nitride insulating film 87 each have a high barrier property against oxygen. Accordingly, the heat treatment can reduce diffusion of oxygen contained in the oxide insulating films 85a and 85b to the outside. In addition, diffusion of oxygen contained in the oxide semiconductor films 17a and 17b to the outside can be also reduced. As a result, oxygen vacancies in the oxide semiconductor films 17a and 17b can be reduced. Further, the nitride insulating film 15a and the nitride insulating film 87 each have a high bather property against hydrogen, water, and the like, which can prevent diffusion of hydrogen, water, and the like from the outside into the oxide semiconductor films 17a and 17b. Thus, hydrogen, water, and the like in the oxide semiconductor films 17a and 17b can be reduced. As a result, the highly reliable transistor 440a and the highly reliable transistor 440b can be manufactured.

Through the above process, the display device including the transistor 440a and the transistor 440b can be manufactured.

The structures, methods, and the like described in this embodiment can be used as appropriate in combination with any of the structures, methods, and the like described in other embodiments.

Embodiment 3

In each of the selection transistors and driver transistors described in Embodiments 1 and 2, a base insulating film can be provided between the substrate 11 and the gate electrode 13a and between the substrate 11 and the gate electrode 13b as necessary. For the base insulating film, silicon oxide, silicon oxynitride, silicon nitride, silicon nitride oxide, gallium oxide, hafnium oxide, yttrium oxide, aluminum oxide, aluminum oxynitride, and the like can be used, for example. Note that when silicon nitride, gallium oxide, hafnium oxide, yttrium oxide, aluminum oxide, or the like is used for the base insulating film, it is possible to suppress diffusion of impurities such as alkali metal, water, and hydrogen from the substrate 11 into the oxide semiconductor films 17a and 17b.

The base insulating film can be formed by a sputtering method, a CVD method, or the like.

Note that the structures, methods, and the like described in this embodiment can be used as appropriate in combination with any of the structures, methods, and the like described in the other embodiments.

Embodiment 4

Figure 19:
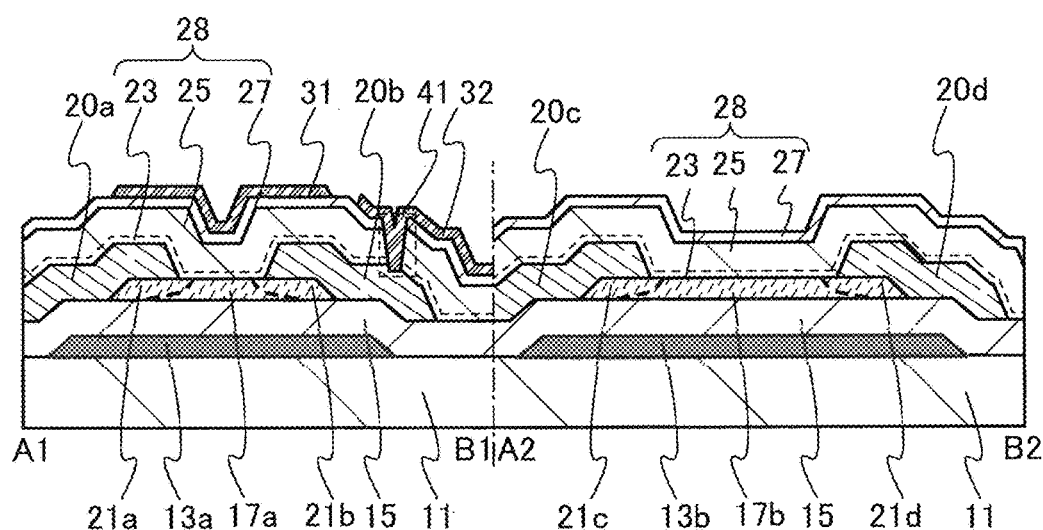
FIG. 19 is a cross-sectional view illustrating one embodiment of a display device.

In this embodiment, a display device in which the oxide semiconductor film 17a, the pair of electrodes 20a and 20b, the oxide semiconductor film 17b, and the pair of electrodes 20c and 20d are different from those in the transistor 400a and the transistor 400b illustrated in FIGS. 2A1, 2A2, 2B, 2C1, 2C2, and 2D will be described with reference to FIG. 19. Note that this embodiment can be applied to other transistors as appropriate.

As for the pair of electrodes provided in the transistor, it is possible to use a conductive material which is easily bonded to oxygen, such as tungsten, titanium, aluminum, copper, molybdenum, chromium, or tantalum, or an alloy thereof. Thus, oxygen contained in the oxide semiconductor films 17a and 17b and the conductive material contained in the electrodes 20a to 20d are bonded to each other, so that an oxygen deficient region is formed in the oxide semiconductor films 17a and 17b. Furthermore, in some cases, part of constituent elements of the conductive material that forms the electrodes 20a to 20d is mixed into the oxide semiconductor films 17a and 17b. Consequently, as shown in FIG. 19, low-resistance regions 21a to 21d are formed in the vicinity of regions of the oxide semiconductor films 17a and 17b which are in contact with the electrodes 20a to 20d. Specifically, the low-resistance region 21a is in contact with the electrode 20a and is formed between the insulating film 15 and the electrode 20a, whereas the low-resistance region 21b is in contact with the electrode 20b and is formed between the insulating film 15 and the electrode 20b. In addition, the low-resistance region 21c is in contact with the electrode 20c and is formed between the insulating film 15 and the electrode 20c, whereas the low-resistance region 21d is in contact with the electrode 20d and is formed between the insulating film 15 and the electrode 20d.

Since the low-resistance regions 21a to 21d have high conductivity, contact resistance between the oxide semiconductor films 17a and 17b and the electrodes 20a to 20d can be reduced, and thus, the on-state current of the transistor can be increased.

Note that end portions of the low-resistance regions 21a and 21b may be substantially aligned with the end portions of the pair of electrodes 20a and 20b. Alternatively, as illustrated in FIG. 19, the end portions of the low-resistance regions 21a and 21b may overlap with a region between the end portions of the pair of electrodes 20a and 20b. Similarly, end portions of the low-resistance regions 21c and 21d may be substantially aligned with the end portions of the pair of electrodes 20c and 20d. Alternatively, as illustrated in FIG. 19, the end portions of the low-resistance regions 21c and 21d may overlap with a region between the end portions of the pair of electrodes 20c and 20d. In the case where the low-resistance regions 21a to 21d are formed in the oxide semiconductor films 17a and 17b, a channel length is the distance between the low-resistance regions at the interface between the insulating film 28 and each of the oxide semiconductor films.

Furthermore, the electrodes 20a to 20d may each have a stacked-layer structure including the conductive material which is easily bonded to oxygen and a conductive material which is not easily bonded to oxygen, such as titanium nitride, tantalum nitride, or ruthenium. With such a stacked-layer structure, oxidization of the electrodes 20a to 20d can be prevented at the interface between the oxide insulating film 23 and the electrodes 20a to 20d, so that an increase in the resistance of the electrodes 20a to 20d can be inhibited.

Note that the structures, methods, and the like described in this embodiment can be used as appropriate in combination with any of the structures, methods, and the like described in the other embodiments.

Embodiment 5

In this embodiment, a display device including a transistor in which the number of defects in an oxide semiconductor film can be further reduced as compared to Embodiments 1 to 4 is described with reference to drawings. The transistor described in this embodiment is different from any of the transistors in Embodiments 1 to 4 in that a multilayer film including a plurality of oxide semiconductor films is provided.

FIGS. 20A1, 20A2, 20B, 20C1, and 20C2 are top views and cross-sectional views of a transistor 105a and a transistor 105b included in the display device. The transistor 105a serves as a driver transistor for a light-emitting element included in a pixel. Further, the transistor 105b serves as a selection transistor of the pixel.

FIG. 20A1 is a top view of the transistor 105a and FIG. 20A2 is a top view of the transistor 105b. FIG. 20B shows cross-sectional views taken along dashed-dotted line A10-B10 in FIG. 20A1 and dashed-dotted line A11-B11 in FIG. 20A2. FIG. 20C1 is a cross-sectional view taken along dashed-dotted line C10-D10 in FIG. 20A1. FIG. 20C2 is a cross-sectional view taken along dashed-dotted line C11-D11 in FIG. 20A2. Note that in FIGS. 20A1 and 20A2, the substrate 11, insulating films, and the like are omitted for simplicity.

Unlike the transistor 400a and the transistor 400b included in the display device illustrated in FIGS. 2A1, 2A2, 2B, 2C1, 2C2, and 2D, the transistor 105a and the transistor 105b included in the display device illustrated in FIGS. 20A1, 20A2, 20B, 20C1, and 20C2 include a multilayer film 98a and a multilayer film 98b, respectively, between the insulating film 15 and the insulating film 28. The other components are similar to those in FIGS. 2A1, 2A2, 2B, 2C1, 2C2, and 2D; thus, the above description can be referred to.

In the transistor 105a described in this embodiment, the multilayer film 98a includes the oxide semiconductor film 17a and an oxide semiconductor film 97a. Furthermore, in the transistor 105b, the multilayer film 98b includes the oxide semiconductor film 17b and an oxide semiconductor film 97b. That is, each of the multilayer film 98a and the multilayer film 98b has a two-layer structure.

In the transistor 105a, part of the oxide semiconductor film 17a serves as a channel region, and in the transistor 105b, part of the oxide semiconductor film 17b serves as a channel region. Further, the oxide insulating film 23 is formed in contact with the multilayer film 98a and the multilayer film 98b, and the oxide insulating film 25 is formed in contact with the oxide insulating film 23. In other words, the oxide semiconductor film 97a is provided between the oxide semiconductor film 17a and the oxide insulating film 23, and the oxide semiconductor film 97b is provided between the oxide semiconductor film 17b and the oxide insulating film 23.

The oxide semiconductor films 97a and 97b contain one or more elements that form the oxide semiconductor films 17a and 17b. Thus, interface scattering is unlikely to occur at the interface between the oxide semiconductor films 17a and 97a and the interface between the oxide semiconductor films 17b and 97b. Thus, the transistor can have high field-effect mobility because the movement of carriers is not hindered at the interfaces.

An oxide semiconductor film (hereinafter, an oxide semiconductor film 97) used for the oxide semiconductor films 97a and 97b is formed using a metal oxide containing at least In or Zn. Typical examples of the metal oxide include an In—Ga oxide, an In—Zn oxide, and an In-M-Zn oxide (M represents Al, Ga, Y, Zr, La, Ce, or Nd). The conduction band minimum of the oxide semiconductor film 97 is closer to a vacuum level than that of an oxide semiconductor film (hereinafter, the oxide semiconductor film 17) that is used for the oxide semiconductor films 17a and 17b is; as a typical example, the difference between the conduction band minimum of the oxide semiconductor film 97 and the conduction band minimum of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 97 and the electron affinity of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 97 preferably contains In because carrier mobility (electron mobility) can be increased.

When the oxide semiconductor film 97 contains a larger amount of Al, Ga, Y, Zr, La, Ce, or Nd than the amount of In in an atomic ratio, any of the following effects may be obtained: (1) the energy gap of the oxide semiconductor film 97 is widened; (2) the electron affinity of the oxide semiconductor film 97 decreases; (3) impurity diffusion from the outside is suppressed; and (4) an insulating property of the oxide semiconductor film 97 increases as compared to that of the oxide semiconductor film 17.

Furthermore, an oxygen vacancy is less likely to be generated in the oxide semiconductor film 97 containing a larger amount of, Ga, Y, Zr, La, Ce, or Nd in an atomic ratio than the amount of In in an atomic ratio because, Ga, Y, Zr, La, Ce, or Nd is a metal element that is strongly bonded to oxygen.

In the case where the oxide semiconductor film 97 is an In-M-Zn oxide film, the proportion of In and the proportion of M, not taking Zn and O into consideration, are less than 50 atomic % and greater than or equal to 50 atomic %, respectively, and preferably less than 25 atomic % and greater than or equal to 75 atomic %, respectively.

Furthermore, in the case where each of the oxide semiconductor films 17 and 97 contains an In-M-Zn oxide (M represents Ga, Y, Zr, La, Ce, or Nd), the proportion of M atoms (M represents Ga, Y, Zr, La, Ce, or Nd) in the oxide semiconductor film 97 is higher than that in the oxide semiconductor film 17. As a typical example, the proportion of M in the oxide semiconductor film 17 is 1.5 or more times, preferably twice or more, further preferably three or more times as high as that in the oxide semiconductor film 17.

Furthermore, in the case where each of the oxide semiconductor films 17 and 97 contains an In-M-Zn oxide (M represents Al, Ga, Y, Zr, La, Ce, or Nd), when In:M:Zn=$x_1$:$y_1$:$z_1$ [atomic ratio] is satisfied in the oxide semiconductor film 97 and In:M:Zn=$x_2$:$y_2$:$z_2$ [atomic ratio] is satisfied in the oxide semiconductor film 17, $y_1/x_1$ is higher than $y_2/x_2$, and preferably, $y_1/x_1$ be 1.5 or more times as high as $y_2/x_2$. Alternatively, $y_1/x_1$ is preferably twice or more as high as $y_2/x_2$. Further alternatively, $y_1/x_1$ is preferably three or more times as high as $y_2/x_2$. In this case, it is preferable that in the oxide semiconductor film, $y_2$ be higher than or equal to $x_2$ because a transistor including the oxide semiconductor film can have stable electrical characteristics. However, when $y_2$ is 3 times or more as large as $x_2$, the field-effect mobility of the transistor including the oxide semiconductor film is reduced; accordingly, $y_z$ is preferably less than 3 times $x_2$.

In the case where the oxide semiconductor film 17 contains an In-M-Zn oxide (M is Ga, Y, Zr, La, Ce, or Nd) and a target having the atomic ratio of metal elements of In:M:Zn=$x_1$:$y_1$:$z_1$ is used for forming the oxide semiconductor film 17, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 17 is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 97 contains an In-M-Zn oxide (M is Ga, Y, Zr, La, Ce, or Nd) and a target having the atomic ratio of metal elements of In:M:Zn=$x_2$:$y_2$:$z_2$ is used for forming the oxide semiconductor film 97, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 97 is easily formed. Typical examples of the atomic ratio of the metal elements of the target are In:M:Zn=1:3:2, In:M:Zn=1:3:4, In:M:Zn=1:3:6, In:M:Zn=1:3:8, and the like.

Note that the proportion of each metal element in the atomic ratio of each of the oxide semiconductor films 17 and the oxide semiconductor film 97 varies within a range of ±40% of that in the above atomic ratio as an error.

The oxide semiconductor films 97a and 97b can relieve damage to the oxide semiconductor films 17a and 17b at the time of forming the oxide insulating film 25 later. Thus, the oxide insulating film 25 may be formed over the oxide semiconductor films 97a and 97b without the oxide insulating film 23.

The thickness of each of the oxide semiconductor films 97a and 97b is greater than or equal to 3 nm and less than or equal to 100 nm, preferably greater than or equal to 3 nm and less than or equal to 50 nm.

The oxide semiconductor films 97a and 97b may each have a non-single-crystal structure, for example, like the oxide semiconductor films 17a and 17b. The non-single crystal structure includes a c-axis aligned crystalline oxide semiconductor (CAAC-OS) that is described later, a polycrystalline structure, a microcrystalline structure described later, or an amorphous structure, for example.

The oxide semiconductor films 97a and 97b may each have an amorphous structure, for example. An amorphous oxide semiconductor film, for example, has disordered atomic arrangement and no crystalline component. Alternatively, an amorphous oxide film is, for example, absolutely amorphous and has no crystal part.

Note that the oxide semiconductor films 17 and 97 may each be a mixed film including two or more of a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

In this case, the oxide semiconductor film 97a is provided between the oxide semiconductor film 17a and the oxide insulating film 23, and the oxide semiconductor film 97b is provided between the oxide semiconductor film 17b and the oxide insulating film 23. Thus, if trap states are generated between the oxide insulating film 23 and each of the oxide semiconductor films 97a and 97b by impurities and defects, electrons flowing in the oxide semiconductor films 17a and 17b are less likely to be captured by the trap states because there is a distance between the region where the trap states are generated and the oxide semiconductor film 17a or the oxide semiconductor film 17b. Accordingly, the amount of on-state current of the transistor can be increased, and the field-effect mobility can be increased. When the electrons are captured by the trap states, the electrons become negative fixed charges. As a result, the threshold voltage of the transistor varies. However, by the distance between the region where the trap states are generated and the oxide semiconductor film 17a or the oxide semiconductor film 17b, capture of the electrons by the trap states can be reduced, and accordingly fluctuations of the threshold voltage of each of the transistors 105a and 105b can be reduced.

The oxide semiconductor films 97a and 97b can block impurities from the outside, and accordingly, the amount of impurities that are transferred from the outside to the oxide semiconductor films 17a and 17b can be reduced. Furthermore, an oxygen vacancy is less likely to be formed in the oxide semiconductor films 97a and 97b. Consequently, the impurity concentration and the number of oxygen vacancies in the oxide semiconductor films 17a and 17b can be reduced.

Note that the oxide semiconductor films 17 and 97 are not formed by simply stacking each film, but are formed to form a continuous junction (here, in particular, a structure in which the conduction band minimum is changed continuously between each film). In other words, a stacked-layer structure in which there exists no impurity that forms a defect level such as a trap center or a recombination center at each interface is provided. If an impurity exists between the oxide semiconductor films 17 and 97 that are stacked, a continuity of the energy band is damaged, and the carrier is captured or recombined at the interface and then disappears.

In order to form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to 1×10$^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

Figure 21:
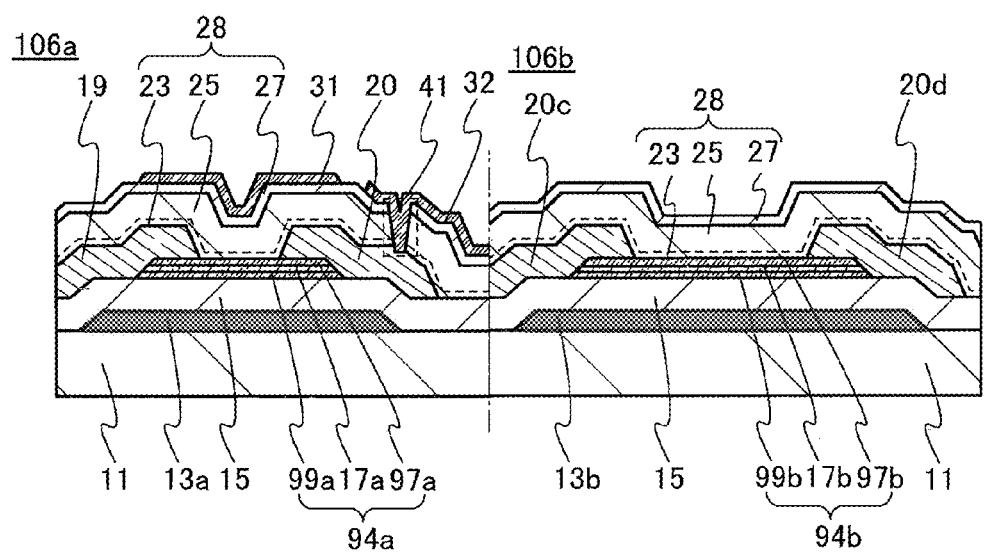
FIG. 21 is a cross-sectional view illustrating one embodiment of a display device.

Note that as in a transistor 106a and a transistor 106b illustrated in FIG. 21, multilayer films 94a and 94b may be included instead of the multilayer films 98a and 98b. The transistor 106a serves as a driver transistor in a pixel, and the transistor 106b serves as a selection transistor of the pixel.

An oxide semiconductor film 99a, the oxide semiconductor film 17a, and the oxide semiconductor film 97a are stacked in this order in the multilayer film 94a. Further, an oxide semiconductor film 99b, the oxide semiconductor film 17b, and the oxide semiconductor film 97b are stacked in this order in the multilayer film 94b. That is, the multilayer film 94a and the multilayer film 94b each have a three-layer structure. Note that the multilayer film 94a and the multilayer film 94b are formed in the same process. In the transistor 106a, the oxide semiconductor film 17a serves as a channel region, and in the transistor 106b, the oxide semiconductor film 17b serves as a channel region.

In the transistor 106a and the transistor 106b, the insulating film 15 is in contact with the oxide semiconductor film 99a and the oxide semiconductor film 99b. In other words, the oxide semiconductor film 99a or the oxide semiconductor film 99b is provided between the insulating film 15 and the oxide semiconductor film 17a or the oxide semiconductor film 17b.

Furthermore, the oxide semiconductor films 97a and 97b are in contact with the oxide insulating film 23. That is, the oxide semiconductor film 97a is provided between the oxide semiconductor film 17a and the oxide insulating film 23, and the oxide semiconductor film 97b is provided between the oxide semiconductor film 17b and the oxide insulating film 23.

An oxide semiconductor film (hereinafter, an oxide semiconductor film 99) used for the oxide semiconductor films 99a and 99b can be formed using a material and a formation method similar to those of the oxide semiconductor film 97.

It is preferable that the thicknesses of the oxide semiconductor films 99a and 99b be smaller than those of the oxide semiconductor films 17a and 17b. When the thickness of each of the oxide semiconductor films 99a and 99b is greater than or equal to 1 nm and less than or equal to 5 nm, preferably greater than or equal to 1 nm and less than or equal to 3 nm, the amount of change in the threshold voltage of the transistor can be reduced.

Note that as in the transistors 105a and 105b, the oxide semiconductor films 97a and 97b included in the transistors 106a and 106b also serve as films that relieve damage to the oxide semiconductor films 17a and 17b at the time of forming the oxide insulating film 25 later. Thus, the oxide insulating film 25 may be formed over the oxide semiconductor films 97a and 97b without the oxide insulating film 23.

In the transistors described in this embodiment, the oxide semiconductor film 97a and the oxide semiconductor film 97b are provided between the oxide insulating film 23 and the oxide semiconductor film 17a and between the oxide insulating film 23 and the oxide semiconductor film 17b. A channel is formed in each of the oxide semiconductor films 17a and 17b. Thus, if trap states are generated in the region between the oxide insulating film 23 and each of the oxide semiconductor films 97a and 97b by impurities and defects, electrons flowing in the oxide semiconductor films 17a and 17b are less likely to be captured by the trap states because there is a distance between the region where the trap states are generated and the oxide semiconductor film 17a or the oxide semiconductor film 17b. Accordingly, the amount of on-state current of the transistor can be increased, and the field-effect mobility can be increased. When the electrons are captured by the trap states, the electrons become negative fixed charges. As a result, the threshold voltage of the transistor varies. However, by the distance between the region where the trap states are generated and the oxide semiconductor film 17a or the oxide semiconductor film 17b, the number of electrons captured by the trap states can be reduced, and accordingly, fluctuations of the threshold voltage can be reduced.

The oxide semiconductor films 97a and 97b block entry of impurities from the outside, and accordingly, the amount of impurities that enter the oxide semiconductor films 17a and 17b from the outside can be reduced. Furthermore, an oxygen vacancy is less likely to be formed in the oxide semiconductor films 97a and 97b. Consequently, the impurity concentration and the number of oxygen vacancies in the oxide semiconductor films 17a and 17b in the transistor described in this embodiment can be reduced.

The oxide semiconductor film 99a and the oxide semiconductor film 99b are provided between the insulating film 15 and the oxide semiconductor film 17a and between the insulating film 15 and the oxide semiconductor film 17b, respectively. Further, the oxide semiconductor film 97a and the oxide semiconductor film 97b are provided between the oxide semiconductor film 17a and the oxide insulating film 23 and between the oxide semiconductor film 17b and the oxide insulating film 23, respectively. Thus, it is possible to reduce the concentration of silicon or carbon in the vicinity of the interface between the oxide semiconductor film 99a and the oxide semiconductor film 17a and in the vicinity of the interface between the oxide semiconductor film 99b and the oxide semiconductor film 17b, in the oxide semiconductor films 17a and 17b, or in the vicinity of the interface between the oxide semiconductor film 97a and the oxide semiconductor film 17a and in the vicinity of the interface between the oxide semiconductor film 97b and the oxide semiconductor film 17b.

The transistor of this embodiment having such a structure includes very few defects in the multilayer film including the oxide semiconductor film where a channel is formed; thus, the electrical characteristics, typified by the on-state current and the field-effect mobility, of these transistors can be improved. Further, in a BT stress test and a BT photostress test that are examples of a stress test, the amount of change in threshold voltage is small, and thus, reliability is high.

<Band Structure of Transistor>

Next, band structures of the multilayer film 98a included in the transistor 105a illustrated in FIGS. 20A1, 20B, and 20C1 and the multilayer film 94a included in the transistor 106a illustrated in FIG. 21 are described with reference to FIGS. 22A to 22C. Note that the multilayer film 98b included in the transistor 105b has a structure similar to that of the multilayer film 98a. Further, the multilayer film 94b included in the transistor 106b has a structure similar to that of the multilayer film 94a. Thus, the multilayer film 98a and the multilayer film 94a can be alternately referred to as the multilayer film 98b and the multilayer film 94b, respectively, in the description below.

Here, for example, an In—Ga—Zn oxide having an energy gap of 3.15 eV is used for the oxide semiconductor film 17a, and an In—Ga—Zn oxide having an energy gap of 3.5 eV is used for the oxide semiconductor film 97a. The energy gaps were measured using a spectroscopic ellipsometer (UT-300 manufactured by HORIBA JOBIN YVON SAS.).

The energy difference between the vacuum level and the valence band maximum (also called ionization potential) of the oxide semiconductor film 17a and the energy difference between the vacuum level and the valence band maximum of the oxide semiconductor film 97a were 8 eV and 8.2 eV, respectively. Note that the energy difference between the vacuum level and the valence band maximum was measured using an ultraviolet photoelectron spectroscopy (UPS) device (VersaProbe manufactured by ULVAC-PHI, Inc.).

Thus, the energy difference between the vacuum level and the conduction band minimum (also called electron affinity) of the oxide semiconductor film 17a and the energy gap therebetween of the oxide semiconductor film 97a were 4.85 eV and 4.7 eV, respectively.

Figure 22A:
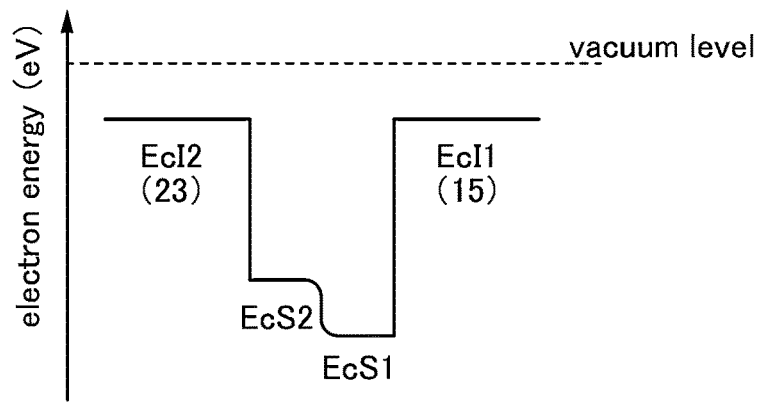
FIGS. 22A to 22C illustrate band structures of transistors.

FIG. 22A schematically illustrates a part of the band structure of the multilayer film 98a. Here, the case where silicon oxide films are used for the insulating film 15 and the oxide insulating film 23 and the silicon oxide films are provided in contact with the multilayer film 98a is described. In FIG. 22A, EcI1 denotes the energy of the bottom of the conduction band in the silicon oxide film; EcS1 denotes the energy of the bottom of the conduction band in the oxide semiconductor film 17a; EcS2 denotes the energy of the bottom of the conduction band in the oxide semiconductor film 97a; and EcI2 denotes the energy of the bottom of the conduction band in the silicon oxide film. Furthermore, EcI1 and EcI2 correspond to the insulating film 15 and the oxide insulating film 23 in FIG. 20B, respectively.

As illustrated in FIG. 22A, there is no energy barrier between the oxide semiconductor films 17a and 97a, and the energy level of the bottom of the conduction band gradually changes therebetween. In other words, the energy level of the conduction band minimum is continuously changed. This is because the multilayer film 98a contains an element contained in the oxide semiconductor film 17a and oxygen is transferred between the oxide semiconductor films 17a and 97a, so that a mixed layer is formed.

As shown in FIG. 22A, the oxide semiconductor film 17a in the multilayer film 98a serves as a well and a channel region of the transistor including the multilayer film 98a is formed in the oxide semiconductor film 17a. Note that since the conduction band minimum of the multilayer film 98a is continuously changed, it can be said that the oxide semiconductor films 17a and 97a are continuous.

Although trap states due to impurities or defects might be generated in the vicinity of the interface between the oxide semiconductor film 97a and the oxide insulating film 23 as shown in FIG. 22A, the oxide semiconductor film 17a can be distanced from the region where the trap states are generated owing to the existence of the oxide semiconductor film 97a. However, when the energy difference between EcS1 and EcS2 is small, an electron in the oxide semiconductor film 17a might reach the trap state across the energy difference. When the electron is captured by the trap state, a negative fixed charge is generated at the interface with the insulating film, whereby the threshold voltage of the transistor shifts in the positive direction. Thus, it is preferable that the energy difference between EcS1 and EcS2 be 0.1 eV or more, further preferably 0.15 eV or more, because change in the threshold voltage of the transistor is reduced and stable electrical characteristics are obtained.

Figure 22B:
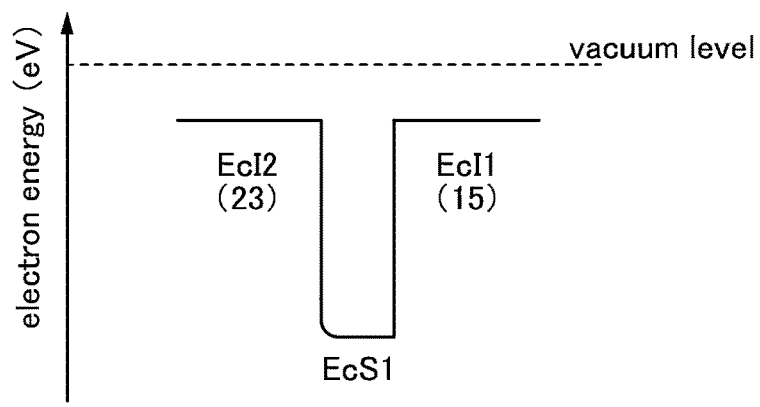

FIG. 22B schematically illustrates a part of the band structure of the multilayer film 98a, which is a variation of the band structure shown in FIG. 22A. Here, a structure where silicon oxide films are used for the insulating film 15 and the oxide insulating film 23 and the silicon oxide films are in contact with the multilayer film 98a is described. In FIG. 22B, EcI1 denotes the conduction band minimum in the silicon oxide film; EcS1 denotes the conduction band minimum in the oxide semiconductor film 17a; and EcI2 denotes the conduction band minimum in the silicon oxide film. Further, EcI1 and EcI2 correspond to the insulating film 15 and the oxide insulating film 23 in FIG. 20B, respectively.

In the transistor illustrated in FIG. 20B, an upper portion of the multilayer film 98a, that is, the oxide semiconductor film 97a might be etched in formation of the pair of electrodes 20a and 20b. Furthermore, a mixed layer of the oxide semiconductor films 17a and 97a is likely to be formed on the top surface of the oxide semiconductor film 17a in formation of the oxide semiconductor film 97a.

For example, when the oxide semiconductor film 17a is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and the oxide semiconductor film 97a is an oxide film formed with use of, as a sputtering target, In—Ga—Zn oxide whose atomic ratio of In to Ga and Zn is 1:3:2, In—Ga—Zn oxide whose atomic ratio of In to Ga and Zn is 1:3:4, or In—Ga—Zn oxide whose atomic ratio of In to Ga and Zn is 1:3:6, the Ga content in the oxide semiconductor film 97a is higher than that in the oxide semiconductor film 17a. Thus, a $GaO_x$ layer or a mixed layer whose Ga content is higher than that in the oxide semiconductor film 17a can be formed on the top surface of the oxide semiconductor film 17a.

For that reason, even in the case where the oxide semiconductor film 97a is etched, the conduction band minimum of EcS1 on the EcI2 side is increased and the band structure shown in FIG. 22B can be obtained in some cases.

As in the band structure shown in FIG. 22B, in observation of a cross section of a channel region, only the oxide semiconductor film 17a in the multilayer film 98a is apparently observed in some cases. However, a mixed layer that contains Ga more than the oxide semiconductor film 17a does is formed over the oxide semiconductor film 17a in fact, and thus the mixed layer can be regarded as a 1.5-th layer. Note that the mixed layer can be confirmed by analyzing a composition in the upper portion of the oxide semiconductor film 17a, when the elements contained in the multilayer film 98a are measured by an EDX analysis, for example. The mixed layer can be confirmed, for example, in such a manner that the Ga content in the composition in the upper portion of the oxide semiconductor film 17a is larger than the Ga content in the oxide semiconductor film 17a.

Figure 22C:
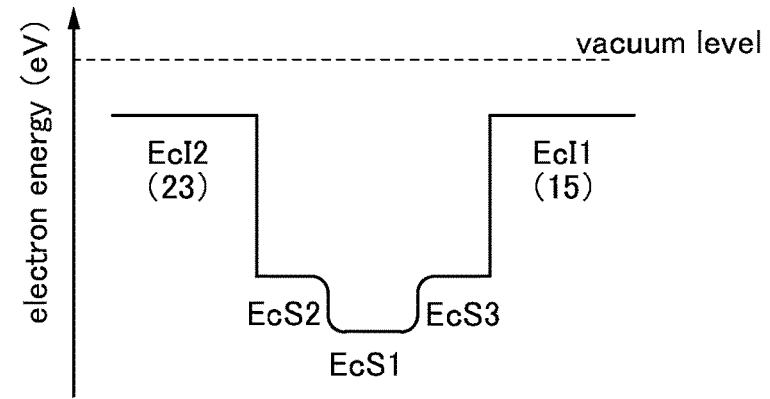

FIG. 22C schematically illustrates a part of the band structure of the multilayer film 94a illustrated in FIG. 21. Here, the case where silicon oxide films are used for the insulating film 15 and the oxide insulating film 23 and the silicon oxide films are in contact with the multilayer film 94a is described. In FIG. 22C, EcI1 denotes the energy of the conduction band minimum of the silicon oxide film; EcS1 denotes the energy of the conduction band minimum of the oxide semiconductor film 17a; EcS2 denotes the energy of the conduction band minimum of the oxide semiconductor film 97a; EcS3 denotes the energy of the conduction band minimum of the oxide semiconductor film 99a; and EcI2 denotes the energy of the conduction band minimum of the silicon oxide film. Further, EcI1 and EcI2 correspond to the insulating film 15 and the oxide insulating film 23 in FIG. 21, respectively.

As illustrated in FIG. 22C, there is no energy barrier between the oxide semiconductor films 99a, 17a, and 97a, and the conduction band minimums thereof smoothly vary. In other words, the conduction band minimums are continuous. This is because the multilayer film 94a contains an element contained in the oxide semiconductor film 17a and oxygen is transferred between the oxide semiconductor films 17a and 97, so that a mixed layer is formed.

As shown in FIG. 22C, the oxide semiconductor film 17a in the multilayer film 94a serves as a well and a channel region of the transistor including the multilayer film 94a is formed in the oxide semiconductor film 17a. Note that since the energy of the bottom of the conduction band of the multilayer film 94a is continuously changed, it can be said that the oxide semiconductor films 99a, 17a, and 97a are continuous.

Although trap states due to impurities or defects might be generated in the vicinity of the interface between the multilayer film 94a and the oxide insulating film 23 and in the vicinity of the interface between multilayer film 94a and the insulating film 15, as illustrated in FIG. 22C, the oxide semiconductor film 17a can be distanced from the region where the trap states are generated owing to the existence of the oxide semiconductor films 97a and 99a. However, when the energy difference between EcS1 and EcS2 and the energy difference between EcS1 and EcS3 are small, electrons in the oxide semiconductor film 17a might reach the trap state across the energy difference. When the electrons are captured by the trap state, a negative fixed charge is generated at the interface with the insulating film, whereby the threshold voltage of the transistor shifts in the positive direction. Thus, it is preferable that the energy difference between EcS1 and EcS2 and the energy difference between EcS1 and EcS3 be 0.1 eV or more, further preferably 0.15 eV or more, because change in the threshold voltage of the transistor is reduced and stable electrical characteristics are obtained.

Note that the structures, methods, and the like described in this embodiment can be used as appropriate in combination with any of the structures, methods, and the like described in the other embodiments.

Embodiment 6

In this embodiment, one embodiment that can be applied to an oxide semiconductor film in the transistor included in the semiconductor device described in the above embodiment is described.

It is preferable that the oxide semiconductor film include a CAAC-OS film. The CAAC-OS film includes crystals whose c-axes are aligned; however, no grain boundary between the crystals is clearly observed. The crystals whose c-axes are aligned are less likely to be etched, so that in a channel-etched transistor, a small amount of an oxide semiconductor film is overetched when a pair of electrodes is formed. For this reason, with the use of a CAAC-OS film for the oxide semiconductor film, a channel-etched transistor can be manufactured. In particular, a channel-etched transistor used as a driver transistor can have a structure in which the distance between a pair of electrodes, that is, a channel length, is as short as greater than or equal to 0.5 μm and less than or equal to 4.5 μm.

The oxide semiconductor film may include one or more of an oxide semiconductor having a single-crystal structure (hereinafter referred to as a single-crystal oxide semiconductor), an oxide semiconductor having a polycrystalline structure (hereinafter referred to as a polycrystalline oxide semiconductor), an oxide semiconductor having a microcrystalline structure (hereinafter referred to as a microcrystalline oxide semiconductor), and an oxide semiconductor having an amorphous structure (hereinafter referred to as an amorphous oxide semiconductor).

Described below are the CAAC-OS, the single-crystal oxide semiconductor, the polycrystalline oxide semiconductor, the microcrystalline oxide semiconductor, and the amorphous oxide semiconductor.

<CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC oxide film is greater than or equal to 2500 nm$^2$, preferably greater than or equal to 5 μm$^2$, further preferably greater than or equal to 1000 μm$^2$. Furthermore, in a cross-sectional TEM image, when the proportion of the crystal parts is greater than or equal to 50%, preferably greater than or equal to 80%, further preferably greater than or equal to 95% of the CAAC-OS film, the CAAC-OS film is a thin film having physical properties similar to those of a single crystal.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film. Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. When the CAAC-OS film is analyzed by an out-of-plane method, a peak appears frequently when the diffraction angle (2θ) is around 31°. This peak is assigned to the (00x) plane (x is an integer) of an InGaZn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is assigned to the (110) plane of the InGaZn oxide crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZn oxide, six peaks appear. The six peaks are assigned to crystal planes equivalent to the (110) plane. On the other hand, in the case of a CAAC-OS film, a peak is not clearly observed even when φ scan is performed with 2φ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axes of the crystal part are aligned in a direction parallel to a normal vector of a formation surface or a normal vector of a top surface. Thus, for example, in the case where a shape of the CAAC-OS film is changed by etching or the like, the c-axes of the crystal part might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a reduction in crystallinity. Further, a heavy metal such as iron or nickel, argon, carbon dioxide, or the like has a large atomic radius (or molecular radius), and thus disturbs the atomic arrangement of the oxide semiconductor film and causes a reduction in crystallinity when it is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, an oxygen vacancy in the oxide semiconductor film serves as a carrier trap or a carrier generation source in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With the use of the CAAC-OS film in a transistor, variations in the electrical characteristics of the transistor due to irradiation with visible light or ultraviolet light are small.

<Single Crystal Oxide Semiconductor>

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

<Polycrystalline Oxide Semiconductor>

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. The polycrystalline oxide semiconductor film is subjected to structural analysis with an XRD apparatus. For example, when the polycrystalline oxide semiconductor film including an InGaZn oxide crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the boundary in the polycrystalline oxide semiconductor film. Moreover, the boundary of the polycrystalline oxide semiconductor film serves as a defect state. Since the boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

<Microcrystalline Oxide Semiconductor>

In an image obtained with a TEM, crystal parts cannot be found clearly in the microcrystalline oxide semiconductor in some cases. In most cases, the size of a crystal part in the microcrystalline oxide semiconductor film is greater than or equal to 1 nm and less than or equal to 100 nm, or greater than or equal to 1 nm and less than or equal to 10 nm. An oxide semiconductor film including nanocrystal (nc), which is a microcrystal with a size greater than or equal to 1 nm and less than or equal to 10 nm, or a size greater than or equal to 1 nm and less than or equal to 3 nm, is specifically referred to as a nanocrystalline oxide semiconductor (nc-OS) film. In an image of the nc-OS film obtained with a TEM, for example, a crystal grain cannot be observed clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is observed in an electron diffraction pattern (also referred to as a selected-area electron diffraction pattern) of the nc-OS film obtained by using an electron beam having a diameter (e.g., larger than or equal to 50 nm) larger than the diameter of a crystal part. Meanwhile, spots are observed in a nanobeam electron diffraction pattern of the nc-OS film obtained by using an electron beam having a diameter (e.g., larger than or equal to 1 nm and smaller than or equal to 30 nm) close to, or smaller than or equal to the diameter of a crystal part. In some cases, in a nanobeam electron diffraction pattern of the nc-OS film, regions with high luminance in a circular (ring) pattern are observed. Further, in a nanobeam electron diffraction pattern of the nc-OS film, a plurality of spots are shown in a ring-like region in some cases.

Since an nc-OS film is an oxide semiconductor film having more regularity than an amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than a CAAC-OS film.

Note that the structures, methods, and the like described in this embodiment can be used as appropriate in combination with any of the structures, methods, and the like described in the other embodiments.

Embodiment 7

In the method for manufacturing any of the display devices described in Embodiments 1 to 6, after the electrodes 20a to 20d are formed over the oxide semiconductor films 17a and 17b, the oxide semiconductor films 17a and 17b may be exposed to plasma generated in an oxidizing atmosphere to be supplied with oxygen. Atmospheres of oxygen, ozone, dinitrogen monoxide, nitrogen dioxide, and the like can be given as examples of oxidizing atmospheres. Further, in the plasma treatment, the oxide semiconductor films 17a and 17b are preferably exposed to plasma generated with no bias applied to the substrate 11 side. Consequently, the oxide semiconductor films 17a and 17b can be supplied with oxygen without being damaged; accordingly, the number of oxygen vacancies in the oxide semiconductor films 17a and 17b can be reduced. Moreover, impurities, e.g., halogen such as fluorine or chlorine remaining on a surface of the oxide semiconductor films 17a and 17b due to the etching treatment can be removed. The plasma treatment is preferably performed while heating is performed at a temperature higher than or equal to 300° C. Oxygen in the plasma is bonded to hydrogen contained in the oxide semiconductor films 17a and 17b to form water. Since the substrate is heated, the water is released from the oxide semiconductor films 17a and 17b. Consequently, the amount of hydrogen and water in the oxide semiconductor films 17a and 17b can be reduced.

Note that the structures, methods, and the like described in this embodiment can be used as appropriate in combination with any of the structures, methods, and the like described in the other embodiments.

Embodiment 8

In this embodiment, the structure of a pixel included in the display device of one embodiment of the present invention will be described with reference to drawings. Note that in the drawings, portions similar to those denoted by the reference numerals in the above embodiments and portions having functions similar to those denoted by the reference numerals in above embodiments are given by the same reference numerals, and detailed description thereof is omitted.

Figure 23:
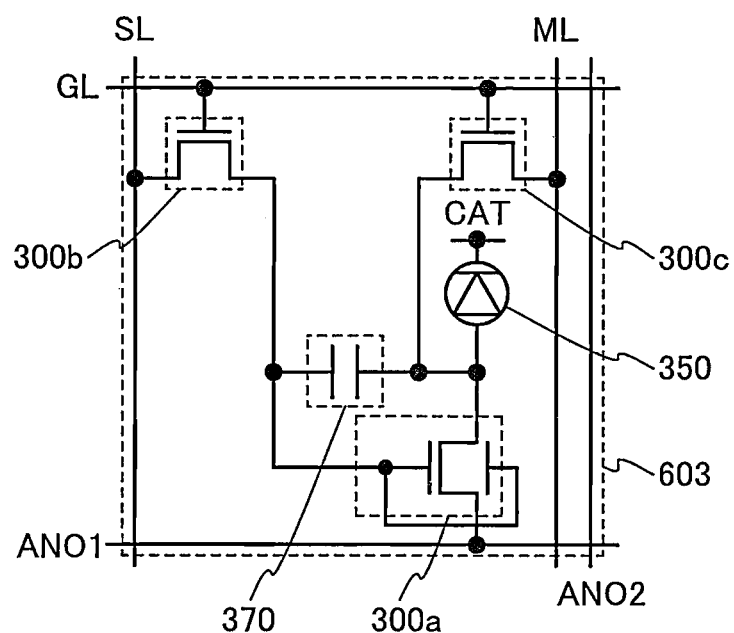
FIG. 23 is a circuit diagram illustrating one embodiment of a pixel structure of a display device.

FIG. 23 illustrates a circuit configuration that can be used for the pixel in the display device.

A pixel 603 illustrated in FIG. 23 includes a transistor 300b serving as a selection transistor which controls writing of a data signal, a transistor 300a serving as a driver transistor, a transistor 300c, the capacitor 370, and the light-emitting element 350.

One of a source electrode and a drain electrode of the transistor 300a is electrically connected to a wiring ANO1 serving as an anode line. The other of the source electrode and the drain electrode of the transistor 300a is electrically connected to one electrode of the light-emitting element 350. Further, gate electrodes of the transistor 300a are electrically connected to one of a source electrode and a drain electrode of the transistor 300b and one electrode of the capacitor 370.

The transistor 300a has a function of controlling current flowing in the light-emitting element 350 by being turned on or off. In this embodiment, the transistor 300a has a channel length greater than or equal to 0.5 μm and less than or equal to 4.5 μm, and includes a first gate electrode over an oxide semiconductor film and a second gate electrode below the oxide semiconductor film. Note that the first gate electrode and the second gate electrode are electrically connected to each other. Thus, in the transistor 300a, on-state current and field-effect mobility are improved and a negative shift in the threshold voltage is suppressed.

The other of a source electrode and a drain electrode of the transistor 300b is electrically connected to a signal line SL to which a data signal is supplied. A gate electrode of the transistor 300b is electrically connected to a scan line GL to which a gate signal is supplied.

The transistor 300b has a function of controlling writing of a data signal by being turned on or off. This means that the transistor 300b serves as a selection transistor.

In this embodiment, the transistor 300b has a longer channel length than the transistor 300a. A negative shift in the threshold voltage of the transistor 300b is suppressed, so that cutoff current is low.

One of a source electrode and a drain electrode of the transistor 300c is connected to a wiring ML to which a reference potential of data is supplied, and the other is electrically connected to the one electrode of the light-emitting element 350 and the other electrode of the capacitor 370. Moreover, a gate electrode of the transistor 300c is electrically connected to the scan line GL to which the gate signal is supplied.

The transistor 300c has a function of adjusting the current flowing in the light-emitting element 350. For example, in the case where the threshold voltage or the field-effect mobility of the transistor 300a varies or the transistor 300a deteriorates, current that flows in each light-emitting element 350 can be corrected through monitoring of current flowing in the wiring ML. The wiring ML can be supplied with, for example, voltage lower than or equal to the threshold voltage of the light-emitting element 350.

In this embodiment, the channel length of the transistor 300c is preferably longer than the channel length of the transistor 300a, for example. Note that the transistor 300c can have a single-gate structure, or have a dual-gate structure like the transistor 300a. It is preferable that the transistor 300c have a single-gate structure because a region where a first gate electrode and a second gate electrode are in contact with each other is not necessary, so that the area of the transistor can be reduced, which can increase the aperture ratio of the pixel.

One of the pair of electrodes of the capacitor 370 is electrically connected to one of the source electrode and the drain electrode of the transistor 300b and the gate electrode of the transistor 300a, and the other of the pair of electrodes of the capacitor 370 is electrically connected to the other of the source electrode and the drain electrode of the transistor 300c and one electrode of the light-emitting element 350.

In the structure of the pixel 603 in FIG. 23, the capacitor 370 serves as a storage capacitor for storing written data.

The one of the pair of electrodes of the light-emitting element 350 is electrically connected to the other of the source and drain electrodes of the transistor 300a, the other electrode of the capacitor 370, and the other of the source and drain electrodes of the transistor 300c. Furthermore, the other of the pair of electrodes of the light-emitting element 350 is electrically connected to a wiring CAT serving as a cathode.

As the light-emitting element 350, an organic electroluminescent element (also referred to as an organic EL element) or an inorganic EL element can be used, for example.

A wiring ANO2 extends in a direction parallel to the wiring ML. The wiring ANO2 is connected to the wiring ANO1 serving as an anode line, so that the wiring resistance of the wiring ANO1 can be reduced. Thus, voltage drop of the wiring in the display device using a large substrate can be reduced; accordingly, unevenness in luminance of the display device can be reduced.

A high power supply potential VDD is supplied to either of the wirings ANO1 and ANO2 and the wiring CAT, and a low power supply potential VSS is supplied to the other. In the structure of FIG. 23, the high power supply potential VDD is supplied to the wirings ANO1 and ANO2, and the low power supply potential VSS is supplied to the wiring CAT.

In the display device including the pixel 603 in FIG. 23, the pixels 603 are sequentially selected row by row by the scan line driver circuit, whereby the transistor 300b is turned on and a data signal is written.

When the transistor 300b is turned off, the pixels 603 in which the data has been written are brought into a holding state. Moreover, the transistor 300b is connected to the capacitor 370; thus, the written data can be held for a long time. Further, the amount of current flowing between the source electrode and the drain electrode of the transistor 300a is controlled. The light-emitting element 350 emits light with a luminance corresponding to the amount of flowing current.

Next, a structure which can be used for the pixel 603 illustrated in FIG. 23 will be described below with reference to FIG. 16, FIG. 17, and FIG. 18.

Figure 16:
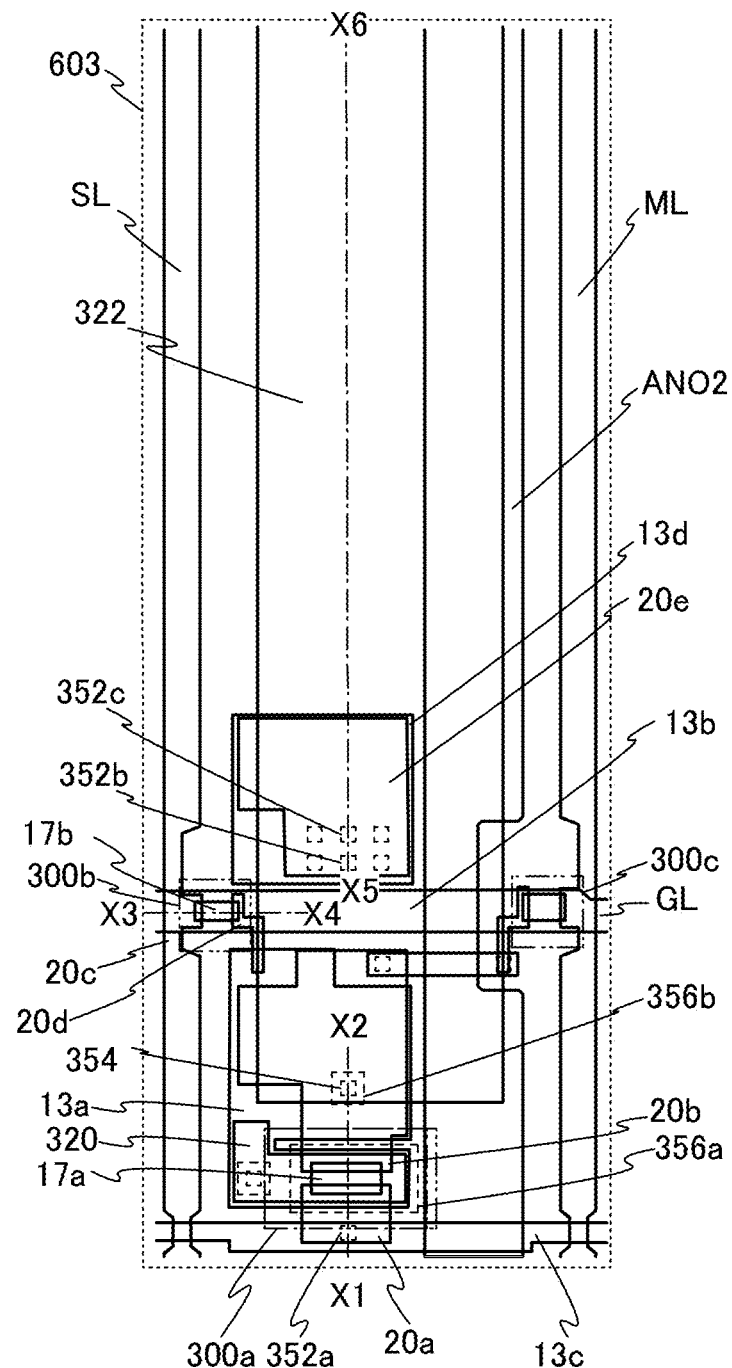
FIG. 16 is a plan view illustrating one embodiment of a pixel structure of a display device.

FIG. 16 shows a part of a top view of a pixel circuit that can be used for the pixel 603. FIG. 17 shows a cross section taken along dashed-dotted line X1-X2 in FIG. 16. FIG. 18 shows a cross section taken along dashed-dotted lines X3-X4 and X5-X6 in FIG. 16.

In FIG. 16, a wiring GL serving as a scan line extends substantially perpendicularly to a signal line (in the horizontal direction in the drawing). A wiring SL serving as the signal line extends substantially perpendicularly to the scan line (in the vertical direction in the drawing). A wiring ML which is supplied with a reference potential of data extends in a direction parallel to the wiring SL. The wiring ANO2 serving as an anode line extends in a direction parallel to the wiring SL and the wiring ML.

The transistors 300a, 300b, and 300c are provided in the pixel 603. Note that each of the transistors 300a, 300b, and 300c includes a conductive film serving as a gate electrode, a gate insulating film, an oxide semiconductor film which is over the gate insulating film and in which a channel region is formed, and conductive films serving as a pair of electrodes. For example, the transistor 300a includes the gate electrode 13a, a gate insulating film (not illustrated), the oxide semiconductor film 17a, and the electrodes 20a and 20b.

The transistor 300*b* includes the gate electrode 13*b*, a gate insulating film (not illustrated), the oxide semiconductor film 17*b*, and the electrode 20*c* and 20*d*.

Note that although the structure of the transistor 300*c* is not particularly mentioned, the transistor 300*c* can have a structure similar to the structure of the transistor 300*b*.

An electrode 13*c* is electrically connected to the electrode 20*a* through an opening portion 352*a*. The electrode 20*b* is electrically connected to a pixel electrode 322 through opening portions 354 and 356*b*. An electrode 13*d* is electrically connected to an electrode 20*e* through opening portions 352*b* and 352*c*.

The gate electrode 13*a* is formed under the electrode 20*b*. The electrode 20*b*, a dielectric film formed over the gate electrode 13*a*, and the gate electrode 13*a* form a capacitor. The capacitor corresponds to the capacitor 370 illustrated in FIG. 23.

Next, cross sections taken along dashed-dotted lines X1-X2, X3-X4, and X5-X6 in FIG. 16 will be described with reference to FIG. 17 and FIG. 18.

Figure 17:
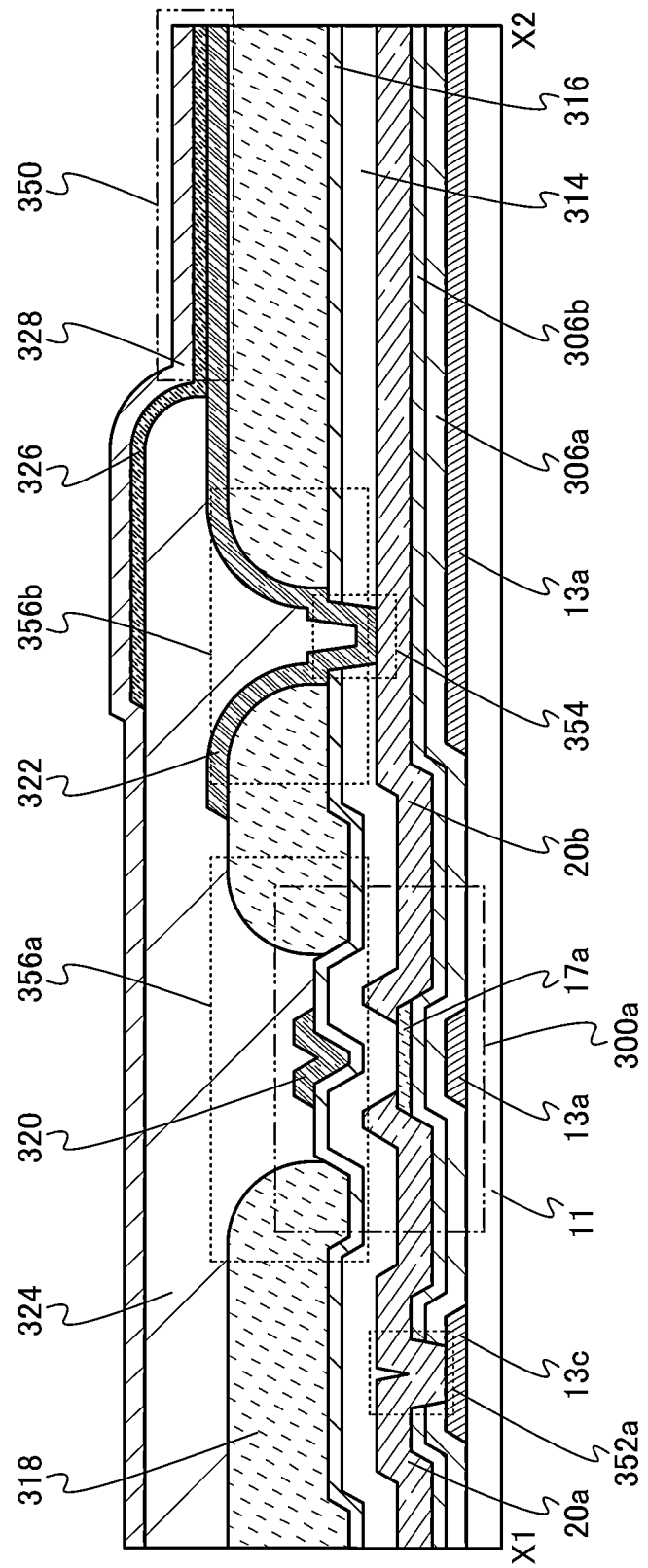
FIG. 17 is a cross-sectional view illustrating one embodiment of a pixel structure of a display device.
Figure 18:
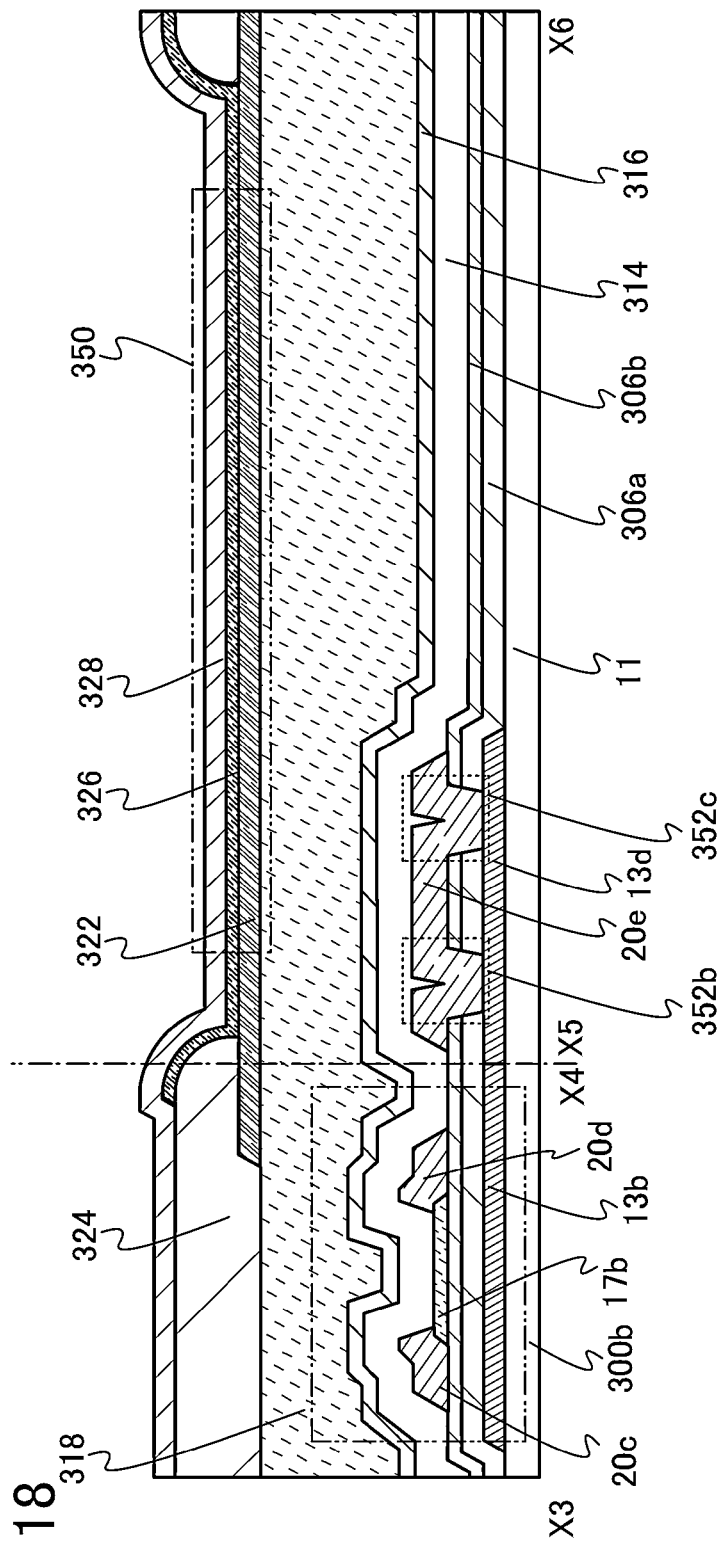
FIG. 18 is a cross-sectional view illustrating one embodiment of a pixel structure of a display device.

The pixel illustrated in FIG. 17 and FIG. 18 includes the substrate 11; the gate electrodes 13*a* and 13*b* and the electrodes 13*c* and 13*d* over the substrate 11; insulating films 306*a* and 306*b* which are formed over the substrate 11, the gate electrodes 13*a* and 13*b*, and the electrodes 13*c* and 13*d*; the oxide semiconductor films 17*a* and 17*b* over the insulating film 306*b*; the pair of electrodes 20*a* and 20*b* and the pair of electrodes 20*c* and 20*d* over the oxide semiconductor film 17*a* and the oxide semiconductor film 17*b*, respectively; the electrode 20*e* which is formed in the same step as the electrodes 20*a* to 20*d*; an oxide insulating film 314 formed over the oxide semiconductor films 17*a* and 17*b* and the electrodes 20*a* to 20*e*; a nitride insulating film 316 formed over the oxide insulating film 314; a gate electrode 320 formed over the nitride insulating film 316 to overlap with the oxide semiconductor film 17*a*; an insulating film 318 which is over the nitride insulating film 316 and has an opening portion 356*a* in a position overlapping with the oxide semiconductor film 17*a*; the pixel electrode 322 which is formed in the same step as the gate electrode 320 and formed over the insulating film 318; and an insulating film 324 which is formed to cover the transistor and an end portion of the pixel electrode 322.

The insulating films 306*a* and 306*b* serve as gate insulating films of the transistors 300*a* and 300*b* (a first gate insulating film in the transistor 300*a*), and the oxide insulating film 314 and the nitride insulating film 316 serve as a second gate insulating film of the transistor 300*a*.

In a region between the electrode 20*b* and the gate electrode 13*a*, the insulating films 306*a* and 306*b* serve as a dielectric. That is, the electrode 20*b*, the insulating films 306*a* and 306*b*, and the gate electrode 13*a* form the capacitor.

An EL layer 326 is formed over the pixel electrode 322 and the insulating film 324. An electrode 328 is formed over the EL layer 326. The pixel electrode 322, the EL layer 326, and the electrode 328 form the light-emitting element 350. The EL layer 326 includes at least a light-emitting layer containing a light-emitting substance. In addition to the light-emitting layer, a functional layer such as a hole-injection layer, a hole-transport layer, an electron-transport layer, an electron-injection layer, or a charge generation layer may be formed. In the EL layer 326, electrons and holes are injected from a pair of electrodes (here, the pixel electrode 322 and the electrode 328), and current flows. The electrons and holes are recombined, and thus, the light-emitting substance is excited. The light-emitting substance returns to a ground state from the excited state, thereby emitting light.

The insulating film 318 may have a function of planarizing unevenness formed under the pixel electrode 322. The insulating film 318 can be formed using an organic insulating film, for example.

The insulating film 324 has a function of separating EL layers 326 in adjacent pixels; that is, the insulating film 324 has a function as a partition wall. The insulating film 324 has an insulating property and can be formed using an organic insulating film or an inorganic insulating film, for example. As the organic insulating film, for example, a polyimide-based resin, a polyamide-based resin, an acrylic-based resin, a siloxane-based resin, an epoxy-based resin, a phenol-based resin, or the like can be used. As the inorganic insulating material, silicon oxide, silicon oxynitride, or the like can be used. In particular, a photosensitive organic resin material is preferably used, in which case the insulating film 324 is easily formed.

The opening portion 352*a* is formed in the insulating films 306*a* and 306*b* over the electrode 13*c*. The electrode 13*c* is connected to the electrode 20*a* through the opening portion 352*a*. The opening portions 352*b* and 352*c* are formed in the insulating films 306*a* and 306*b* over the electrode 13*d*. The electrode 13*d* is electrically connected to the electrode 20*e* through the opening portions 352*b* and 352*c*. With a plurality of opening portions such as the opening portions 352*b* and 352*c* formed over the electrode 13*d*, contact resistance between the electrode 13*d* and the electrode 20*e* can be reduced. Note that FIG. 18 illustrates the case of providing two opening portions, i.e., the opening portions 352*b* and 352*c*. However, the number of opening portions is not limited thereto. One opening portion, or three or more opening portions may be formed.

The opening portion 356*a* is formed in the insulating film 318 over the transistor 300*a*. The opening portion 356*a* can shorten the distance between the gate electrode 320 and the oxide semiconductor film 17*a*. Therefore, an electric field from the gate electrode 320 can be preferably applied to the oxide semiconductor film 17*a*.

The opening portion 354 is formed in the oxide insulating film 314 and the nitride insulating film 316 over the electrode 20*b*. The opening portion 356*b* is formed in the insulating film 318 over the opening portion 354. The electrode 20*b* is electrically connected to the pixel electrode 322 through the opening portions 354 and 356*b*.

Note that the description in Embodiment 1 or Embodiment 2 can be referred to for materials which can be used for the pixel illustrated in FIGS. 17 and 18.

Note that the structures, methods, and the like described in this embodiment can be used as appropriate in combination with any of the structures, methods, and the like described in the other embodiments.

Embodiment 9

In this embodiment, an example of an active matrix display device that is one embodiment of the present invention will be described with reference to FIGS. 24A and 24B.

Figure 24A:
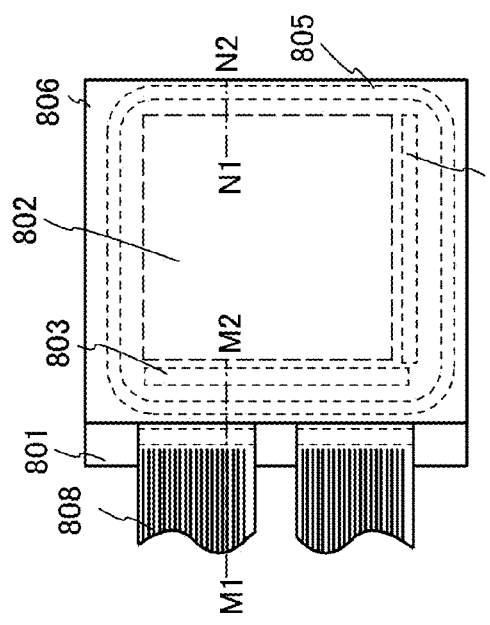
FIGS. 24A and 24B are a top view and a cross-sectional view illustrating a display device.

FIG. 24A is a top view of the display device of one embodiment of the present invention. FIG. 24B is a cross-sectional view taken along the dashed-dotted lines M1-M2 and N1-N2.

Figure 24B:
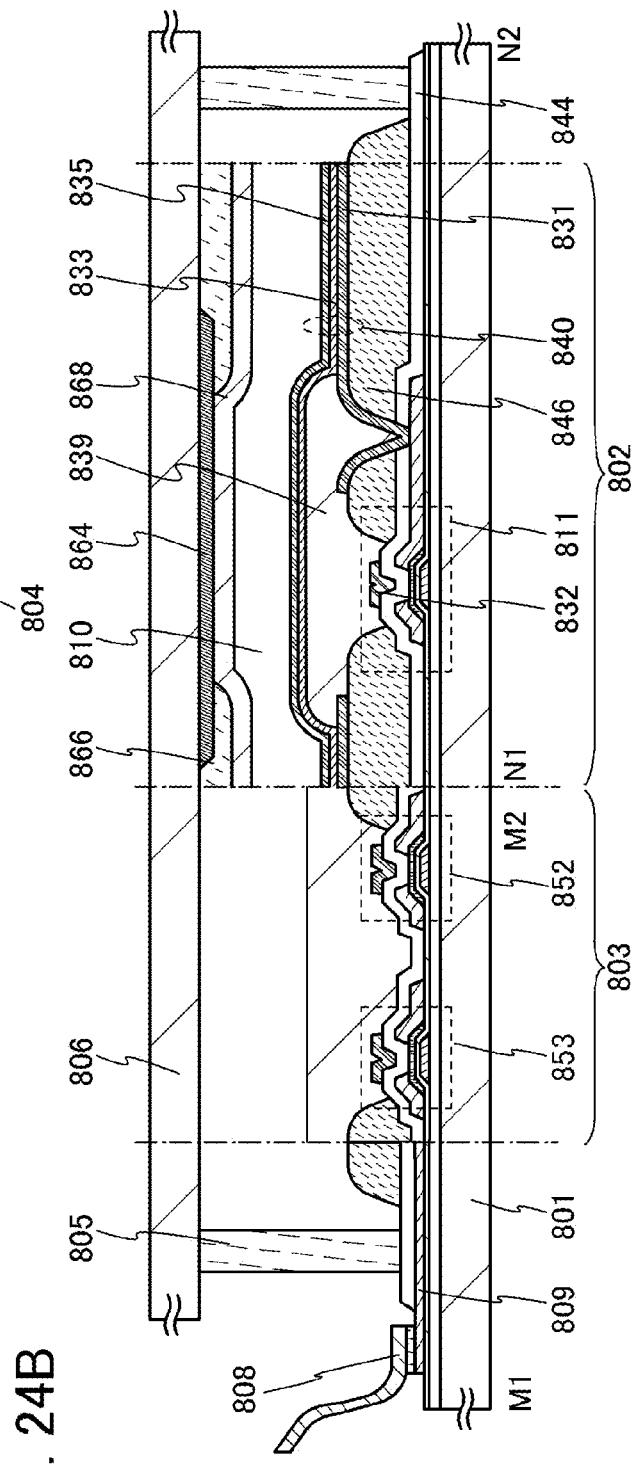

An active matrix display device illustrated in FIGS. 24A and 24B includes, over a support substrate 801, a light-emitting portion 802, a driver circuit portion 803 (e.g., gate line driver circuit), a driver circuit portion 804 (e.g., signal line driver circuit), and a sealant 805. The light-emitting portion 802 and the driver circuit portions 803 and 804 are sealed in a space 810 surrounded by the support substrate 801, the sealing substrate 806, and the sealant 805.

The driver circuit portions 803 and 804 can be formed using the transistor described in any of the above embodiment. Note that the driver circuit portions or the like may each be divided so that parts of the driver circuit portions or the like face each other with pixels provided therebetween.

The light-emitting portion 802 shown in FIG. 24B includes a plurality of pixels each having a first transistor (not shown) serving as a selection transistor which controls writing of a data signal, a second transistor 811 serving as a driver transistor which adjusts current flowing in a light-emitting element, and a first electrode 831 which is electrically connected to a wiring (a source electrode or a drain electrode) of the second transistor 811.

The light-emitting element 840 has a top-emission structure and includes the first electrode 831, an EL layer 833, and a second electrode 835. An insulating film 839 covering an end portion of the first electrode 831 and serving as a partition wall is formed.

The transistor 811 has a dual-gate structure and includes, over an insulating film 844, a gate electrode 832 which is formed concurrently with the first electrode 831. When the transistor 811 is provided under the insulating film 839, reflection of external light on the gate electrode 832 can be reduced.

Over the support substrate 801, a lead wiring 809 for connecting an external input terminal through which a signal (e.g., a video signal, a clock signal, a start signal, or a reset signal) or a potential from the outside is transmitted to the driver circuit portions 803 and 804 is provided. Here, an example in which a flexible printed circuit (FPC) 808 is provided as an external input wiring is described.

The driver circuit portions 803 and 804 have a plurality of transistors. FIG. 24B illustrates an example in which the driver circuit portion 803 includes an NMOS circuit having n-channel transistors 852 and 853. A circuit included in the driver circuit portion can be formed with various types of circuits such as a CMOS circuit, a PMOS circuit, or an NMOS circuit. Although a driver-integrated type in which a driver circuit is formed over the substrate over which the light-emitting portion is formed is described in this embodiment, the structure of the present invention is not limited to the driver-integrated type. The driver circuit can be formed over a substrate that is different from the substrate over which the light-emitting portion is formed.

To prevent increase in the number of manufacturing steps, the lead wiring 809 is preferably formed using the same material and the same step(s) as those of the electrode or the wiring in the light-emitting portion or the driver circuit portion. For example, the lead wiring 809 can be formed using the same material in the same step(s) as those of the gate electrode of the transistor included in the light-emitting portion 802 and the driver circuit portion 803.

As the support substrate 801, a substrate having heat resistance high enough to resist the manufacturing process of the display device can be used. The substrate is not particularly limited in thickness and size as long as it can be used in a manufacturing apparatus.

The support substrate 801 preferably has a gas barrier property. Alternatively, a film having a gas barrier property may be stacked over the support substrate 801.

Specifically, when a material having a gas barrier property such that the vapor permeability is lower than or equal to $10^{-5}$ g/m$^2$·day, preferably lower than or equal to $10^{-6}$ g/m$^2$·day, is used, the reliability of the display device can be improved.

Further, the support substrate 801 may be a flexible substrate. As a flexible substrate, a plastic substrate can be given as a typical example. In addition, a thin glass substrate with a thickness greater than or equal to 50 μm and less than or equal to 500 μm, a metal foil, or the like can be used.

For example, as a substrate which can be used as the support substrate 801, a non-alkali glass substrate, a barium borosilicate glass substrate, an aluminoborosilicate glass substrate, a ceramic substrate, a quartz substrate, a sapphire substrate, a metal substrate, a stainless-steel substrate, a plastic substrate, a polyethylene terephthalate substrate, a polyimide substrate, or the like can be used.

The structure of the transistors in the driver circuit portion 803 is not particularly limited. Although transistors having a channel-etched bottom gate structure are illustrated as an example in FIG. 24B, the transistors may have a channel-protective bottom gate structure, a self-aligned top gate structure, or a non-self-aligned top gate structure.

A transistor including an oxide semiconductor in a channel formation region has characteristics of very low off-state current in some cases. When such a transistor is used, the capability of holding a signal input to a pixel (capacitor) can be high, so that the frame frequency can be reduced for example in the case of displaying a still image. Low frame frequency enables a reduction in power consumption of the display device.

The insulating film 839 is formed to cover an end portion of the first electrode 831. The insulating film 839 is preferably formed to have a curved end portion in order to improve the coverage with the EL layer 833 or the second electrode 835 which is formed over the partition wall.

The insulating film 839 is preferably formed using a material having a low refractive index than the EL layer 833. When the insulating film 839 is formed using such a material, total reflection can be caused at an interface between the EL layer 833 and the insulating film 839 and the amount of light entering the insulating film 839 can be reduced, whereby light extraction efficiency can be increased.

The light-emitting element included in the display device includes a pair of electrodes (the first electrode 831 and the second electrode 835), and the EL layer 833 between the pair of electrodes. One of the pair of electrodes functions as an anode and the other functions as a cathode.

In the case where the light-emitting element has a top-emission structure, a conductive film that transmits visible light is used for an upper electrode, and a conductive film that reflects visible light is preferably used for a lower electrode. In the case where the light-emitting element has a bottom-emission structure, a conductive film that transmits visible light is used for a lower electrode, and a conductive film that reflects visible light is preferably used for an upper electrode. In the case where the light-emitting element has a dual-emission structure, a conductive film that transmits visible light is used for upper and lower electrodes.

When a voltage higher than the threshold voltage of the light-emitting element is applied between the first electrode 831 and the second electrode 835, holes are injected from the first electrode 831 side to the EL layer 833 and electrons are injected from the second electrode 835 side to the EL layer 833. The injected electrons and holes recombine in the EL layer 833 and a light-emitting substance contained in the EL layer 833 emits light.

The EL layer 833 includes a light-emitting layer. In addition to the light-emitting layer, the EL layer 833 may further include one or more layers containing any of the following substances: a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. The above-described layers included in the EL layer 833 can be formed separately by any of the following methods: an evaporation method (including a vacuum evaporation method), a transfer method, a printing method, an inkjet method, a coating method, and the like.

With the first electrode 831 and the second electrode 835 of the light-emitting element 840, a micro resonator (also referred to as microcavity) can be formed. For example, the first electrode 831 is formed using a conductive film which reflects light emitted from the EL layer 833, and the second electrode 835 is formed using a semi-transmissive and semi-reflective, conductive film which reflects part of the light and transmits part of the light.

An optical adjustment layer can be provided between the first electrode 831 and the second electrode 835. The optical adjustment layer is a layer which adjusts the optical path length between the reflective first electrode 831 and the semi-transmissive and semi-reflective second electrode 835. By adjusting the optical adjustment layer, the wavelength of light preferentially extracted from the second electrode 835 can be controlled.

The EL layer can be employed for a material that can be used for the optical adjustment layer. For example, the thickness of the optical adjustment layer may be adjusted using a charge generation region. A region containing a substance having a high hole-transport property and an acceptor substance is especially preferably used for the optical adjustment layer, in which case an increase in drive voltage can be inhibited even when the optical adjustment layer is thick.

Alternatively, for a material that can be used for the optical adjustment layer, a conductive light-transmitting film that transmits light emitted from the EL layer 833 can also be employed. For example, the light-transmitting conductive film is stacked over a surface of the reflective conductive film to form the first electrode 831. Such a structure is preferable because the thickness of an optical adjustment layer of an adjacent first electrode 831 is easily changed.

The oxide insulating film and the nitride insulating film described in Embodiment 1 can be used for the insulating film 844.

As the insulating film 846, an insulating film that functions as a planarization film is preferably selected in order to reduce surface unevenness due to the transistor.

The sealant 805 and the sealing substrate 806 are desirably formed using a material which does not pass impurities in the air (such as water and/or oxygen) as much as possible. An epoxy-based resin, glass frit, or the like can be used for the sealant 805.

For a material that can be used for the sealing substrate 806, any of the substrate that can be used as the support substrate 801, a plastic substrate formed of polyvinyl fluoride (PVF), polyester, acrylic, or the like, fiberglass-reinforced plastics (FRP), or the like can be used.

A light-transmitting material may be contained in the space 810 where the structure formed on the support substrate 801 side and the structure formed on the sealing substrate 806 side are not in contact with each other.

The light-transmitting material may be a material that reacts with or adsorbs impurities (such as water and/or hydrogen) which lower the reliability of the light-emitting element. Thus, impurities preferentially react with or are preferentially adsorbed by the material contained in the space 810 and become inactive before lowering the reliability of the light-emitting element. Accordingly, reliability of the display device can be increased.

As the light-transmitting material, a substance having a high hole-transport property, a light-emitting substance, a host material, a substance having a high electron-transport property, a substance having a high electron-injection property, an accepter substance, and/or the like can be used.

Specifically, a conductive high molecule, poly(3,4-ethylenedioxythiophene)/poly(styrenesulfonic acid) (PEDOT/PSS), a desiccating agent, a material which can be used in the EL layer 833, 4,4'-bis[N-(1-naphthyl)-N-phenylamino]biphenyl (abbreviation: NPB or α-NPD), tris(8-quinolinolato)aluminum(III) (abbreviation: Alq), or the like can be used.

The light-transmitting material can optically connect the second electrode 835 to the sealing substrate 806 (including the structure formed on the sealing substrate 806). Accordingly, a drastic change in the refractive index (also referred to as a step portion in the refractive index) of light emitted from the light-emitting element 840 can be suppressed in the optical path from the second electrode 835 to the sealing substrate 806, whereby light of the light-emitting element 840 can be efficiently extracted to the sealing substrate 806 through the second electrode 835. Thus, luminous efficiency of the display device can be improved.

The light-transmitting material is preferably a material having a higher refractive index than the second electrode 835. With such a material, total reflection at an interface between the second electrode 835 and the material can be inhibited, whereby light extraction efficiency can be increased.

Note that as the material that can optically connect the second electrode 835 to the sealing substrate 806, as well as the above-described materials, a liquid crystal material, a fluorine-based inactive liquid (such as perfluorocarbon), or a light-transmitting resin can be used. These materials may be used after impurities which lower the reliability of the light-emitting element are removed therefrom, as appropriate. In addition, a material that reacts with or adsorbs the impurities may be dispersed in the above materials.

As examples of a liquid crystal material, any of the following can be used: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and a mixed material such as a mixture of any of the above-described liquid crystal materials and a chiral material.

The color filter 866 is provided in order to adjust the color of light emitted from a light source to increase the color purity. For example, in a full-color display device using white light-emitting elements, a plurality of pixels provided with color filters of different colors are used. In that case, the color filters may be those of three colors of red (R), green (G), and blue (B) or four colors (yellow (Y) in addition to these three colors). Further, a white (W) pixel may be added to R, G, and B pixels (and a Y pixel).

A black matrix 864 is provided between the adjacent color filters 866. The black matrix 864 blocks light emitted from an adjacent pixel, thereby preventing color mixture between the adjacent pixels. The black matrix 864 may be provided only between adjacent pixels of different emission colors and not between pixels of the same emission color. Here, the color filter 866 is provided so that its end portions overlap with the black matrix 864, whereby light leakage can be reduced.

The black matrix 864 can be formed using a material that blocks light, for example, a metal material or a resin material including a pigment. Note that when the black matrix 864 is provided in a region other than the light-emitting portion 802, such as a driver circuit portion, undesired leakage of guided light or the like can be prevented.

As illustrated in FIG. 24B, by providing an overcoat 868 covering the color filter 866 and the black matrix 864, an impurity such as a pigment included in the color filter 866 or the black matrix 864 can be prevented from diffusing into the light-emitting element or the like. For the overcoat 868, a light-transmitting inorganic or organic insulating material can be used.

This embodiment can be combined with any of the other embodiments in this specification as appropriate.

Embodiment 10

In this embodiment, electronic devices in which a display device of one embodiment of the present invention can be incorporated will be described.

Examples of the electronic device to which the display device is applied include television devices (also referred to as TV or television receivers), monitors for computers and the like, cameras such as digital cameras and digital video cameras, digital photo frames, mobile phones (also referred to as portable telephone devices), portable game machines, portable information terminals, audio reproducing devices, large game machines such as pin-ball machines, and the like. Specific examples of these electronic devices are illustrated in FIGS. 25A to 25F.

Figure 25A:
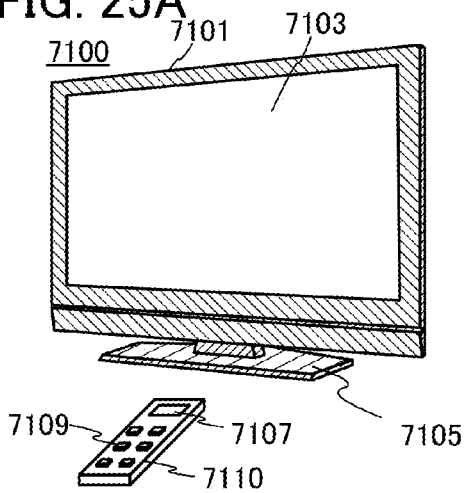
FIGS. 25A to 25F each illustrate an example of an electronic device.

FIG. 25A illustrates an example of a television device. In the television device 7100, a display portion 7103 is incorporated in a housing 7101. Images can be displayed by the display portion 7103, and the display device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Figure 25B:
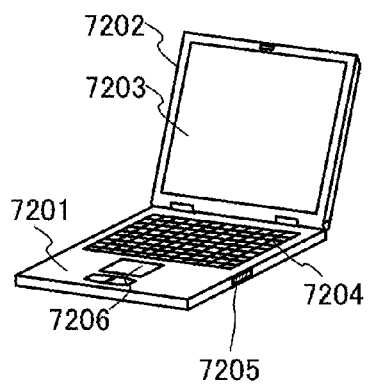

FIG. 25B illustrates a computer, which includes a main body 7201, a housing 7202, a display portion 7203, a keyboard 7204, an external connecting port 7205, a pointing device 7206, and the like. Note that this computer is manufactured using the display device for the display portion 7203.

Figure 25C:
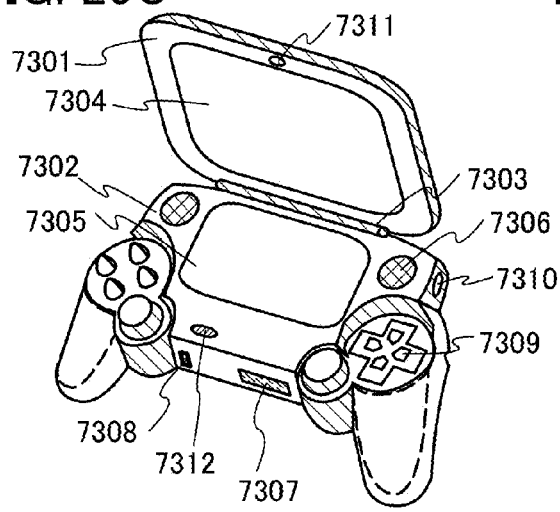

FIG. 25C illustrates a portable game machine, which includes two housings, i.e., a housing 7301 and a housing 7302, connected to each other via a joint portion 7303 so that the portable game machine can be opened or closed. A display portion 7304 is incorporated in the housing 7301 and a display portion 7305 is incorporated in the housing 7302. In addition, the portable game machine illustrated in FIG. 25C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), and a microphone 7312), and the like. Needless to say, the structure of the portable game machine is not limited to the above as long as a display device can be used for at least either the display portion 7304 or the display portion 7305, or both, and may include other accessories as appropriate. The portable game machine illustrated in FIG. 25C has a function of reading out a program or data stored in a storage medium to display it on the display portion, and a function of sharing information with another portable game machine by wireless communication. The portable amusement machine illustrated in FIG. 25C can have various functions without limitation to the above.

Figure 25D:
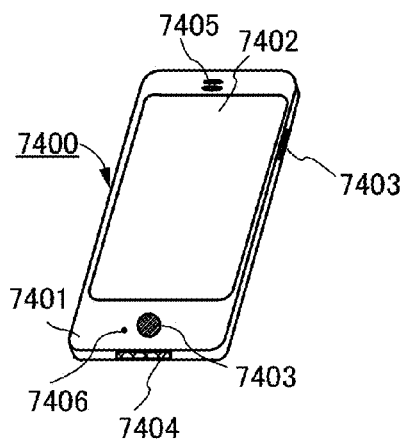

FIG. 25D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using a display device for the display portion 7402.

When the display portion 7402 of the mobile phone 7400 illustrated in FIG. 25D is touched with a finger or the like, data can be input into the mobile phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 25E:
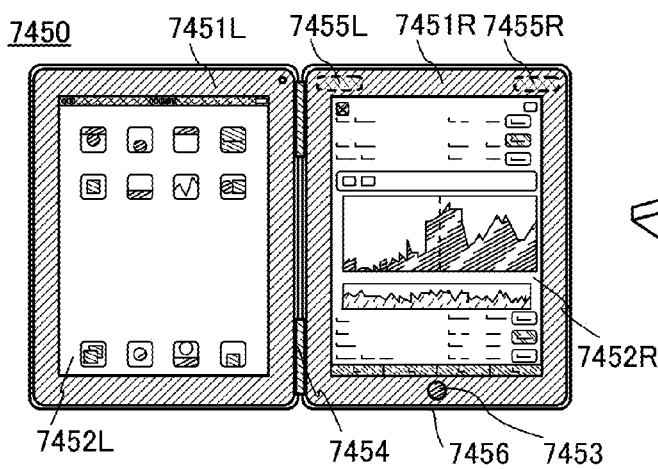

FIG. 25E illustrates an example of a folding computer. A folding computer 7450 includes a housing 7451L and a housing 7451R connected by hinges 7454. The computer 7450 further includes an operation button 7453, a left speaker 7455L, and a right speaker 7455R. In addition, a side surface of the computer 7450 is provided with an external connection port 7456, which is not illustrated. Note that when the computer 7450 is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which data can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, when a detection device including a sensor for detecting inclination, such as a gyroscope or an acceleration sensor, is provided, the orientation of the display screen can be automatically changed by determining the orientation of the computer 7450 (whether the computer 7450 is placed horizontally or vertically).

Furthermore, the computer 7450 can be connected to a network. The computer 7450 not only can display data on the Internet but also can be used as a terminal which controls another electronic device connected to the network from a distant place.

Figure 25F:
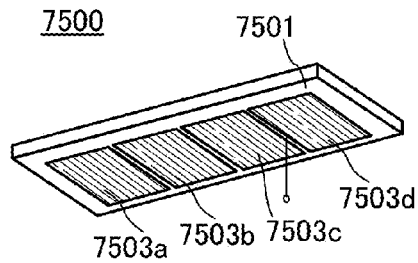

FIG. 25F illustrates an example in which the display device of this embodiment is used in a lighting device. A lighting device 7500 includes, in a housing 7501, a light-emitting portion 7503a, a light-emitting portion 7503b, a light-emitting portion 7503c, and a light-emitting portion 7503d in which the display devices of one embodiment of the present invention are incorporated as light sources. The lighting device 7500 can be attached to a ceiling, a wall, or the like.

This embodiment can be combined with any of the other embodiments in this specification as appropriate.

Example

In this example, examination results of the $V_g$–$I_d$ characteristics and the reliabilities of fabricated transistors will be described.

<Fabrication of Samples>

In this example, samples 1 and 2 each of which can be used as a driver transistor in the pixel in the display device of one embodiment of the present invention, and a sample 3 that can be used as a selection transistor were fabricated. Specifically, a transistor having a structure corresponding to that of the transistor 410a illustrated in FIGS. 7A1, 7B, and 7C1 was fabricated as the sample 1, which is one embodiment of the present invention. Further, a transistor having a structure corresponding to that of the transistor 440a illustrated in FIGS. 12A1, 12B, and 12C1 was fabricated as the sample 2, which is one embodiment of the present invention. In addition, a transistor having a structure corresponding to that of the transistor 400b illustrated in FIGS. 2A2, 2B, and 2C2 was fabricated as the sample 3, which is one embodiment of the present invention.

<Sample 1>

First, a glass substrate was used as a substrate, and a gate electrode was formed over the substrate.

The gate electrode was formed in the following manner: a 200-nm-thick tungsten film was formed by a sputtering method, a mask was formed over the tungsten film by a photolithography process, and the tungsten film was partly etched using the mask.

Next, an insulating film serving as a gate insulating film was formed over the gate electrode.

As the gate insulating film, a stack including a 400-nm-thick silicon nitride film and a 50-nm-thick silicon oxynitride film was used.

Note that the silicon nitride film was formed to have a three-layer structure of a first silicon nitride film, a second silicon nitride film, and a third silicon nitride film.

The first silicon nitride film was formed to have a thickness of 50 nm under the following conditions: silane at a flow rate of 200 sccm, nitrogen at a flow rate of 2000 sccm, and an ammonia gas at a flow rate of 100 sccm were supplied to a reaction chamber of a plasma CVD apparatus as a source gas; the pressure in the reaction chamber was controlled to 100 Pa, and power of 2000 W was supplied with the use of a 27.12 MHz high-frequency power source. The second silicon nitride film was formed to have a thickness of 300 nm under the following conditions: silane at a flow rate of 200 sccm, nitrogen at a flow rate of 2000 sccm, and an ammonia gas at a flow rate of 2000 sccm were supplied to the reaction chamber of the plasma CVD apparatus as a source gas; the pressure in the reaction chamber was controlled to 100 Pa, and power of 2000 W was supplied with the use of a 27.12 MHz high-frequency power source. The third silicon nitride film was formed to have a thickness of 50 nm under the following conditions: silane at a flow rate of 200 sccm and nitrogen at a flow rate of 5000 sccm were supplied to the reaction chamber of the plasma CVD apparatus as a source gas; the pressure in the reaction chamber was controlled to 100 Pa, and power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film was formed under the following conditions: silane at a flow rate of 20 sccm and dinitrogen monoxide at a flow rate of 3000 sccm were supplied to the reaction chamber of the plasma CVD apparatus as a source gas; the pressure in the reaction chamber was controlled to 40 Pa, and power of 100 W was supplied with the use of a 27.12 MHz high-frequency power source. Note that the silicon oxynitride film was formed at a substrate temperature of 350° C.

Next, an oxide semiconductor film was formed to overlap with the gate electrode with the gate insulating film positioned therebetween.

Here, a 35-nm-thick oxide semiconductor film was formed over the gate insulating film by a sputtering method.

The oxide semiconductor film was formed under the following conditions: a sputtering target containing In, Ga, and Zn at an atomic ratio of 1:1:1 was used; oxygen at a flow rate of 100 sccm was supplied as a sputtering gas into a reaction chamber of a sputtering apparatus; the pressure in the reaction chamber was controlled to 0.6 Pa; and direct-current power of 5 kW was supplied. Note that the oxide semiconductor film was formed at a substrate temperature of 170° C.

Next, a pair of electrodes in contact with the oxide semiconductor film was formed.

First, a conductive film was formed over the gate insulating film and the oxide semiconductor film. As the conductive film, a 400-nm-thick aluminum film was formed over a 50-nm-thick tungsten film, and a 200-nm-thick titanium film was formed over the aluminum film. Then, a mask was formed over the conductive film by a photolithography process, and the conductive film was partly etched using the mask. Through the above steps, the pair of electrodes was formed.

Next, the substrate was transferred to a reaction chamber in a reduced pressure and heated at 350° C. Then, the oxide semiconductor film was exposed to oxygen plasma that was generated in a dinitrogen monoxide atmosphere by supply of a high-frequency power of 150 W to an upper electrode in the reaction chamber with the use of a 27.12 MHz high-frequency power source.

After that, a second gate insulating film was formed over the oxide semiconductor film and the pair of electrodes. In this case, the second gate insulating film was formed to have a three-layer structure of a first oxide insulating film, a second oxide insulating film, and a nitride insulating film.

The first oxide insulating film was formed by a plasma CVD method under the following conditions: silane at a flow rate of 20 sccm and dinitrogen monoxide at a flow rate of 3000 sccm were used as a source gas; the pressure in the reaction chamber was 200 Pa; the substrate temperature was 350° C.; and high-frequency power of 100 W was supplied to parallel-plate electrodes.

The second oxide insulating film was formed by a plasma CVD method under the following conditions: silane at a flow rate of 160 sccm and dinitrogen monoxide at a flow rate of 4000 sccm were used as a source gas, the pressure in the reaction chamber was 200 Pa, the substrate temperature was 220° C., and high-frequency power of 1500 W was supplied to the parallel-plate electrodes. Under the above conditions, it is possible to form a silicon oxynitride film which contains oxygen at a higher proportion than the stoichiometric composition so that part of oxygen is released by heating.

Next, heat treatment was performed to release water, nitrogen, hydrogen, and the like from the first oxide insulating film and the second oxide insulating film and to supply part of oxygen contained in the second oxide insulating film into the oxide semiconductor film. Here, the heat treatment was performed at 350° C. in a mixed atmosphere of nitrogen and oxygen for one hour.

Then, a 100-nm-thick nitride insulating film was formed over the second oxide insulating film. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas, the pressure in the reaction chamber was 100 Pa, the substrate temperature was 350° C., and high-frequency power of 1000 W was supplied to the parallel-plate electrodes.

Subsequently, in a region where the oxide semiconductor film and the pair of electrodes were not provided, an opening portion that reaches the gate electrode was formed in the gate insulating film and the second gate insulating film. The opening portion was formed in the following manner: a mask was formed over the second gate insulating film by a photolithography process, and the gate insulating film and the second gate insulating film were partly etched using the mask.

After that, a second gate electrode serving as a back gate electrode was formed over the second gate insulating film. The back gate electrode was electrically connected to the gate electrode through the opening portion provided in the gate insulating film and the second gate insulating film.

Here, as the back gate electrode, a 100-nm-thick conductive film of an indium oxide-tin oxide compound (ITO—$SiO_2$) containing silicon oxide was formed by a sputtering method. Note that the composition of a target used for forming the conductive film was $In_2O_3:SnO_2:SiO_2=85:10:5$ [wt %]. After that, heat treatment was performed at 250° C. in a nitrogen atmosphere for one hour.

Through the above process, the sample 1 of this example was fabricated.

<Sample 2>

The sample 2 includes a second gate insulating film and a back gate electrode having structures different from those in the sample 1. Specifically, as illustrated in FIG. 12C1, the sample 2 has a structure in which the back gate electrode covers side surfaces of a first oxide insulating film and a second oxide insulating film in the channel width direction of the transistor.

In the fabrication process of the sample 2, the first oxide insulating film and the second oxide insulating film were formed, heat treatment was performed, and then a mask was formed over the second oxide insulating film by a photolithography process. Subsequently, the first oxide insulating film and the second oxide insulating film were partly etched using the mask. Other steps of fabricating the sample 2 are similar to those for fabricating the sample 1; thus, the descriptions for the sample 1 can be referred to.

<Sample 3>

The sample 3 is different from the sample 1 in that a back gate electrode is not included.

The sample 3 was fabricated using the above-described fabrication process of the sample 1, excluding the step of forming the back gate electrode. Other steps of fabricating the sample 3 are similar to those for fabricating the sample 1; thus, the descriptions for the sample 1 can be referred to.

Note that as each of the samples 1 to 3, three kinds of transistors were fabricated in which channel widths W were 50 μm and channel lengths L were 2 μm, 3 μm, and 6 μm.

<$V_g$–$I_d$ Characteristics>

Next, the initial $V_g$–$I_d$ characteristics of the samples 1 to 3 used as transistors were measured. Here, changes in characteristics of current flowing between a source electrode and a drain electrode (hereinafter referred to as drain current: $I_d$), that is, $V_g$–$I_d$ characteristics were measured under the following conditions: the substrate temperature was 25° C., the potential difference between the source and drain electrodes (hereinafter referred to as drain voltage: $V_d$) was 1 V or 10 V, and the potential difference between the source and the gate electrodes (hereinafter referred to as gate voltage: $V_g$) was changed from −15 V to 15 V.

Here, the sample 1 and the sample 2 were driven by a method in which gate voltage is applied in a state where the gate electrode and the back gate electrode are electrically short-circuited. Such a driving method is called dual-gate driving. In the dual-gate driving, the gate electrode always has the same gate voltage as the back gate electrode.

Figure 26A:
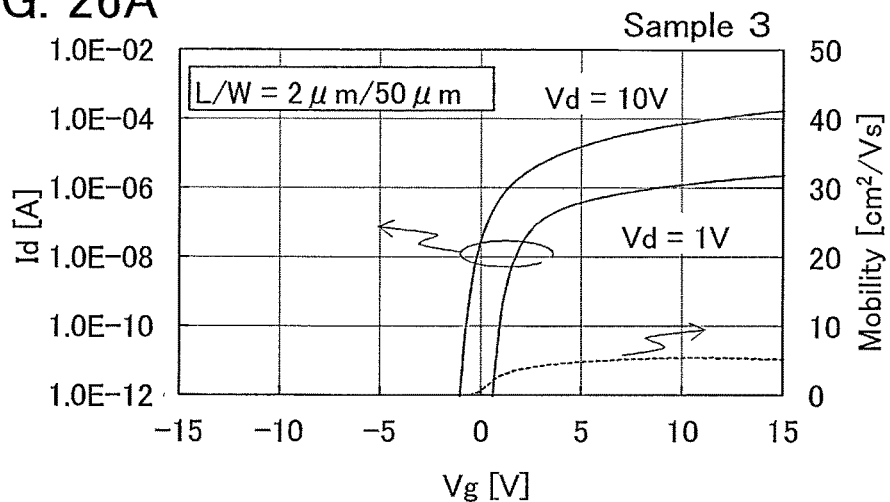
FIGS. 26A to 26C each show $V_g$-$I_d$ characteristics of a transistor of Example.
Figure 26B:
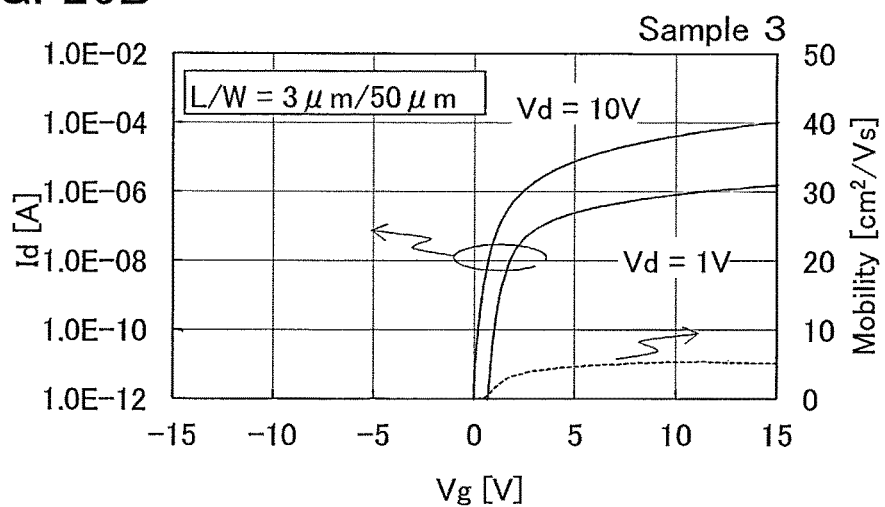
Figure 26C:
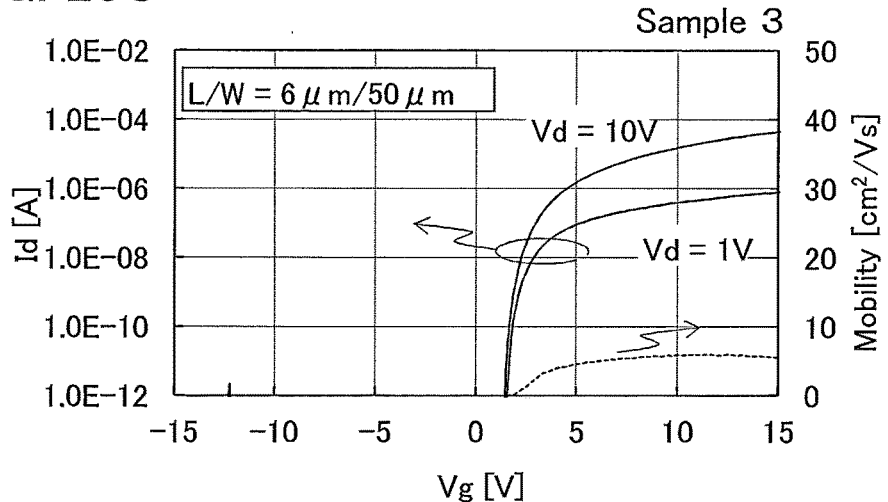

FIGS. 26A to 26C show the $V_g$-$I_d$ characteristics of the sample 3. FIGS. 26A to 26C show results of the transistors with channel lengths L of 2 μm, 3 μm, and 6 μm, respectively. Similarly, FIGS. 27A to 27C show the $V_g$-$I_d$ characteristics of the sample 1 and FIGS. 28A to 28C show the $V_g$-$I_d$ characteristics of the sample 2.

In each of FIGS. 26A to 26C, FIGS. 27A to 27C, and FIGS. 28A to 28C, the lateral axis, the first longitudinal axis, and the second longitudinal axis represent gate voltage $V_g$, drain current $I_d$, and field-effect mobility Mobility, respectively. Here, to show field-effect mobility in a saturation region, field-effect mobility calculated when $V_d$=10V is shown.

The results of the sample 3 (a transistor that can be suitably used as a selection transistor of the pixel in the display device of one embodiment of the present invention) in FIGS. 26A to 26C show that a shift of the threshold voltage in the negative direction is further suppressed as the channel length L becomes longer. An effect of suppressing the shift of the threshold voltage in the negative direction is particularly significant when the drain voltage $V_d$ is high. Note that the field-effect mobility hardly changes regardless of the channel length L.

Figure 27A:
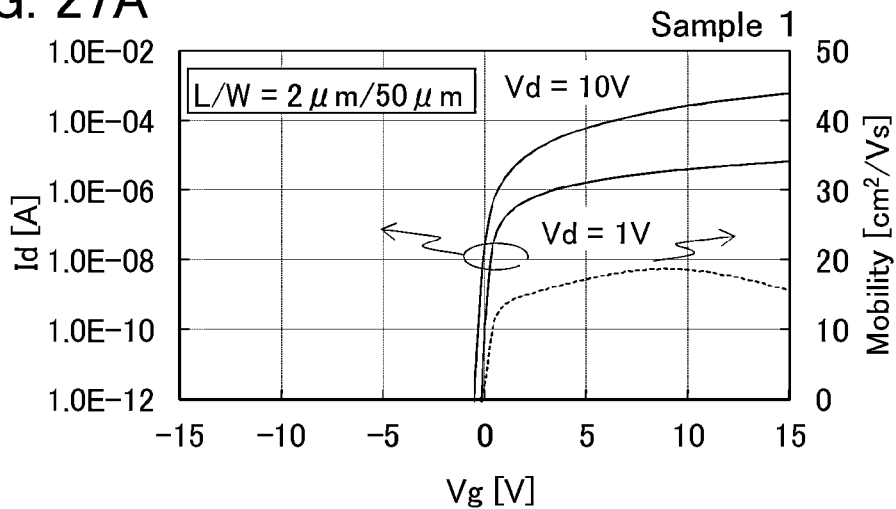
FIGS. 27A to 27C each show $V_g$-$I_d$ characteristics of a transistor of Example.
Figure 27B:
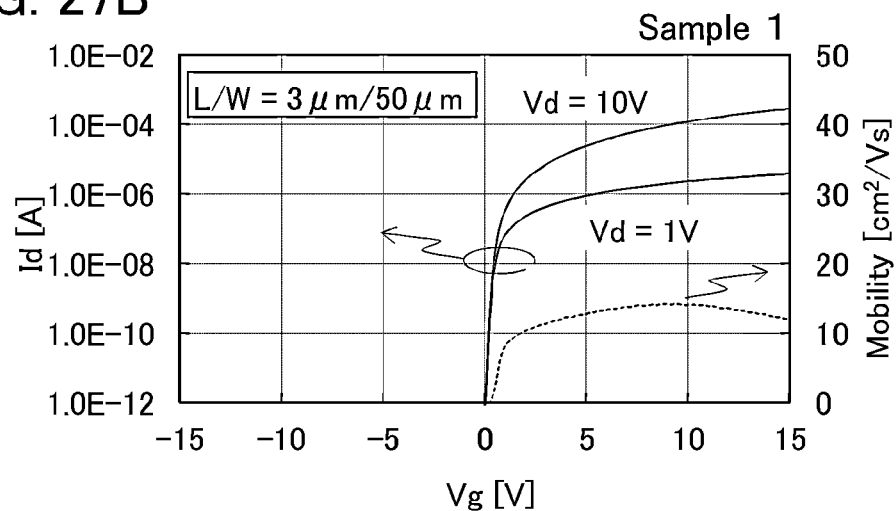
Figure 27C:
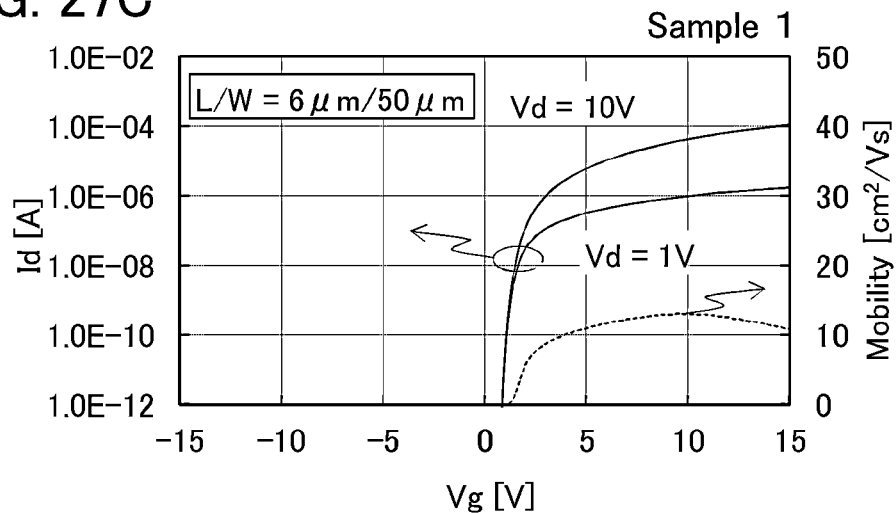
Figure 28A:
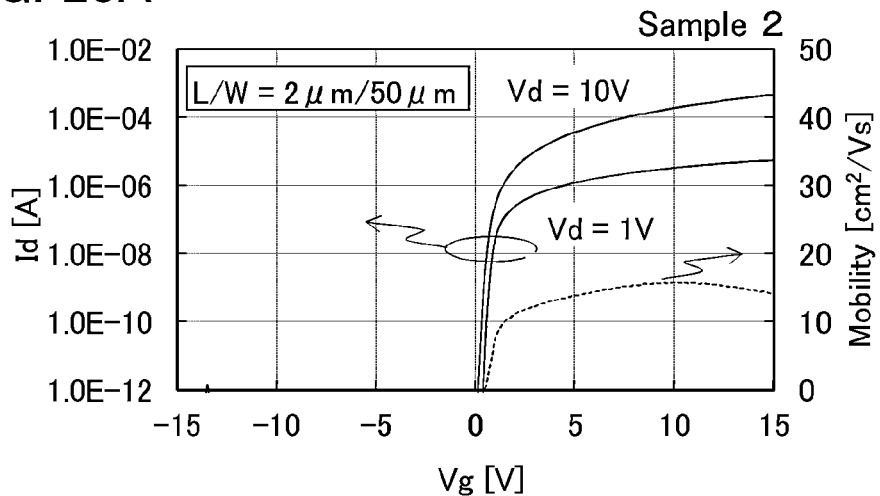
FIGS. 28A to 28C each show $V_g$-$I_d$ characteristics of a transistor of Example.
Figure 28B:
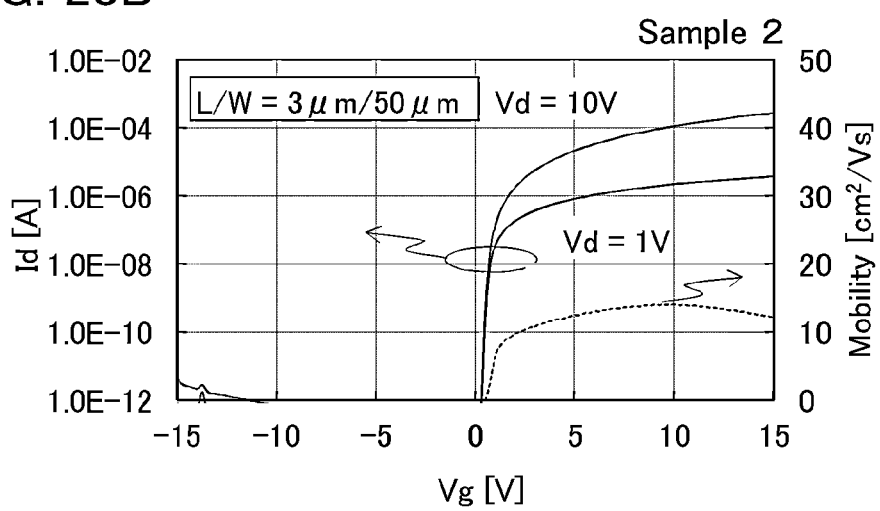
Figure 28C:
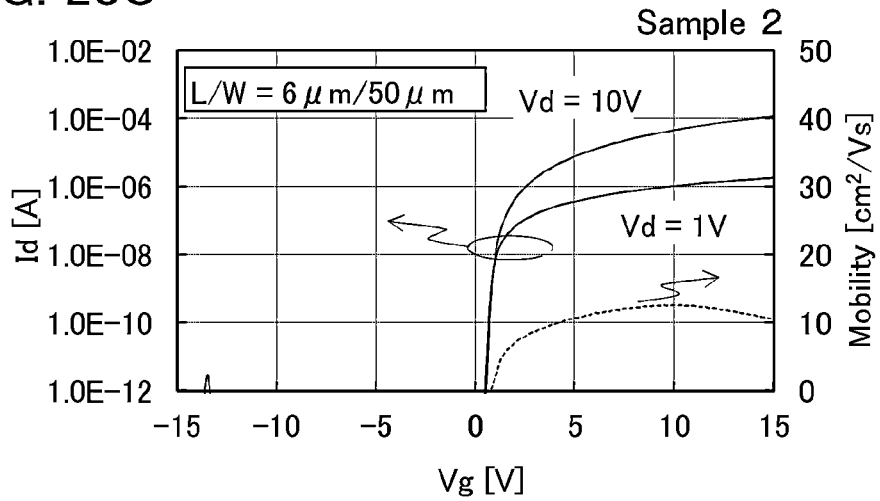

Further, as shown in FIGS. 27A to 27C, the field-effect mobility of the sample 1 (a transistor that can be suitably used as a driver transistor in the pixel in the display device of one embodiment of the present invention) is improved in comparison with the sample 3 regardless of the channel length L. In addition, the field-effect mobility is further improved as the channel length L becomes shorter. Furthermore, the dual-gate driving leads to an extremely small change in the threshold voltage with respect to the drain voltage $V_d$ even when the channel length L is short (i.e., L=2 μm).

Further, as shown in FIGS. 28A to 28C, the field-effect mobility of the sample 2 (a transistor that can be suitably used as a driver transistor in the pixel in the display device of one embodiment of the present invention) is improved in comparison with the sample 3 regardless of the channel length L. In addition, the field-effect mobility is further improved as the channel length L becomes shorter. Furthermore, the dual-gate driving leads to an extremely small change in the threshold voltage with respect to the drain voltage $V_d$ when the channel length L is short (i.e., L=2 μm).

The above results show that a shift of the threshold voltage in the negative direction is further suppressed as the channel length L becomes longer and that the field-effect mobility is further improved as the channel length L becomes shorter. Furthermore, the dual-gate driving allows an electric field to be efficiently applied to an oxide semiconductor in which a channel is formed; as a result, a change in the threshold voltage with respect to the drain voltage $V_d$ can be small even when the channel length L is short. Thus, when the channel length L is made short (specifically, L=2 μm) and the dual-gate driving is employed in a driver transistor in the pixel that requires high field-effect mobility, and the channel length L of a selection transistor of the pixel that requires normally-off characteristics is made longer than that of the driver transistor, a display device that can operate at high speed with low power consumption can be provided.

This application is based on Japanese Patent Application serial no. 2013-119149 filed with Japan Patent Office on Jun. 5, 2013, the entire contents of which are hereby incorporated by reference.

What is claimed is:

1. A display device comprising:
a substrate; and
a pixel comprising:
   a first transistor over the substrate, the first transistor comprising:
      a first gate electrode;
      a first gate insulating film over the first gate electrode;
      a first oxide semiconductor film over the first gate insulating film;
      a first source electrode and a first drain electrode over the first oxide semiconductor film;
      a second gate insulating film over the first oxide semiconductor film, the first source electrode, and the first drain electrode; and
      a second gate electrode over the second gate insulating film;
   a second transistor over the substrate, the second transistor comprising:
      a third gate electrode;
      the first gate insulating film over the third gate electrode;
      a second oxide semiconductor film over the first gate insulating film;
      a second source electrode and a second drain electrode over the second oxide semiconductor film; and
      the second gate insulating film over the second oxide semiconductor film, the second source electrode, and the second drain electrode;
   a first insulating film over the second gate insulating film and comprising a first opening and a second opening, the first opening overlapping with the second gate electrode;
   a second insulating film over the first transistor; and
   a light-emitting element electrically connected to one of the first source electrode and the first drain electrode through the second opening,
wherein the first oxide semiconductor film is located between the first gate electrode and the second gate electrode,
wherein the second gate electrode comprises a first region and a second region that face each other in a channel width direction of the first transistor,
wherein the first oxide semiconductor film is located between the first region and the second region of the second gate electrode,
wherein the first oxide semiconductor film comprises indium and zinc,
wherein the first oxide semiconductor film comprises a crystalline region,
wherein one of the second source electrode and the second drain electrode is electrically connected to the first gate electrode and the second gate electrode,
wherein a distance between the second source electrode and the second drain electrode is larger than a distance between the first source electrode and the first drain electrode, wherein the second gate electrode is transparent, wherein the first transistor has a dual gate structure while the second transistor has a single gate structure that includes one gate electrode, and wherein the first opening is filled with the second insulating film.

2. The display device according to claim 1, wherein the second gate electrode is in contact with a side surface of the second gate insulating film.

3. The display device according to claim 1, wherein a side surface of the first oxide semiconductor film faces the second gate electrode in the channel width direction of the first transistor.

4. The display device according to claim 1, wherein the second gate electrode is in contact with the first gate insulating film.

5. The display device according to claim 1, wherein the second gate insulating film is in contact with the first gate insulating film.

6. The display device according to claim 1, wherein the second gate electrode is electrically connected to the first gate electrode through a contact hole provided in the first gate insulating film.

7. The display device according to claim 1, wherein the second gate electrode is electrically connected to the first gate electrode through a first contact hole and a second contact hole each provided in the first gate insulating film, and wherein the first oxide semiconductor film is located between the first contact hole and the second contact hole.

8. The display device according to claim 1, wherein an outline of the first oxide semiconductor film is located inside an outline of the first gate electrode.

9. The display device according to claim 1, wherein the second gate insulating film comprises:

a first oxide insulating film;

a second oxide insulating film over the first oxide insulating film; and a nitride insulating film over the second oxide insulating film.

10. The display device according to claim 1, wherein the first transistor comprises:

a third oxide semiconductor film over the first gate insulating film; and a fourth oxide semiconductor film over the first oxide semiconductor film, wherein the first oxide semiconductor film is located between the third oxide semiconductor film and the fourth oxide semiconductor film, wherein the first source electrode and the first drain electrode are located over the fourth oxide semiconductor film, and wherein each of the first oxide semiconductor film, the third oxide semiconductor film, and the fourth oxide semiconductor film comprises indium, gallium, and zinc.

11. A display device comprising:

a substrate; and a pixel comprising:

a first transistor over the substrate, the first transistor comprising:

a first gate electrode;

a first gate insulating film over the first gate electrode;

a first oxide semiconductor film over the first gate insulating film;

a first source electrode and a first drain electrode over the first oxide semiconductor film;

a second gate insulating film over the first oxide semiconductor film, the first source electrode, and the first drain electrode; and a second gate electrode over the second gate insulating film;

a second transistor over the substrate, the second transistor comprising:

a third gate electrode;

the first gate insulating film over the third gate electrode;

a second oxide semiconductor film over the first gate insulating film;

a second source electrode and a second drain electrode over the second oxide semiconductor film; and a third gate insulating film over the second oxide semiconductor film, the second source electrode, and the second drain electrode;

a first insulating film over the second gate insulating film and comprising a first opening and a second opening, the first opening overlapping with the second gate electrode;

a second insulating film over the first transistor; and a light-emitting element electrically connected to one of the first source electrode and the first drain electrode through the second opening, wherein the first oxide semiconductor film is located between the first gate electrode and the second gate electrode, wherein the second gate electrode comprises a first region and a second region that face each other in a channel width direction of the first transistor, wherein the first oxide semiconductor film is located between the first region and the second region of the second gate electrode, wherein the first oxide semiconductor film comprises indium and zinc, wherein the first oxide semiconductor film comprises a crystalline region, wherein one of the second source electrode and the second drain electrode is electrically connected to the first gate electrode and the second gate electrode, wherein a distance between the second source electrode and the second drain electrode is larger than a distance between the first source electrode and the first drain electrode, wherein the second gate insulating film and the third gate insulating film are separated from each other, wherein the second gate electrode is transparent, wherein the first transistor has a dual gate structure while the second transistor has a single gate structure that includes one gate electrode, and wherein the first opening is filled with the second insulating film.

12. The display device according to claim 11, wherein the second gate electrode is in contact with a side surface of the second gate insulating film.

13. The display device according to claim 11, wherein a side surface of the first oxide semiconductor film faces the second gate electrode in the channel width direction of the first transistor.

14. The display device according to claim 11, wherein the second gate electrode is in contact with the first gate insulating film.

15. The display device according to claim 11, wherein the second gate insulating film is in contact with the first gate insulating film.

16. The display device according to claim 11, wherein the second gate electrode is electrically connected to the first gate electrode through a contact hole provided in the first gate insulating film.

17. The display device according to claim 11,
wherein the second gate electrode is electrically connected to the first gate electrode through a first contact hole and a second contact hole each provided in the first gate insulating film, and
wherein the first oxide semiconductor film is located between the first contact hole and the second contact hole.

18. The display device according to claim 11, wherein an outline of the first oxide semiconductor film is located inside an outline of the first gate electrode.

19. The display device according to claim 11, wherein the second gate insulating film comprises:
a first oxide insulating film;
a second oxide insulating film over the first oxide insulating film; and
a nitride insulating film over the second oxide insulating film.

20. The display device according to claim 11,
wherein the first transistor comprises:
a third oxide semiconductor film over the first gate insulating film; and
a fourth oxide semiconductor film over the first oxide semiconductor film,
wherein the first oxide semiconductor film is located between the third oxide semiconductor film and the fourth oxide semiconductor film, and
wherein each of the first oxide semiconductor film, the third oxide semiconductor film, and the fourth oxide semiconductor film comprises indium, gallium, and zinc.

21. The display device according to claim 1, wherein the second gate electrode comprises indium and zinc.

22. The display device according to claim 11, wherein the second gate electrode comprises indium and zinc.

23. A display device comprising:
a substrate; and
a pixel comprising:
a first transistor over the substrate, the first transistor comprising:
a first gate electrode;
a first gate insulating film over the first gate electrode;
a first oxide semiconductor film over the first gate insulating film;
a first source electrode and a first drain electrode over the first oxide semiconductor film;
a second gate insulating film over the first oxide semiconductor film, the first source electrode, and the first drain electrode; and
a second gate electrode over the second gate insulating film;
a second transistor over the substrate, the second transistor comprising:
a third gate electrode;
the first gate insulating film over the third gate electrode;
a second oxide semiconductor film over the first gate insulating film;
a second source electrode and a second drain electrode over the second oxide semiconductor film; and
the second gate insulating film over the second oxide semiconductor film, the second source electrode, and the second drain electrode;
a first insulating film over the second gate insulating film and comprising a first opening and a second opening, the first opening overlapping with the second gate electrode;
a second insulating film over the first transistor; and
a light-emitting element electrically connected to one of the first source electrode and the first drain electrode through the second opening,
wherein the first oxide semiconductor film is located between the first gate electrode and the second gate electrode,
wherein the first oxide semiconductor film comprises indium and zinc,
wherein the first oxide semiconductor film comprises a crystalline region,
wherein one of the second source electrode and the second drain electrode is electrically connected to the first gate electrode and the second gate electrode,
wherein a distance between the second source electrode and the second drain electrode is larger than a distance between the first source electrode and the first drain electrode,
wherein the first gate electrode and the second gate electrode are in contact with each other,
wherein the second gate electrode is transparent,
wherein the first transistor has a dual gate structure while the second transistor has a single gate structure that includes one gate electrode, and
wherein the first opening is filled with the second insulating film.

24. The display device according to claim 23, wherein the second gate electrode is in contact with a side surface of the second gate insulating film.

25. The display device according to claim 23, wherein a side surface of the first oxide semiconductor film faces the second gate electrode in a channel width direction of the first transistor.

26. The display device according to claim 23, wherein the second gate electrode is in contact with the first gate insulating film.

27. The display device according to claim 23, wherein the second gate insulating film is in contact with the first gate insulating film.

28. The display device according to claim 23, wherein the second gate electrode is electrically connected to the first gate electrode through a contact hole provided in the first gate insulating film.

29. The display device according to claim 23, wherein an outline of the first oxide semiconductor film is located inside an outline of the first gate electrode.

30. The display device according to claim 23, wherein the second gate insulating film comprises:
a first oxide insulating film;
a second oxide insulating film over the first oxide insulating film; and
a nitride insulating film over the second oxide insulating film.

31. The display device according to claim 23,
wherein the first transistor comprises:
a third oxide semiconductor film over the first gate insulating film; and a fourth oxide semiconductor film over the first oxide semiconductor film, wherein the first oxide semiconductor film is located between the third oxide semiconductor film and the fourth oxide semiconductor film, wherein the first source electrode and the first drain electrode are located over the fourth oxide semiconductor film, and wherein each of the first oxide semiconductor film, the third oxide semiconductor film, and the fourth oxide semiconductor film comprises indium, gallium, and zinc.

32. The display device according to claim 23, wherein the second gate electrode comprises indium and zinc.

33. A display device comprising:
a substrate; and
a pixel comprising:
  a first transistor over the substrate, the first transistor comprising:
    a first gate electrode;
    a first gate insulating film over the first gate electrode;
    a first oxide semiconductor film over the first gate insulating film;
    a first source electrode and a first drain electrode over the first oxide semiconductor film;
    a conductive film over the first gate insulating film;
    a second gate insulating film over the first oxide semiconductor film, the first source electrode, the first drain electrode, and the conductive film; and
    a second gate electrode over the second gate insulating film;
  a second transistor over the substrate, the second transistor comprising:
    a third gate electrode;
    the first gate insulating film over the third gate electrode;
    a second oxide semiconductor film over the first gate insulating film;
    a second source electrode and a second drain electrode over the second oxide semiconductor film; and
    the second gate insulating film over the second oxide semiconductor film, the second source electrode, and the second drain electrode;
  a first insulating film over the second gate insulating film and comprising a first opening and a second opening, the first opening overlapping with the second gate electrode;
  a second insulating film over the first transistor; and
  a light-emitting element electrically connected to one of the first source electrode and the first drain electrode through the second opening,
wherein the first oxide semiconductor film is located between the first gate electrode and the second gate electrode, wherein the first oxide semiconductor film comprises indium and zinc, wherein the first oxide semiconductor film comprises a crystalline region, wherein one of the second source electrode and the second drain electrode is electrically connected to the first gate electrode and the second gate electrode, wherein a distance between the second source electrode and the second drain electrode is larger than a distance between the first source electrode and the first drain electrode, wherein the first gate electrode and the second gate electrode are electrically connected to each other through the conductive film, wherein the second gate electrode is transparent, wherein the first transistor has a dual gate structure while the second transistor has a single gate structure that includes one gate electrode, and wherein the first opening is filled with the second insulating film.

34. The display device according to claim 33, wherein the second gate electrode is in contact with a side surface of the second gate insulating film.

35. The display device according to claim 33, wherein the second gate insulating film is in contact with the first gate insulating film.

36. The display device according to claim 33, wherein an outline of the first oxide semiconductor film is located inside an outline of the first gate electrode.

37. The display device according to claim 33, wherein the second gate insulating film comprises:
a first oxide insulating film;
a second oxide insulating film over the first oxide insulating film; and
a nitride insulating film over the second oxide insulating film.

38. The display device according to claim 33,
wherein the first transistor comprises:
  a third oxide semiconductor film over the first gate insulating film; and
  a fourth oxide semiconductor film over the first oxide semiconductor film,
wherein the first oxide semiconductor film is located between the third oxide semiconductor film and the fourth oxide semiconductor film,
wherein the first source electrode and the first drain electrode are located over the fourth oxide semiconductor film, and
wherein each of the first oxide semiconductor film, the third oxide semiconductor film, and the fourth oxide semiconductor film comprises indium, gallium, and zinc.

39. The display device according to claim 33, wherein the second gate electrode comprises indium and zinc.

* * * * *